US011398351B2

United States Patent
Sugiyama

(10) Patent No.: US 11,398,351 B2
(45) Date of Patent: Jul. 26, 2022

(54) MULTILAYER CERAMIC CAPACITOR, MOUNT STRUCTURE OF MULTILAYER CERAMIC CAPACITOR, AND SERIES OF ELECTRONIC COMPONENTS

(71) Applicant: Murata Manufacturing Co., Ltd., Nagaokakyo (JP)

(72) Inventor: Hidetaka Sugiyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 22 days.

(21) Appl. No.: 16/911,637

(22) Filed: Jun. 25, 2020

(65) Prior Publication Data

US 2020/0328029 A1 Oct. 15, 2020

Related U.S. Application Data

(63) Continuation of application No. PCT/JP2018/048524, filed on Dec. 28, 2018.

(30) Foreign Application Priority Data

Dec. 29, 2017 (JP) .............................. JP2017-255152

(51) Int. Cl.
*H01G 4/012* (2006.01)
*H01G 4/12* (2006.01)
(Continued)

(52) U.S. Cl.
CPC ............... *H01G 4/30* (2013.01); *H01G 4/012* (2013.01); *H01G 4/12* (2013.01); *H01G 4/248* (2013.01);
(Continued)

(58) Field of Classification Search
CPC ............ H01G 2/06; H01G 4/012; H01G 4/12; H01G 4/232; H01G 4/248; H01G 4/30;
(Continued)

(56) References Cited

U.S. PATENT DOCUMENTS 6,381,117 B1 4/2002 Nakagawa et al.
2002/0031701 A1* 3/2002 Kawakami ............ H01M 4/244
429/246
(Continued)

FOREIGN PATENT DOCUMENTS

JP 11-162771 A 6/1999
JP 2000-188228 A 7/2000
(Continued)

OTHER PUBLICATIONS

Official Communication issued in International Patent Application No. PCT/JP2018/048524, dated Mar. 19, 2019.

*Primary Examiner* — Timothy J Thompson
*Assistant Examiner* — Guillermo J Egoavil
(74) *Attorney, Agent, or Firm* — Keating & Bennett, LLP

(57) ABSTRACT

A multilayer ceramic capacitor includes a multilayer body and first and second external electrodes. The first and second external electrodes include first and second underlying electrode layers, first and second main-surface-side resin layers, and first and second plated layers, respectively. The first and second main-surface-side resin layers cover respective ends of the first and second underlying electrode layers on a first main surface and cover respective portions of a first side surface and a second side surface continuously from the first main surface.

20 Claims, 35 Drawing Sheets

(51) Int. Cl.
*H01G 4/248* (2006.01)
*H01G 4/30* (2006.01)
*H05K 1/18* (2006.01)

(52) U.S. Cl.
CPC ... *H05K 1/181* (2013.01); *H05K 2201/10015* (2013.01)

(58) Field of Classification Search
CPC ........ H01G 4/2325; H05K 1/181; H05K 1/18; H05K 1/111; H05K 3/3442; H05K 2201/10015; H05K 2201/10636; Y02P 70/50
USPC ..... 174/260; 361/306.3, 321.2, 301.4, 321.5, 361/321.4
See application file for complete search history.

(56) References Cited

U.S. PATENT DOCUMENTS

| | | | | |
|---|---|---|---|---|
| 2010/0067170 | A1* | 3/2010 | Koga | ..... H01G 4/228 361/306.3 |
| 2015/0162132 | A1* | 6/2015 | Kwag | ..... H05K 1/111 174/260 |
| 2015/0228409 | A1* | 8/2015 | Fujita | ..... H01G 4/248 361/321.2 |
| 2016/0027585 | A1* | 1/2016 | Inoue | ..... H01G 4/1209 29/25.42 |
| 2017/0073170 | A1 | 3/2017 | Kakuho et al. | |
| 2018/0082789 | A1* | 3/2018 | Asano | ..... H01G 2/14 |

FOREIGN PATENT DOCUMENTS

| | | |
|---|---|---|
| JP | 2001-076957 A | 3/2001 |
| JP | 2003-007567 A | 1/2003 |
| JP | 2004-296936 A | 10/2004 |
| JP | 2005-340289 A | 12/2005 |
| JP | 2009-239094 A | 10/2009 |
| JP | 2010-226017 A | 10/2010 |
| JP | 2010226017 A * | 10/2010 ............... H01G 4/12 |
| JP | 2014-027085 A | 2/2014 |
| JP | 2015-029009 A | 2/2015 |
| JP | 2015-216337 A | 12/2015 |
| JP | 2016-031992 A | 3/2016 |
| JP | 2017-054980 A | 3/2017 |
| WO | 2019/132017 A1 | 7/2019 |

* cited by examiner

CROSS-SECTIONAL VIEW ALONG II-II

16 {16a, 16b}  24 {24a, 24b}  26 {26a, 26b}  28 {28a, 28b}  32 {32a, 32b}

CROSS-SECTIONAL VIEW ALONG III–III

CROSS-SECTIONAL VIEW ALONG VI-VI

CROSS-SECTIONAL VIEW ALONG VII-VII

CROSS-SECTIONAL VIEW ALONG X-X

CROSS-SECTIONAL VIEW ALONG XI-XI

CROSS-SECTIONAL VIEW ALONG XV-XV

CROSS-SECTIONAL VIEW ALONG XVI-XVI

CROSS-SECTIONAL VIEW ALONG XIX-XIX

CROSS-SECTIONAL VIEW ALONG XX-XX

CROSS-SECTIONAL VIEW ALONG XXIV-XXIV

CROSS-SECTIONAL VIEW ALONG XXV-XXV

CROSS-SECTIONAL VIEW ALONG XXVIII-XXVIII

CROSS-SECTIONAL VIEW ALONG XXIX-XXIX

CROSS-SECTIONAL VIEW ALONG XXXII-XXXII

CROSS-SECTIONAL VIEW ALONG XXXIII-XXXIII

CROSS-SECTIONAL VIEW ALONG XXXVI-XXXVI

CROSS-SECTIONAL VIEW ALONG XXXVII-XXXVII

CROSS-SECTIONAL VIEW ALONG XXXX-XXXX

CROSS-SECTIONAL VIEW ALONG XXXXI-XXXXI

CROSS-SECTIONAL VIEW ALONG XXXXII-XXXXII

CROSS-SECTIONAL VIEW ALONG XXXXIII-XXXXIII

CROSS-SECTIONAL VIEW ALONG XXXXVI-XXXXVI

MULTILAYER CERAMIC CAPACITOR, MOUNT STRUCTURE OF MULTILAYER CERAMIC CAPACITOR, AND SERIES OF ELECTRONIC COMPONENTS

CROSS REFERENCE TO RELATED APPLICATIONS

This application claims the benefit of priority to Japanese Patent Application No. 2017-255152 filed on Dec. 29, 2017 and is a Continuation Application of PCT Application No. PCT/JP2018/048524 filed on Dec. 28, 2018. The entire contents of each application are hereby incorporated herein by reference.

BACKGROUND OF THE INVENTION

1. Field of the Invention

The present invention relates to a multilayer ceramic capacitor, a mount structure of a multilayer ceramic capacitor, and a series of electronic components, and particularly to a multilayer ceramic capacitor including an external electrode having a multi-layered structure, a mount structure thereof, and a series of electronic components.

2. Description of the Related Art

Ceramic electronic components represented by a multilayer ceramic capacitor have recently been used in a more severe environment than a conventional environment.

For example, a multilayer ceramic capacitor included in a mobile device such as a portable telephone or a portable music player has been demanded to resist a shock when it is dropped. Specifically, even though a shock due to a drop is applied, the multilayer ceramic capacitor should not come off from a mount substrate and/or no crack should be generated in the multilayer ceramic capacitor.

In order to address this need, use of a thermosetting resin paste for an external electrode of a multilayer ceramic capacitor has been proposed. For example, Japanese Patent Laid-Open No. 11-162771 takes measures to avoid generation of a crack in a multilayer body even in a severe environment by forming an epoxy-based thermosetting resin layer between a conventional electrode layer and an Ni plated layer.

In a design where the epoxy-based thermosetting resin layer is formed between the electrode layer and the Ni plated layer as in Japanese Patent Laid-Open No. 11-162771, however, a contact resistance between the epoxy-based thermosetting resin layer and the Ni plated layer becomes high and an equivalent series resistance (which is referred to as an "ESR" below) disadvantageously becomes high.

SUMMARY OF THE INVENTION

Preferred embodiments of the present invention provide multilayer ceramic capacitors that are each able to reduce or prevent a crack by providing a resin layer on an external electrode thereof and to reduce or prevent an increase in ESR.

A multilayer ceramic capacitor according to a preferred embodiment of the present invention includes a multilayer body including a plurality of layered dielectric layers and layered internal electrode layers and including a first main surface and a second main surface opposed to each other in a height direction, a first side surface and a second side surface opposed to each other in a width direction orthogonal or substantially orthogonal to the height direction, and a first end surface and a second end surface opposed to each other in a length direction orthogonal or substantially orthogonal to the height direction and the width direction, and a pair of external electrodes connected to the internal electrode layers and disposed on the end surfaces, a portion of the first and second main surfaces, and a portion of the first and second side surfaces. Each of the pair of external electrodes includes an underlying electrode layer, a resin layer, and a plated layer covering the underlying electrode layer and the resin layer. A portion of an end of the underlying electrode layer includes a region covered with the resin layer and a region not covered with the resin layer. A region in the underlying electrode layer where the underlying electrode layer covers the first end surface and the second end surface is not covered with the resin layer.

In a multilayer ceramic capacitor according to a preferred embodiment of the present invention, preferably, the resin layer covers the entire or substantially the entire end of the underlying electrode layer located on at least one of the first main surface and the second main surface.

A multilayer ceramic capacitor according to a preferred embodiment of the present invention preferably includes a region not covered with the resin layer in a central portion in the height direction, at the end of the underlying electrode layer located on the first side surface and the second side surface.

In a multilayer ceramic capacitor according to a preferred embodiment of the present invention, preferably, the resin layer covers a portion of the end of the underlying electrode layer located on the first side surface and the second side surface and is continuous from a resin layer that covers the end of the underlying electrode layer located on the main surface.

In a multilayer ceramic capacitor according to a preferred embodiment of the present invention, preferably, the resin layer covers the entire or substantially the entire end of the underlying electrode layer located on the first main surface and the second main surface.

In a multilayer ceramic capacitor according to a preferred embodiment of the present invention, preferably, the resin layer is not provided on at least one of the first main surface and the second main surface and is provided on neither the first side surface nor the second side surface.

In a multilayer ceramic capacitor according to a preferred embodiment of the present invention, preferably, a minimum value of a length in a length direction of a region where the resin layer covers the underlying electrode layer on the main surface is equal to or larger than about 10 μm.

In a multilayer ceramic capacitor according to a preferred embodiment of the present invention, preferably, a minimum value of a length in a length direction of a region where the resin layer covers a surface of the multilayer body on the main surface is equal to or larger than about 10 μm.

In a multilayer ceramic capacitor according to a preferred embodiment of the present invention, the resin layer may include a thermosetting resin and a metal component, or may include no metal component.

In a multilayer ceramic capacitor according to a preferred embodiment of the present invention, each of the pair of external electrodes includes the underlying electrode layer, the resin layer, and the plated layer covering the underlying electrode layer and the resin layer, and a portion of the end of the underlying electrode layer includes a region covered with the resin layer and a region not covered with the resin layer. Therefore, mechanical strength of the multilayer ceramic capacitor is able to be improved. When a shock due to drop or bending stress in a mount substrate occurs, that stress can more reliably be absorbed and thus generation of a crack in the multilayer body can be reduced or prevented.

In a multilayer ceramic capacitor according to a preferred embodiment of the present invention, the resin layer is not provided in the region in the underlying electrode layer where the underlying electrode layer covers the first end surface and the second end surface. Therefore, an increase in ESR in the multilayer ceramic capacitor is able to be reduced or prevented.

When the central portion in the height direction of the underlying electrode layer located on the first side surface and the second side surface includes a region not covered with the resin layer, an occurrence of solder burst is able to be reduced or prevented.

When the resin layer covers a portion of the end of the underlying electrode layer located on the first side surface and the second side surface and is continuous from the resin layer that covers the end of the underlying electrode layer located on the main surface, the plated layer provided not only on the first side surface but also on the second side surface is able to have a longer length in the length direction. Therefore, in reflow mounting of the multilayer ceramic capacitor, solder is able to be disposed over a wide area of the external electrode and thus the multilayer ceramic capacitor is able to be mounted on the mount substrate in a more stable manner.

When the resin layer covers the entire or substantially the entire end of the underlying electrode layer located on the first main surface and the second main surface, the resin layer is disposed not only on a side of the first main surface but also on a side of the second main surface. Therefore, a multilayer ceramic capacitor is able to be mounted on a mount substrate with any of the first main surface and the second main surface defining and functioning as a mount surface.

When the resin layer is not provided on the second main surface and is provided on neither the first nor second side surface, the multilayer body is able to have a larger dimension, which leads to an increase in area of the internal electrode and an increase in number of layers. Therefore, a capacitance is able to be higher with the dimension of the multilayer ceramic capacitor being maintained.

When the minimum value of the length in the length direction of the region where the resin layer covers the underlying electrode layers on the main surface is equal to or larger than about 10 μm or the minimum value of the length in the length direction of the region where the resin layer covers a surface of the multilayer body on the main surface is equal to or larger than about 10 μm, generation of a crack in the multilayer ceramic capacitor by bending of the mount substrate or the like is able to be more reliably reduced or prevented.

When the resin layer includes a thermosetting resin and a metal component, the plated layer is able to be readily formed.

Even when the resin layer does not include a metal component, a reduction or prevention of a crack in a multilayer ceramic capacitor is able to be achieved and an increase in ESR is able to be reduced or prevented.

According to preferred embodiments of the present invention, multilayer ceramic capacitors that are each able to reduce or prevent a crack by a resin layer provided on an external electrode thereof and to reduce or prevent an increase in ESR is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

1. Multilayer Ceramic Capacitor

Figure 1:
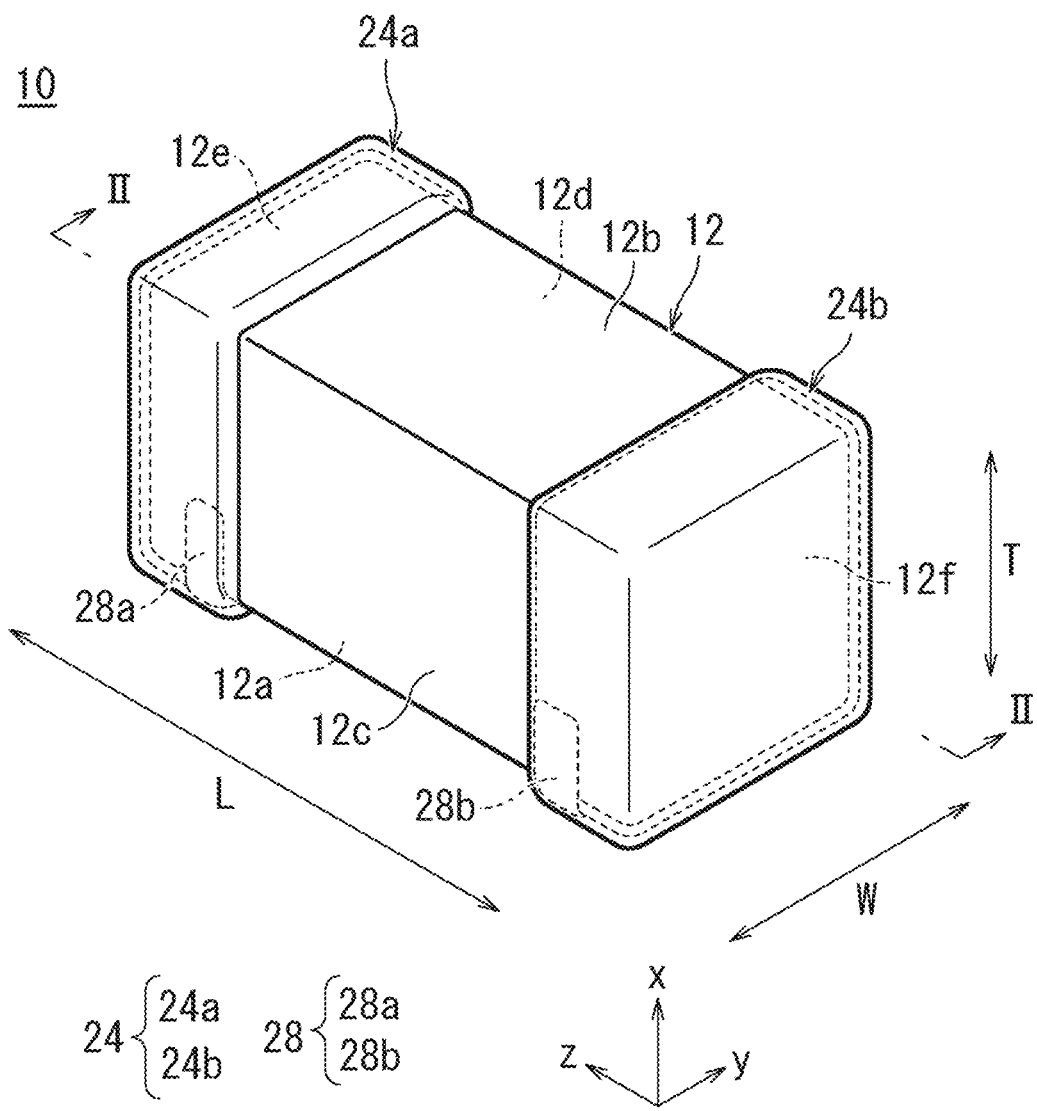
FIG. 1 is a perspective view of a multilayer ceramic capacitor according to Preferred Embodiment 1 of the present invention.
Figure 2A:
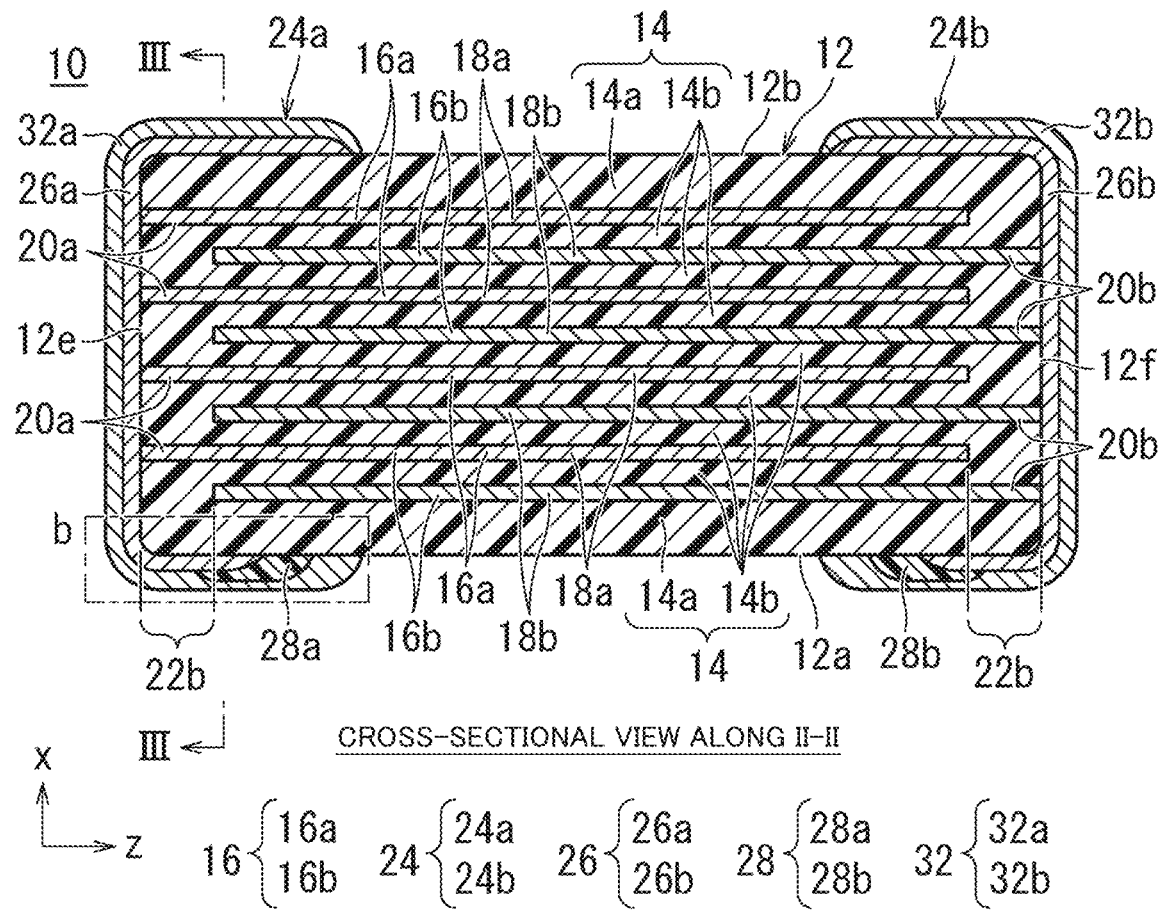
FIG. 2A is a cross-sectional view along the line II-II in FIG. 1 showing the multilayer ceramic capacitor according to Preferred Embodiment 1 of the present invention and FIG. 2B is a partially enlarged view of an end surface of the multilayer ceramic capacitor.
Figure 2B:
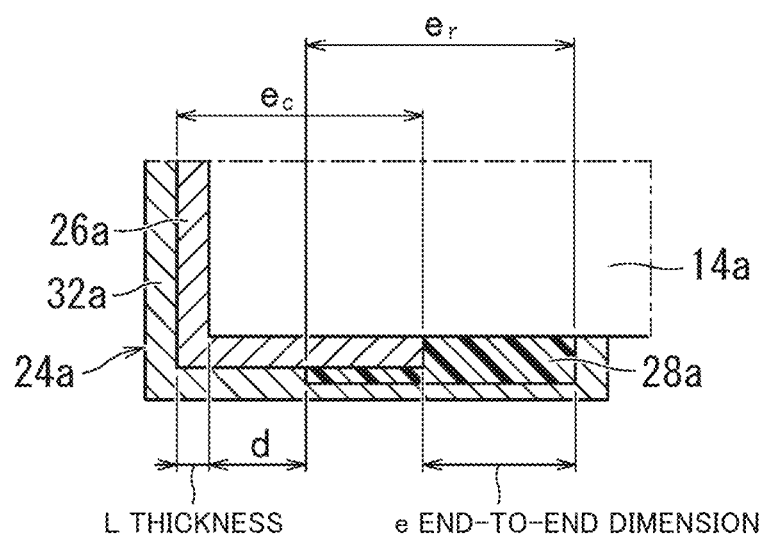
Figure 3:
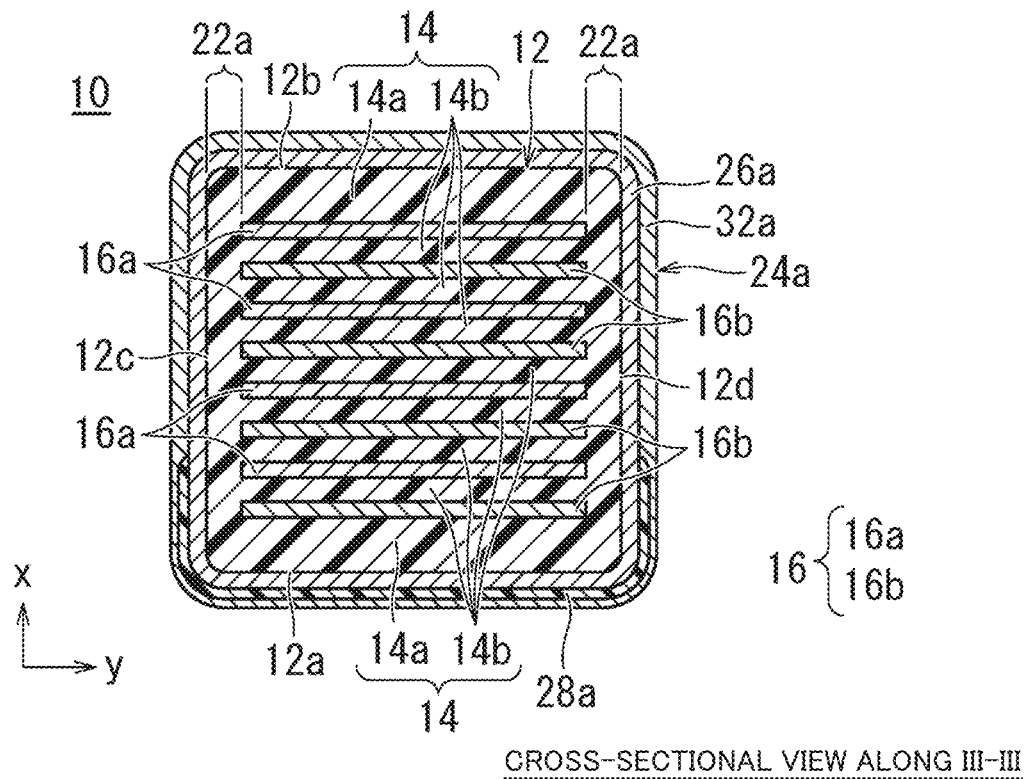
FIG. 3 is a cross-sectional view along the line in FIGS. 2A and 2B showing the multilayer ceramic capacitor according to Preferred Embodiment 1 of the present invention.
Figure 4:
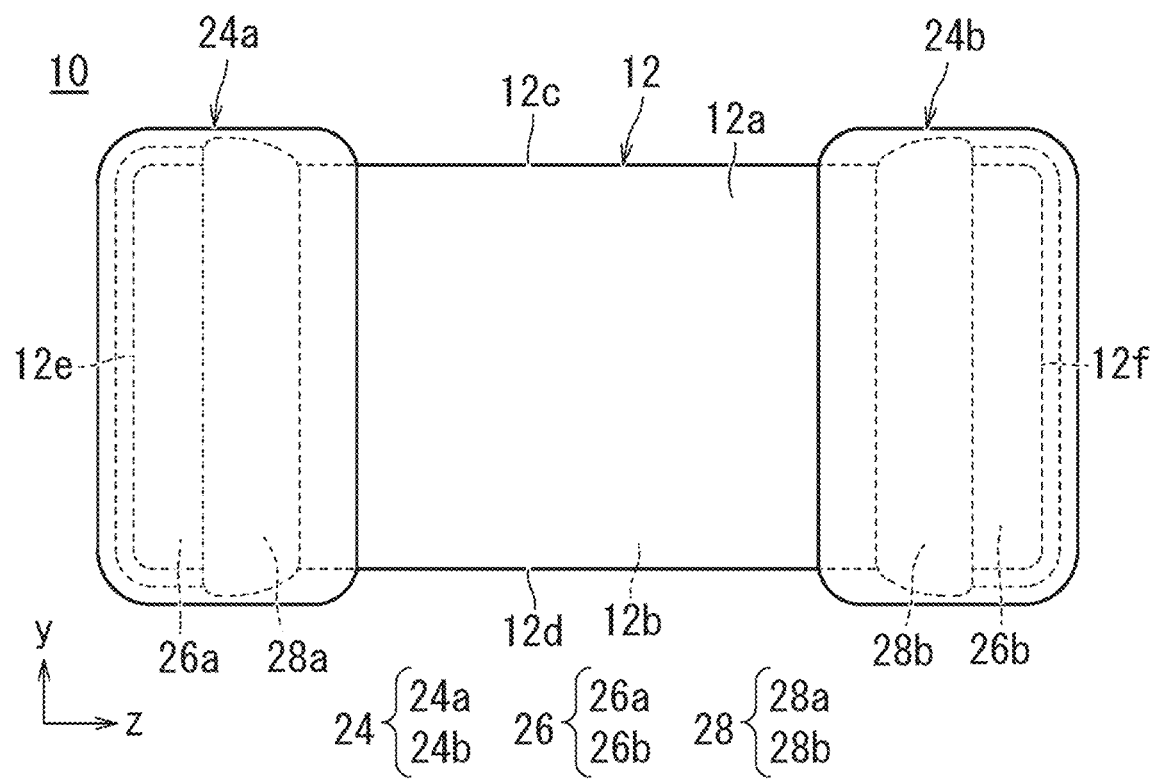
FIG. 4 is a plan view showing a side of a first main surface of the multilayer ceramic capacitor according to Preferred Embodiment 1 of the present invention.

A multilayer ceramic capacitor according to Preferred Embodiment 1 of the present invention will be described. FIG. 1 is a perspective view of the multilayer ceramic capacitor according to Preferred Embodiment 1 of the present invention. FIG. 2A is a cross-sectional view along the line II-II in FIG. 1 showing the multilayer ceramic capacitor according to Preferred Embodiment 1 of the present invention and FIG. 2B is a partially enlarged view of an end surface of the multilayer ceramic capacitor. FIG. 3 is a cross-sectional view along the line in FIGS. 2A and 2B showing the multilayer ceramic capacitor according to Preferred Embodiment 1 of the present invention. FIG. 4 is a plan view showing a side of a first main surface of the multilayer ceramic capacitor according to Preferred Embodiment 1 of the present invention.

As shown in FIGS. 1 to 3, a multilayer ceramic capacitor 1 includes a multilayer body 12 having a parallelepiped or substantially parallelepiped shape.

Multilayer body 12 includes a plurality of layered dielectric layers 14 and a plurality of internal electrode layers 16. Multilayer body 12 includes a first main surface 12a and a second main surface 12b opposed to each other in a height direction x, a first side surface 12c and a second side surface 12d opposed to each other in a width direction y orthogonal or substantially orthogonal to height direction x, and a first end surface 12e and a second end surface 12f opposed to each other in a length direction z orthogonal or substantially orthogonal to height direction x and width direction y. Multilayer body 12 includes a corner and a ridgeline that are rounded. The corner refers to a portion where three adjacent surfaces of the multilayer body meet one another and the ridgeline refers to a portion where two adjacent surfaces of the multilayer body meet each other. Projections and recesses or the like may be provided in a portion or the entirety of first main surface 12a and second main surface 12b, first side surface 12c and second side surface 12d, and first end surface 12e and second end surface 12f.

Multilayer body 12 includes an outer layer portion 14a including a plurality of dielectric layers 14 and an inner layer portion 14b including a single dielectric layer 14 or a plurality of dielectric layers 14 and a plurality of internal electrode layers 16 provided thereon. Outer layer portion 14a is located on each of a side of first main surface 12a and on a side of second main surface 12b of multilayer body 12, and is defined by dielectric layer 14 located between first main surface 12a and internal electrode layer 16 closest to first main surface 12a and from dielectric layer 14 located between second main surface 12b and internal electrode layer 16 closest to second main surface 12b. A region between outer layer portions 14a is inner layer portion 14b.

Dielectric layer 14 can be made of, for example, a dielectric material. For example, dielectric ceramics including a main component such as $BaTiO_3$, $CaTiO_3$, $SrTiO_3$, or $CaZrO_3$ can be used as a dielectric material. When such a dielectric material is included as a main component, depending on a characteristic of desired multilayer body 12, for example, a sub component lower in content than the main component, such as an Mn compound, an Fe compound, a Cr compound, a Co compound, or an Ni compound may be added.

Fired dielectric layer 14 preferably has a thickness not smaller than about 0.5 µm and not larger than about 20 µm, for example.

Multilayer body 12 includes as a plurality of internal electrode layers 16, a plurality of first internal electrode layers 16a and a plurality of second internal electrode layers 16b, for example, having a rectangular or substantially rectangular shape. The plurality of first internal electrode layers 16a and the plurality of second internal electrode layers 16b are embedded along height direction x of multilayer body 12 alternately at regular intervals with dielectric layer 14 disposed therebetween.

First internal electrode layer 16a includes a first opposing electrode portion 18a opposed to second internal electrode layer 16b and a first drawn electrode portion 20a located on one end side of first internal electrode layer 16a and extending from first opposing electrode portion 18a to first end surface 12e of multilayer body 12. First drawn electrode portion 20a includes an end extended to first end surface 12e.

Second internal electrode layer 16b includes a second opposing electrode portion 18b opposed to first internal electrode layer 16a and a second drawn electrode portion 20b located on one end side of second internal electrode layer 16b and extending from second opposing electrode portion 18b to second end surface 12f of multilayer body 12. Second drawn electrode portion 20b includes an end extended to second end surface 12f.

Multilayer body 12 includes a side portion (which is referred to as a "W gap" below) 22a of multilayer body 12 that is provided between one end in width direction y of first opposing electrode portion 18a and second opposing electrode portion 18b and first side surface 12c and between the other end in width direction y of first opposing electrode portion 18a and second opposing electrode portion 18b and second side surface 12d. Multilayer body 12 further includes an end (which is referred to as an "L gap" below) 22b of multilayer body 12 that is provided between an end opposite to first drawn electrode portion 20a of first internal electrode layer 16a and second end surface 12f and between an end opposite to second drawn electrode portion 20b of second internal electrode layer 16b and first end surface 12e.

Internal electrode layer 16 can be made of an appropriate conductive material including, for example, a metal such as Ni, Cu, Ag, Pd, or Au, and an alloy including at least one of those metals, such as an Ag—Pd alloy. Internal electrode layer 16 may further include dielectric particles the same or substantially the same in composition to ceramics included in dielectric layer 14.

Internal electrode layer 16 preferably has a thickness not smaller than about 0.2 µm and not larger than about 2.0 µm, for example.

An external electrode 24 is provided on a side of first end surface 12e and a side of second end surface 12f of multilayer body 12. External electrode 24 includes a first external electrode 24a and a second external electrode 24b.

First external electrode 24a is provided on first end surface 12e of multilayer body 12 and extends from first end surface 12e to cover a portion of each of first main surface 12a, second main surface 12b, first side surface 12c, and second side surface 12d. In this case, first external electrode 24a is electrically connected to first drawn electrode portion 20a of first internal electrode layer 16a.

Second external electrode 24b is provided on second end surface 12f of multilayer body 12 and extends from second end surface 12f to cover a portion of each of first main surface 12a, second main surface 12b, first side surface 12c, and second side surface 12d. In this case, second external electrode 24b is electrically connected to second drawn electrode portion 20b of second internal electrode layer 16b.

In multilayer body 12, a capacitance is provided since first opposing electrode portion 18a of first internal electrode layer 16a is opposed to second opposing electrode portion 18b of second internal electrode layer 16b with dielectric layer 14 being interposed therebetween. Therefore, the capacitance can be obtained between first external electrode 24a to which first internal electrode layer 16a is connected and second external electrode 24b to which second internal electrode layer 16b is connected so that a characteristic of the capacitor is exhibited.

First external electrode 24a and second external electrode 24b each include an underlying electrode layer 26, a main-surface-side resin layer 28, and a plated layer 32.

Underlying electrode layer 26 includes a first underlying electrode layer 26a and a second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on the surface of second end surface 12f of multilayer body 12 and extends from second end surface 12f to cover a portion of each of first main surface 12a, second main surface 12b, first side surface 12c, and second side surface 12d.

Underlying electrode layer 26 includes a conductive metal and a glass component, for example. The metal for underlying electrode layer 26 preferably includes at least one selected, for example, from Cu, Ni, Ag, Pd, an Ag—Pd alloy, Au, and the like. Glass for underlying electrode layer 26 preferably includes, for example, at least one selected from B, Si, Zn, Ba, Mg, Al, Li, and the like. Underlying electrode layer 26 may include a plurality of layers. Underlying electrode layer 26 is obtained, for example, by applying a conductive paste including glass and a metal to multilayer body 12 and firing the conductive paste, and it may be fired simultaneously with dielectric layer 14 and internal electrode layer 16 or may be baked after firing of dielectric layer 14 and internal electrode layer 16. Underlying electrode layer 26 may be formed by plating. A thickest portion of underlying electrode layer 26 preferably has a thickness not smaller than about 10 µm and not larger than about 150 µm, for example. Underlying electrode layer 26 does not necessarily have to include a glass component.

Main-surface-side resin layer 28 includes a first main-surface-side resin layer 28a and a second main-surface-side resin layer 28b.

First main-surface-side resin layer 28a covers an end of first underlying electrode layer 26a located on first main surface 12a and covers a portion of the end of first underlying electrode layer 26a located on each of first side surface 12c and second side surface 12d continuously from the side of first main surface 12a. Preferably, a region not covered with first main-surface-side resin layer 28a is provided in a central portion in height direction x at the end of first underlying electrode layer 26a located on first side surface 12c and second side surface 12d. As shown in FIG. 2B, a portion where first main-surface-side resin layer 28a covers multilayer body 12 from the end of first underlying electrode layer 26a located on first main surface 12a toward second end surface 12f is defined as an e end-to-end dimension. Then, the e end-to-end dimension preferably has a length in length direction z equal to or larger than about 10 µm, for example.

Second main-surface-side resin layer 28b covers an end of second underlying electrode layer 26b located on first main surface 12a and covers a portion of the end of second underlying electrode layer 26b located on each of first side surface 12c and second side surface 12d continuously from the side of first main surface 12a. Preferably, a region not covered with second main-surface-side resin layer 28b is provided in the central portion in height direction x at the end of second underlying electrode layer 26b located on first side surface 12c and second side surface 12d. A portion where second main-surface-side resin layer 28b covers multilayer body 12 from the end of second underlying electrode layer 26b located on first main surface 12a toward first end surface 12e is defined as an e end-to-end dimension. Then, the e end-to-end dimension preferably has a length in length direction z equal to or larger than about 10 µm, for example.

When the e end-to-end dimension has a length in length direction z equal to or larger than about 10 µm, an area of the resin layer to lessen stress during a thermal shock cycle can sufficiently be ensured and a bending crack relaxation effect can be obtained.

Second main-surface-side resin layer 28b does not necessarily have to be provided.

Though main-surface-side resin layer 28 covers the end of underlying electrode layer 26 located on first main surface 12a, it may cover the end of underlying electrode layer 26 located on second main surface 12b.

The e end-to-end dimension can be identified as below.

Specifically, initially, the e end-to-end dimension is measured in an LT cross-section in the central portion in width direction y of multilayer ceramic capacitor 10. Any instrument may be used for measurement such as, for example, a microscope or an SEM as long as it can measure a dimension in a cross-section.

Main-surface-side resin layer 28 is not provided on the surface of underlying electrode layer 26 on first end surface 12e and second end surface 12f. Main-surface-side resin layer 28 not being provided on underlying electrode layer 26 on first end surface 12e and second end surface 12f encompasses an example where the main-surface-side resin layer is not provided at all and also an example where a region where the main-surface-side resin layer is not provided occupies a portion, and main-surface-side resin layer 28 is located in a portion.

Main-surface-side resin layer 28 includes a thermosetting resin. Since main-surface-side resin layer 28 includes a thermosetting resin, it is more flexible than underlying electrode layer 26 made of, for example, a plated film or a fired product of a conductive paste. Therefore, even though a physical shock or a shock originating from a thermal cycle is applied to multilayer ceramic capacitor 10, main-surface-side resin layer 28 defines and functions as a buffer layer and can prevent a crack in multilayer ceramic capacitor 10.

Main-surface-side resin layer 28 may further include a metal component.

Specific examples of the thermosetting resin included in main-surface-side resin layer 28 include various known thermosetting resins such as an epoxy resin, a phenol resin, a urethane resin, a silicone resin, and a polyimide resin. Among these, the epoxy resin excellent in heat resistance, moisture resistance, and adhesiveness is one of the more preferable resins. Main-surface-side resin layer 28 preferably includes a hardening agent together with the thermosetting resin. When the epoxy resin is used as a base resin, various known compounds such as a phenol-based compound, an amine-based compound, an acid anhydride-based compound, and an imidazole-based compound, for example, can be used as the hardening agent for the epoxy resin.

For example, Ag, Cu, Sn, or an alloy including at least one of these can be used as a metal component to be included in main-surface-side resin layer 28. Alternatively, metal powders having a surface coated with Ag can be used. When using metal powders having a surface coated with Ag, Cu or Ni, for example, is preferably used for the metal powders. Cu subjected to antioxidation treatment can also be used. The reason why a metal coated with Ag is used is that a metal as a base material can be inexpensive while the characteristics of Ag are maintained.

At most, for example, about 50 vol % of metal is preferably included in main-surface-side resin layer 28 with respect to the total volume of a conductive resin. The metal included in main-surface-side resin layer 28 is included as a conductive filler (metal powders). A shape of the conductive filler is not particularly limited. Though the conductive filler may be spherical or may have a flat profile, spherical metal powders and metal powders having a flat profile are preferably used as a mixture. Though the conductive filler included in main-surface-side resin layer 28 may preferably have an average particle size, for example, not smaller than about 0.3 µm and not larger than about 10.0 µm, it is not particularly limited. The conductive filler included in main-surface-side resin layer 28 mainly provides current conduction in main-surface-side resin layer 28. Specifically, a current conduction path is provided in main-surface-side resin layer 28 as a result of contact between the conductive fillers.

Plated layer 32 includes a first plated layer 32a and a second plated layer 32b.

First plated layer 32a covers first underlying electrode layer 26a and first main-surface-side resin layer 28a. Specifically, first plated layer 32a is preferably provided on the surface of first underlying electrode layer 26a located on first end surface 12e and also extending onto the surfaces of first underlying electrode layer 26a and first main-surface-side resin layer 28a located on first main surface 12a and first underlying electrode layer 26a located on second main surface 12b, first side surface 12c, and second side surface 12d.

Second plated layer 32b covers second underlying electrode layer 26b and second main-surface-side resin layer 28b. Specifically, second plated layer 32b is preferably provided on the surface of second underlying electrode layer 26b located on second end surface 12f and also extends onto the surfaces of second underlying electrode layer 26b and second main-surface-side resin layer 28b located on first main surface 12a and second underlying electrode layer 26b located on second main surface 12b, first side surface 12c, and second side surface 12d.

Plated layer 32 preferably includes at least one selected, for example, from Cu, Ni, Sn, Ag, Pd, an Ag—Pd alloy, Au, and the like. Plated layer 32 may include a plurality of layers. The plated layer preferably has a two-layered structure of Ni plating and Sn plating, for example. By providing a plated layer (an Ni plated layer) made of Ni plating to cover underlying electrode layer 26 and main-surface-side resin layer 28, corrosion of underlying electrode layer 26 and main-surface-side resin layer 28 by solder used for mount can be reduced or prevented when mounting multilayer ceramic capacitor 10. By further providing a plated layer (an Sn plated layer) made of Sn plating on a surface of the plated layer made of Ni plating, when mounting multilayer ceramic capacitor 10, wettability of solder used for mount can be improved to facilitate mounting.

Plated layer 32 preferably has a thickness not smaller than about 1 μm and not larger than about 15 μm, for example.

In multilayer ceramic capacitor 10, plated layer 32 on first main surface 12a where main-surface-side resin layer 28 is provided preferably has a longer length dimension in length direction z by, for example, at least about 100 μm than plated layer 32 on first side surface 12c and second side surface 12d. Then, first main surface 12a defining and functioning as a mount surface can be identified. In multilayer ceramic capacitor 10, plated layer 32 on first main surface 12a where main-surface-side resin layer 28 is provided more preferably has a longer length dimension in length direction z by, for example, at least about 200 μm than plated layer 32 on first side surface 12c and second side surface 12d.

A dimension in length direction z of multilayer ceramic capacitor 10 including multilayer body 12, first external electrode 24a, and second external electrode 24b is defined as an L dimension, a dimension in height direction x of multilayer ceramic capacitor 10 including multilayer body 12, first external electrode 24a, and second external electrode 24b is defined as a T dimension, and a dimension in width direction y of multilayer ceramic capacitor 10 including multilayer body 12, first external electrode 24a, and second external electrode 24b is defined as a W dimension.

A preferred size of multilayer ceramic capacitor 10 includes a 0603 size, a 1005 size, a 1608 size, a 2012 size, and a 3216 size, for example.

The 0603 size refers to a size of the L dimension of about 0.6 mm, the W dimension of about 0.3 mm, and the T dimension of about 0.3 mm, the 1005 size refers to a size of the L dimension of about 1.0 mm, the W dimension of about 0.5 mm, and the T dimension of about 0.5 mm, the 1608 size refers to a size of the L dimension of about 1.6 mm, the W dimension of about 0.8 mm, and the T dimension of about 0.8 mm, the 2012 size refers to a size of the L dimension of about 2.0 mm, the W dimension of about 1.2 mm, and the T dimension of about 1.2 mm, and the 3216 size refers to a size of the L dimension of about 3.2 mm, the W dimension of about 1.6 mm, and the T dimension of about 1.6 mm. The dimension of multilayer ceramic capacitor 10 can be measured, for example, with a micrometer or an optical microscope.

As shown in FIG. 2B, a thickness of underlying electrode layer 26 provided on the end surface is defined as an L thickness, a length in length direction z of the underlying electrode layer provided on the main surface side is defined as an $e_c$ dimension, a length from the end surface to an end of provided main-surface-side resin layer 28 is defined as a d dimension, and a length in length direction z of main-surface-side resin layer 28 provided on the main surface side is defined as an $e_r$ dimension.

The 0603 size preferably has the L thickness not smaller than about 6 μm and not larger than about 36 μm, the $e_c$ dimension not smaller than about 30 μm and not larger than about 180 μm, the d dimension not smaller than about 15 μm and not larger than about 25 μm, and the $e_r$ dimension not smaller than about 30 μm and not larger than about 180 μm, for example.

The 1005 size preferably has the L thickness not smaller than about 12 μm and not larger than about 57 μm, the $e_c$ dimension not smaller than about 30 μm and not larger than about 290 μm, the d dimension not smaller than about 15 μm and not larger than about 25 μm, and the $e_r$ dimension not smaller than about 80 μm and not larger than about 280 μm, for example.

The 1608 size preferably has the L thickness not smaller than about 18 μm and not larger than about 54 μm, the $e_c$ dimension not smaller than about 30 μm and not larger than about 470 μm, the d dimension not smaller than about 15 μm and not larger than about 25 μm, and the $e_r$ dimension not smaller than about 110 μm and not larger than about 470 μm, for example.

The 2012 size preferably has the L thickness not smaller than about 30 μm and not larger than about 54 μm, the $e_c$ dimension not smaller than about 30 μm and not larger than about 600 μm, the d dimension not smaller than about 15 μm and not larger than about 25 μm, and the $e_r$ dimension not smaller than about 190 μm and not larger than about 600 μm, for example.

The 3216 size preferably has the L thickness not smaller than about 24 μm and not larger than about 90 μm, the $e_c$ dimension not smaller than about 30 μm and not larger than about 670 μm, the d dimension not smaller than about 15 μm and not larger than about 25 μm, and the $e_r$ dimension not smaller than about 220 μm and not larger than about 670 μm, for example.

The d dimension can be measured with a method described below.

Specifically, initially, measurement in an LT cross-section in the central portion in width direction y of multilayer ceramic capacitor 10 and at two ends in width direction y of internal electrode layer 16 is conducted. Any instrument may be used for measurement such as, for example, a microscope or an SEM so long as it can measure a dimension in a cross-section. A smallest dimension at these three measurement sites is adopted as the d dimension.

In multilayer ceramic capacitor 10 shown in FIG. 1, first main-surface-side resin layer 28a covers the end of first underlying electrode layer 26a located on first main surface 12a defining and functioning as the mount surface and covers a portion of the end of first underlying electrode layer 26a located on each of first side surface 12c and second side surface 12d continuously from the side of first main surface 12a, and second main-surface-side resin layer 28b covers a portion of the end of second underlying electrode layer 26b located on first main surface 12a defining and functioning as the mount surface and covers a portion of the end of second underlying electrode layer 26b located on each of first side surface 12c and second side surface 12d continuously from the side of first main surface 12a. Therefore, mechanical strength of multilayer ceramic capacitor 10 can be improved. Therefore, when a shock due to drop or bending stress in a mount substrate occurs, that stress can be more reliably absorbed and thus generation of a crack in the multilayer body can be reduced or prevented.

In multilayer ceramic capacitor 10 shown in FIG. 1, no resin layer is provided on first end surface 12e and second end surface 12f. Therefore, an increase in ESR of the multilayer ceramic capacitor can be reduced or prevented.

When multilayer ceramic capacitor 10 shown in FIG. 1 includes a region not covered with first main-surface-side resin layer 28a in the central portion in height direction x at the end of first underlying electrode layer 26a located on first side surface 12c and second side surface 12d and a region not covered with second main-surface-side resin layer 28b in the central portion in height direction x at the end of second underlying electrode layer 26b located on first side surface 12c and second side surface 12d, an occurrence of solder burst can be reduced or prevented.

The end of underlying electrode layer 26 not covered with main-surface-side resin layer 28 described above can be identified by a method as below.

Specifically, a region not covered with a resin is identified by shaving multilayer ceramic capacitor 10 from first side surface 12c or second side surface 12d by using a file. The resin is identified by, for example, SEM-EDX in a photograph of a cross-section.

Figure 5:
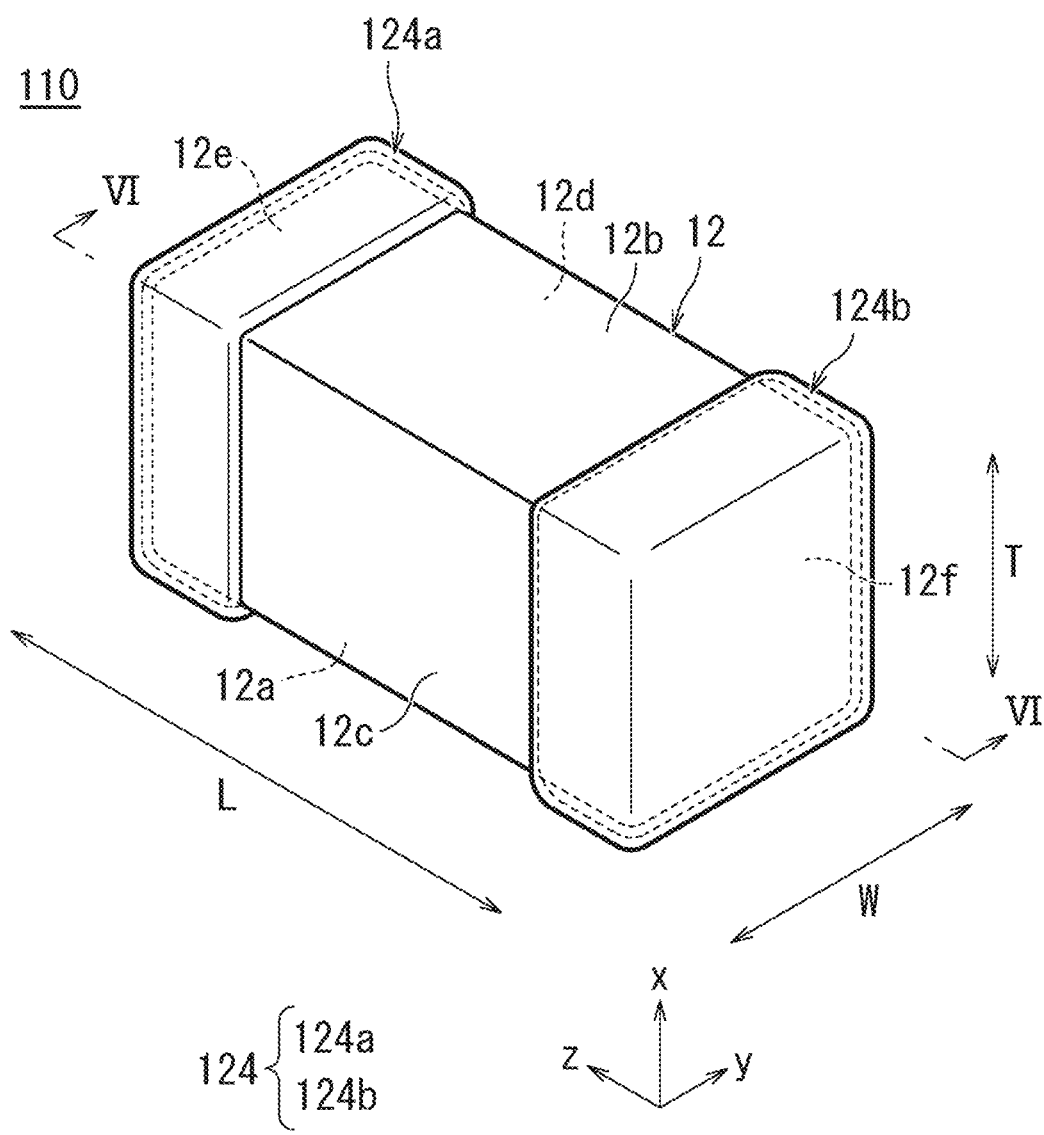
FIG. 5 is a perspective view of an exemplary multilayer ceramic capacitor according to Preferred Embodiment 2 of the present invention.
Figure 6:
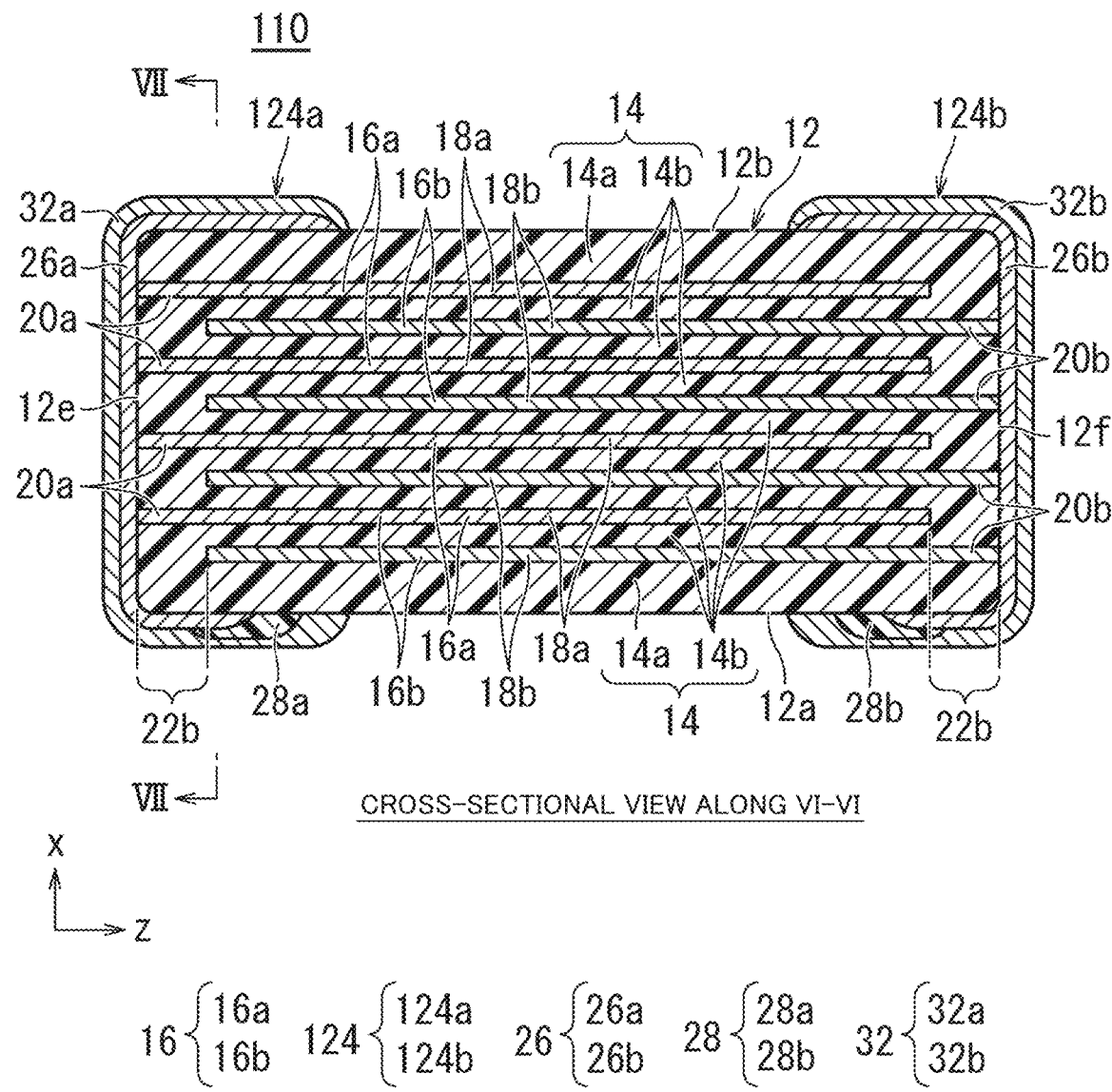
FIG. 6 is a cross-sectional view along the line VI-VI in FIG. 5 showing the multilayer ceramic capacitor according to Preferred Embodiment 2 of the present invention.
Figure 7:
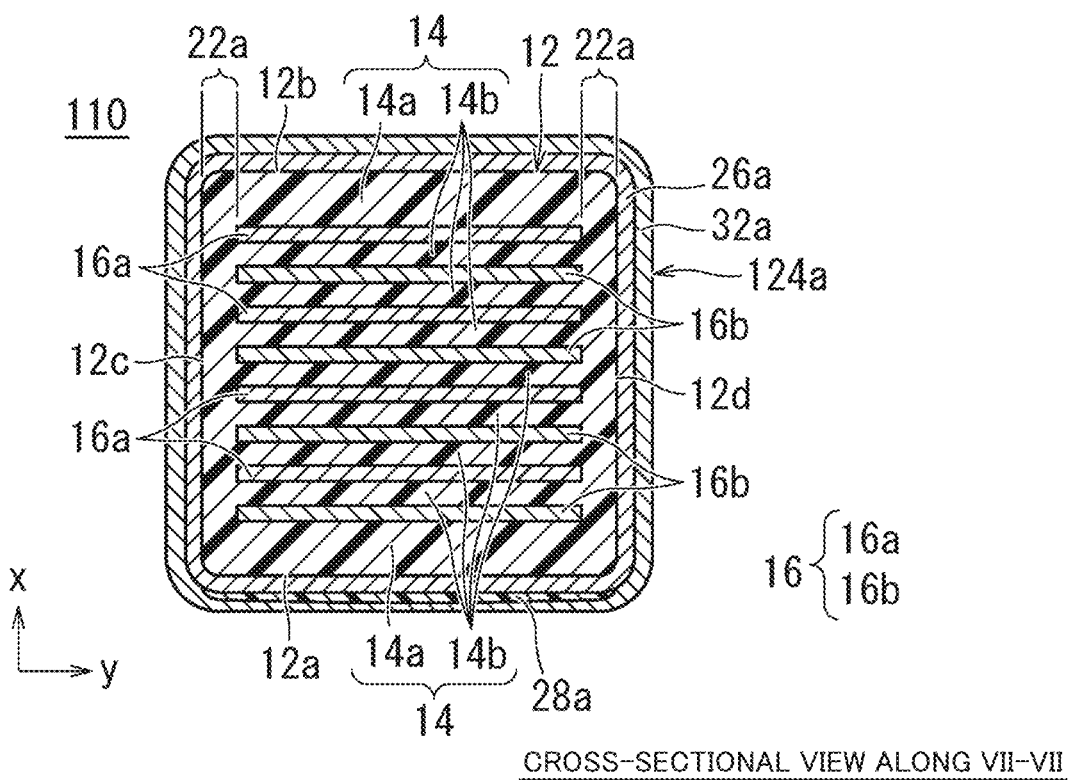
FIG. 7 is a cross-sectional view along the line VII-VII in FIG. 6 showing the multilayer ceramic capacitor according to Preferred Embodiment 2 of the present invention.
Figure 8:
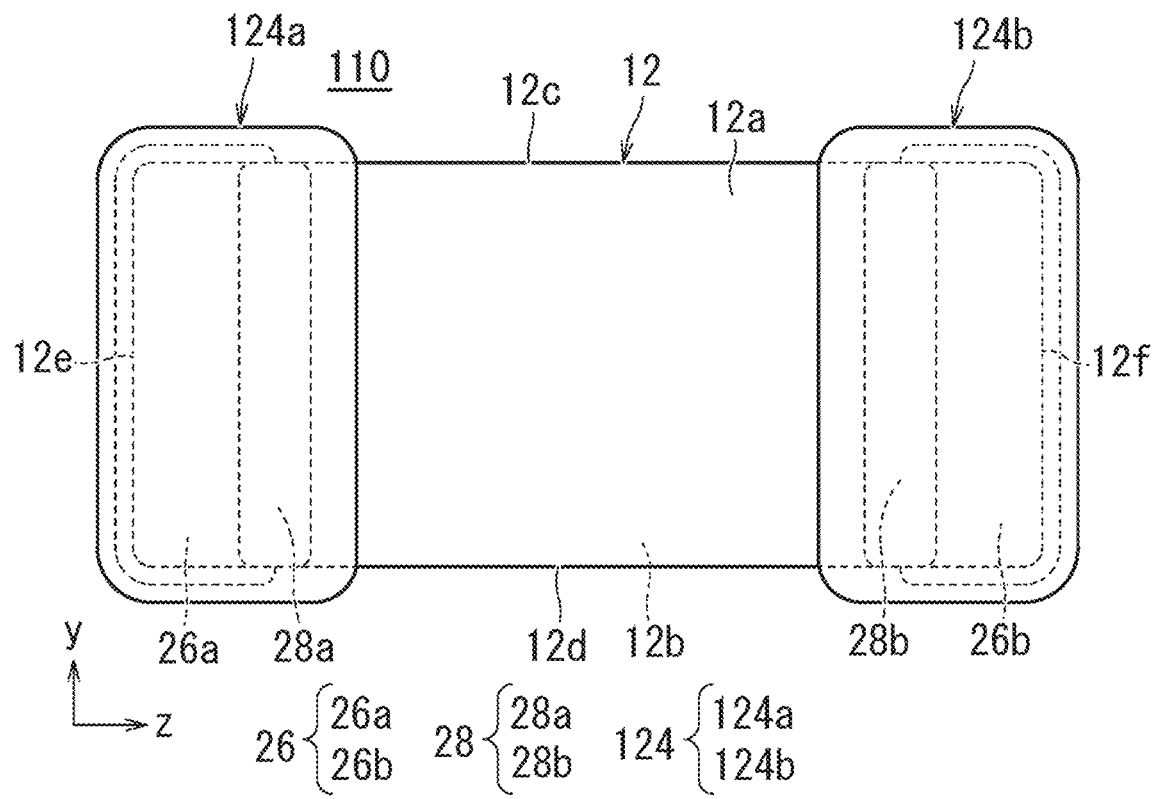
FIG. 8 is a plan view showing the side of the first main surface of the multilayer ceramic capacitor according to Preferred Embodiment 2 of the present invention.

A multilayer ceramic capacitor according to Preferred Embodiment 2 of the present invention will now be described. FIG. 5 is a perspective view of an exemplary multilayer ceramic capacitor according to Preferred Embodiment 2 of the present invention. FIG. 6 is a cross-sectional view along the line VI-VI in FIG. 5 showing the multilayer ceramic capacitor according to Preferred Embodiment 2 of the present invention and FIG. 7 is a cross-sectional view along the line VII-VII in FIG. 6 showing the multilayer ceramic capacitor according to Preferred Embodiment 2 of the present invention. FIG. 8 is a plan view showing the side of the first main surface of the multilayer ceramic capacitor according to Preferred Embodiment 2 of the present invention. A multilayer ceramic capacitor 110 according to the present preferred embodiment is similar in construction to multilayer ceramic capacitor 10 described with reference to FIG. 1, except for a difference in the structure of the external electrode, of main-surface-side resin layer 28 covering only the entire or substantially the entire end of underlying electrode layer 26 located on the main surface. Therefore, elements the same as or similar to those in multilayer ceramic capacitor 10 shown in FIG. 1 are denoted by the same reference characters and description thereof will not be provided.

Multilayer ceramic capacitor 110 includes multilayer body 12.

An external electrode 124 is provided on first end surface 12e and on second end surface 12f of multilayer body 12. External electrode 124 includes a first external electrode 124a and a second external electrode 124b. First external electrode 124a and second external electrode 124b each include underlying electrode layer 26, main-surface-side resin layer 28, and plated layer 32.

Main-surface-side resin layer 28 includes first main-surface-side resin layer 28a and second main-surface-side resin layer 28b.

First main-surface-side resin layer 28a covers only the entire or substantially the entire end of first underlying electrode layer 26a located on first main surface 12a and does not cover the end of first underlying electrode layer 26a located on first side surface 12c and second side surface 12d.

Second main-surface-side resin layer 28b covers only the entire or substantially the entire end of second underlying electrode layer 26b located on first main surface 12a and does not cover the end of second underlying electrode layer 26b located on first side surface 12c and second side surface 12d.

Though main-surface-side resin layer 28 covers only the entire or substantially the entire end of underlying electrode layer 26 located on first main surface 12a, it may also cover the entire or substantially the entire end of underlying electrode layer 26 located on second main surface 12b.

Underlying electrode layer 26 located on first main surface 12a may include a region not covered with main-surface-side resin layer 28.

Multilayer ceramic capacitor 110 shown in FIG. 5 achieves advantageous effects similar to those achieved by multilayer ceramic capacitor 10 shown in FIG. 1 and achieves an advantageous effect described below.

Specifically, the resin layer is not provided on second main surface 12b and on first side surface 12c and second side surface 12d. Therefore, multilayer body 12 can be increased in dimension, which accordingly leads to an increase in area of the internal electrode and an increase in number of layers. Therefore, a capacitance can be higher with the dimension of the multilayer ceramic capacitor being maintained.

Figure 9:
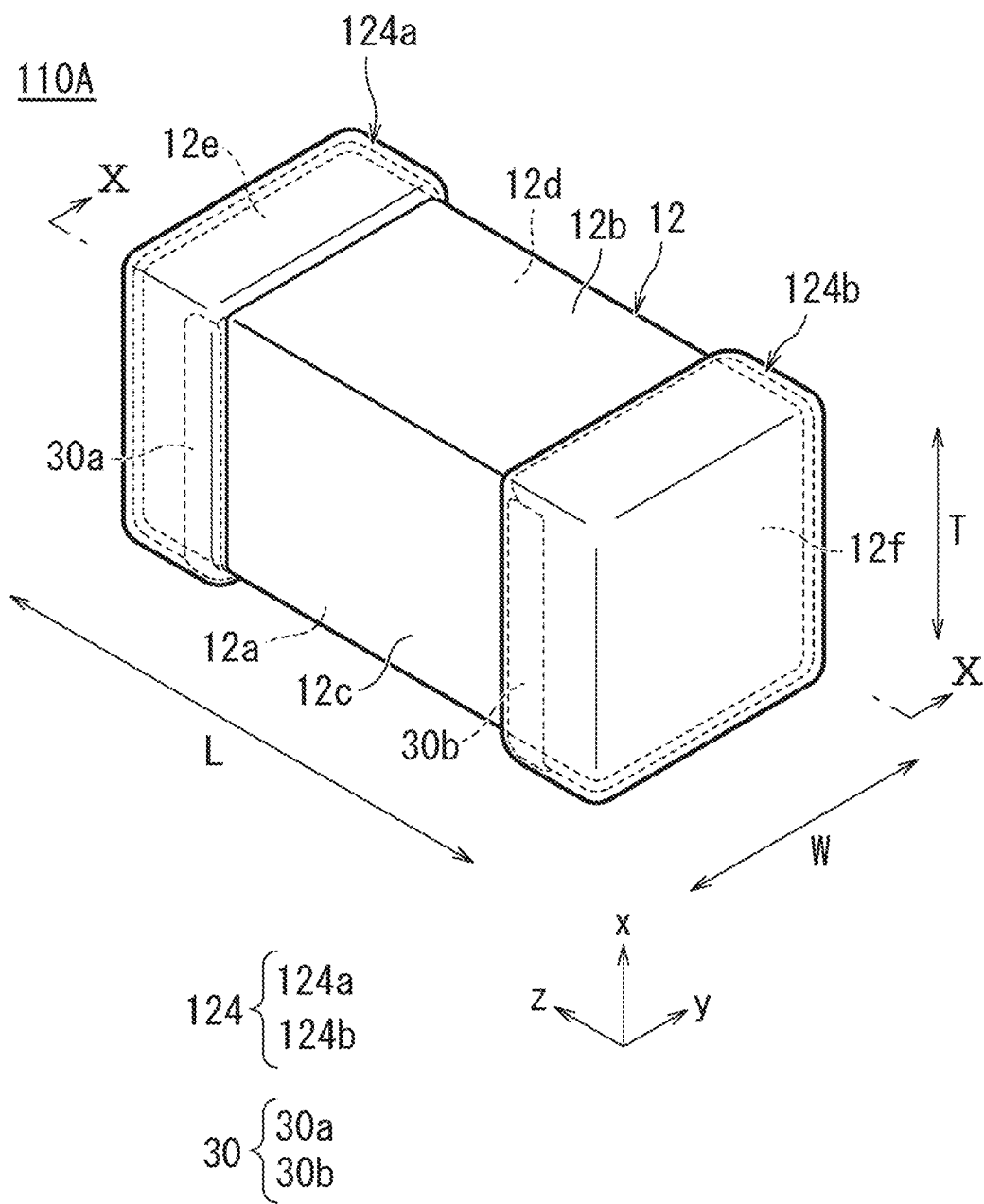
FIG. 9 is a perspective view of an exemplary multilayer ceramic capacitor according to Preferred Embodiment 3 of the present invention.
Figure 10:
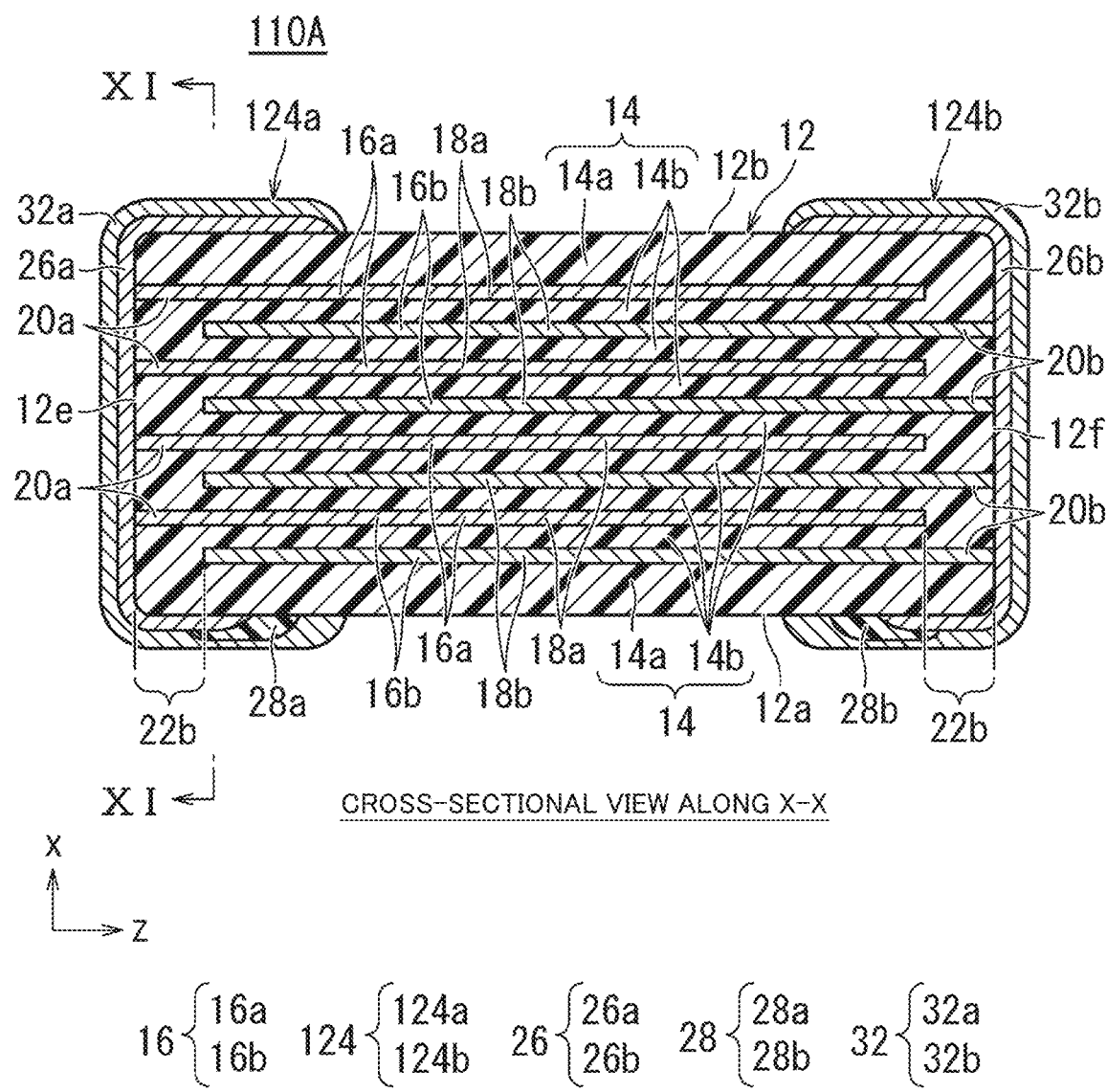
FIG. 10 is a cross-sectional view along the line X-X in FIG. 9 showing the multilayer ceramic capacitor according to Preferred Embodiment 3 of the present invention.
Figure 11:
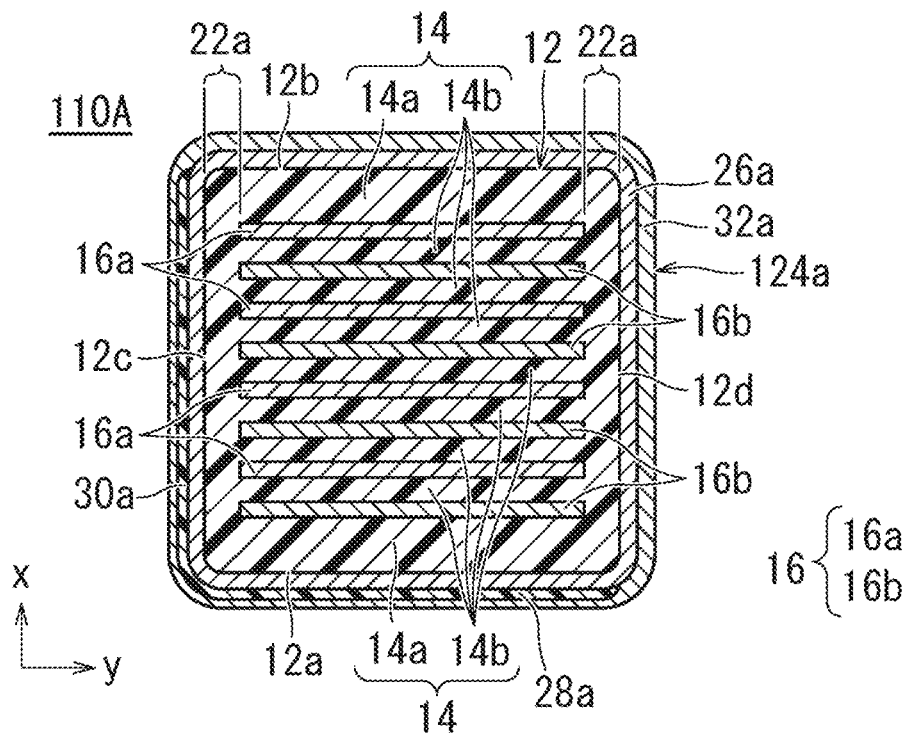
FIG. 11 is a cross-sectional view along the line XI-XI in FIG. 10 showing the multilayer ceramic capacitor according to Preferred Embodiment 3 of the present invention.
Figure 12:
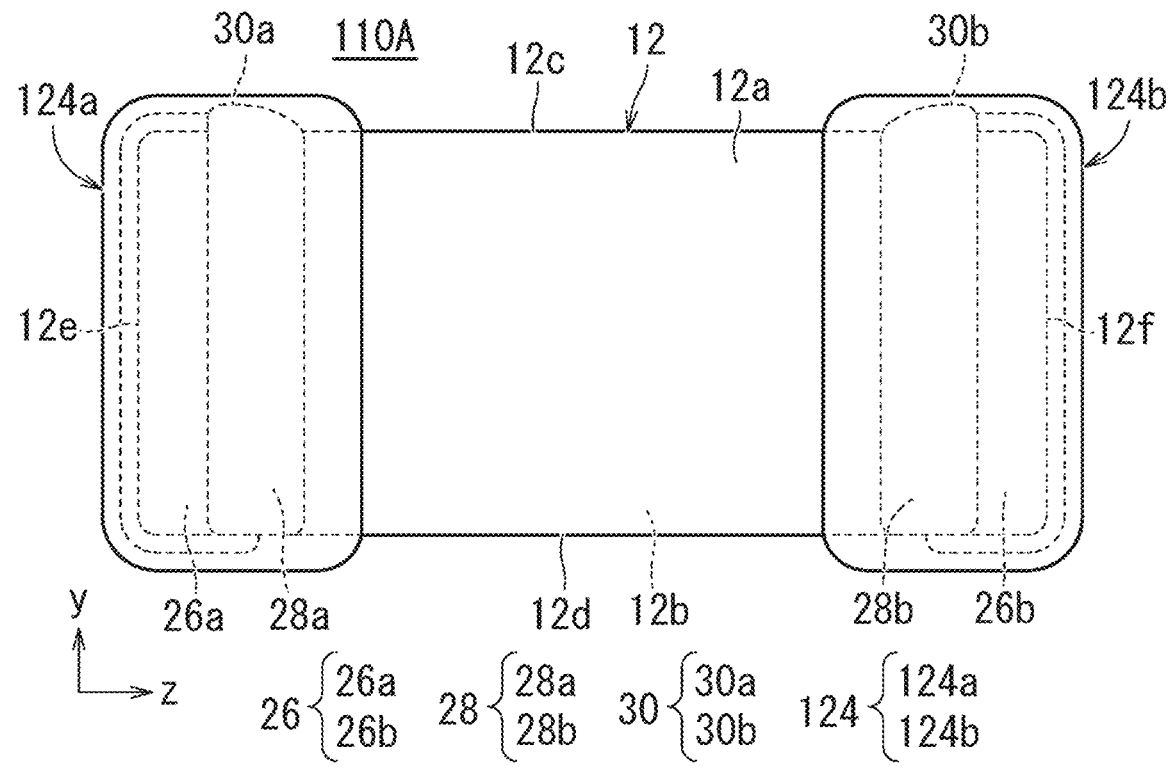
FIG. 12 is a plan view showing the side of the first main surface of the multilayer ceramic capacitor according to Preferred Embodiment 3 of the present invention.
Figure 13:
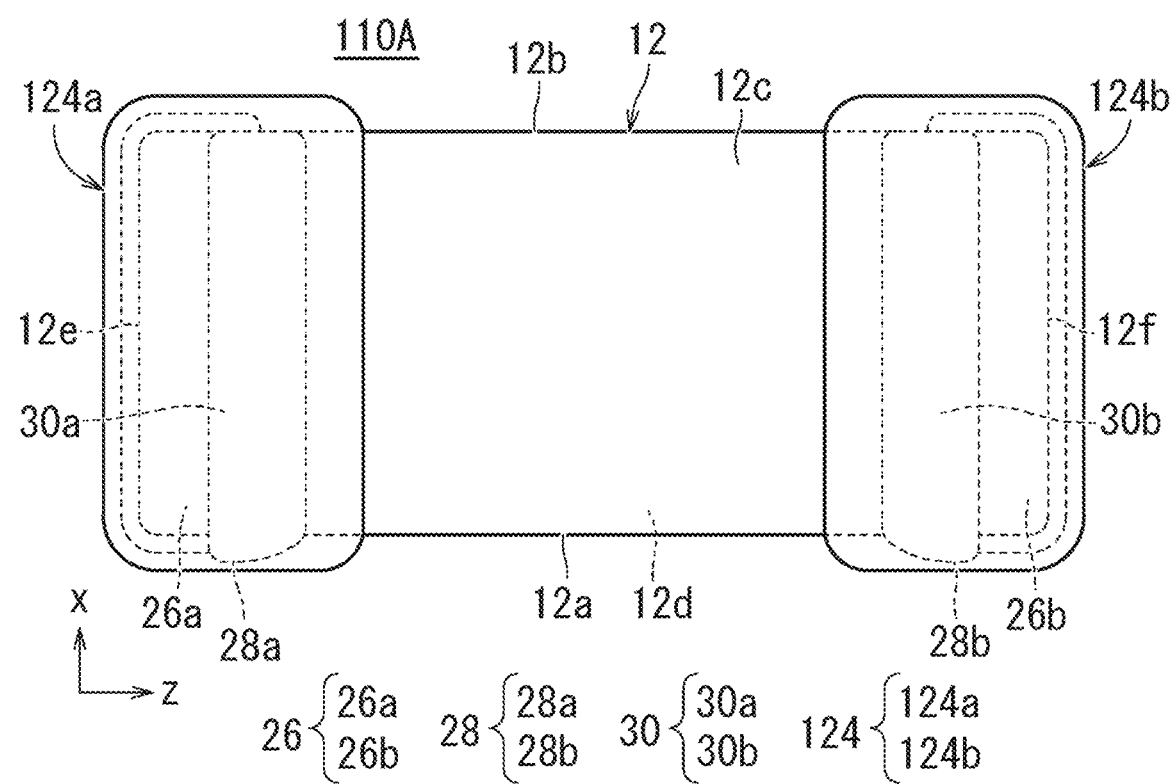
FIG. 13 is a plan view showing a side of a first side surface of the multilayer ceramic capacitor according to Preferred Embodiment 3 of the present invention.

A multilayer ceramic capacitor according to Preferred Embodiment 3 of the present invention will now be described. FIG. 9 is a perspective view of an exemplary multilayer ceramic capacitor according to Preferred Embodiment 3 of the present invention. FIG. 10 is a cross-sectional view along the line X-X in FIG. 9 showing the multilayer ceramic capacitor according to Preferred Embodiment 3 of the present invention and FIG. 11 is a cross-sectional view along the line XI-XI in FIG. 10 showing the multilayer ceramic capacitor according to Preferred Embodiment 3 of the present invention. FIG. 12 is a plan view showing the side of the first main surface of the multilayer ceramic capacitor according to Preferred Embodiment 3 of the present invention and FIG. 13 is a plan view showing the side of the first side surface of the multilayer ceramic capacitor according to Preferred Embodiment 3 of the present invention. A multilayer ceramic capacitor 110A according to the present preferred embodiment is similar in construction to multilayer ceramic capacitor 10 described with reference to FIG. 1, except for a difference in not only main-surface-side resin layer 28 but also a side-surface-side resin layer 30 in the external electrode. Therefore, elements the same as or similar to those in multilayer ceramic capacitor 10 shown in FIG. 1 are denoted by the same reference characteristics and description thereof will not be provided.

Multilayer ceramic capacitor 110A includes multilayer body 12.

External electrode 124 is provided on first end surface 12e and second end surface 12f of multilayer body 12. External electrode 124 includes first external electrode 124a and second external electrode 124b. First external electrode 124a and second external electrode 124b each include underlying electrode layer 26, main-surface-side resin layer 28, side-surface-side resin layer 30, and plated layer 32.

Main-surface-side resin layer 28 includes first main-surface-side resin layer 28a and second main-surface-side resin layer 28b.

First main-surface-side resin layer 28a covers the entire or substantially the entire end of first underlying electrode layer 26a located on first main surface 12a.

Second main-surface-side resin layer 28b covers the entire or substantially the entire end of second underlying electrode layer 26b located on first main surface 12a.

Side-surface-side resin layer 30 includes a first side-surface-side resin layer 30a and a second side-surface-side resin layer 30b.

First side-surface-side resin layer 30a covers the entire or substantially the entire end of first underlying electrode layer 26a located on first side surface 12c continuously from one end of first main-surface-side resin layer 28a.

Second side-surface-side resin layer 30b covers the entire or substantially the entire end of second underlying electrode layer 26b located on first side surface 12c continuously from one end of second main-surface-side resin layer 28b.

Side-surface-side resin layer 30 includes the same or substantially the same material as main-surface-side resin layer 28.

Multilayer ceramic capacitor 110A shown in FIG. 9 achieves advantageous effects similar to those achieved by multilayer ceramic capacitor 10 shown in FIG. 1.

Figure 14:
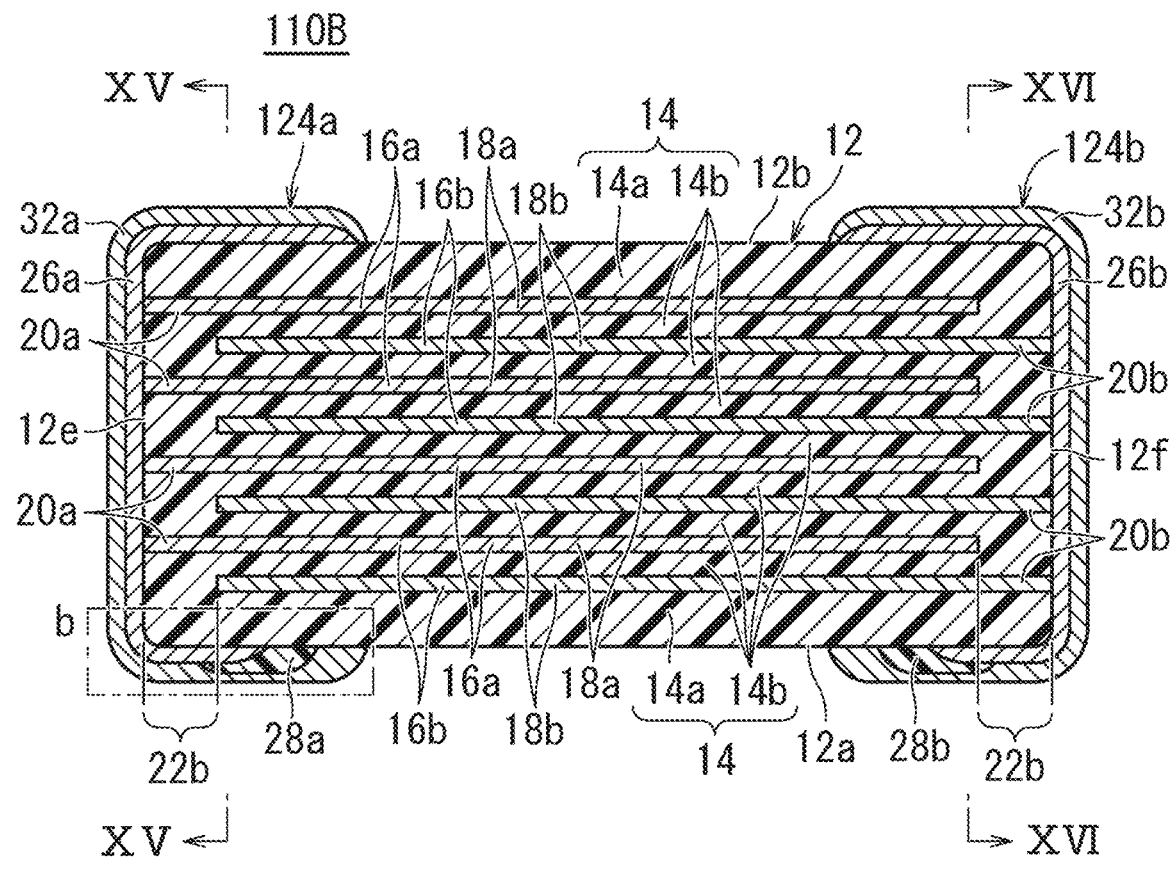
FIG. 14 is a cross-sectional view showing an exemplary multilayer ceramic capacitor according to Preferred Embodiment 4 of the present invention.
Figure 15:
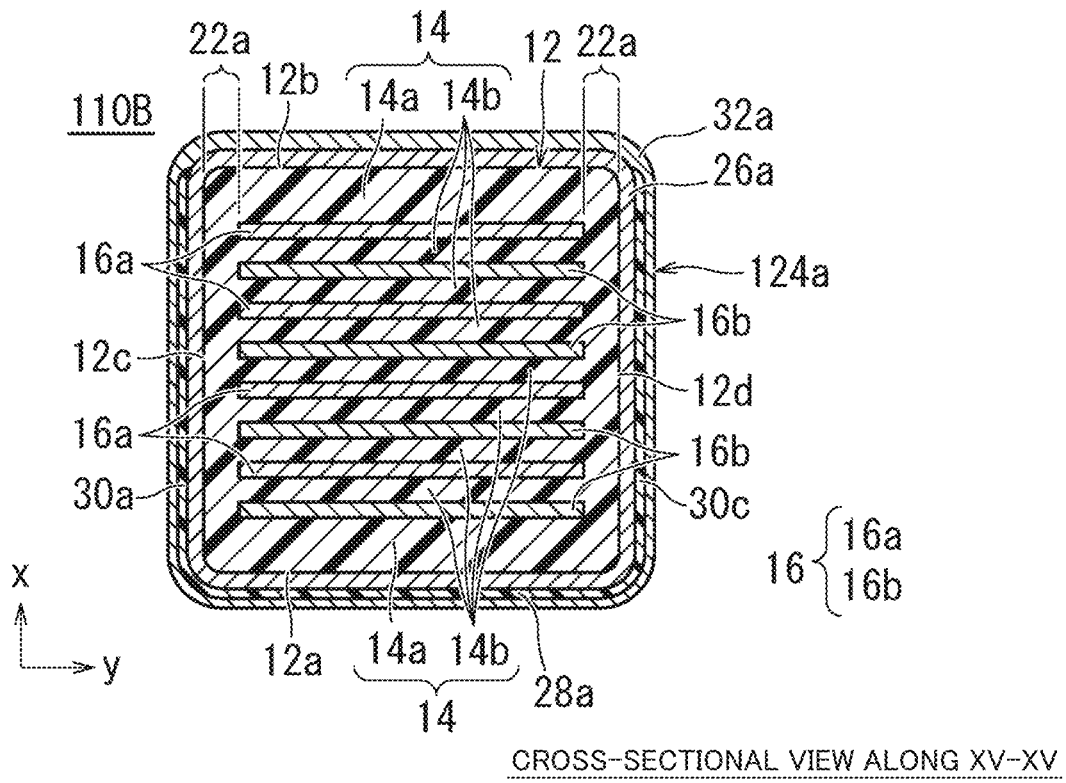
FIG. 15 is a cross-sectional view along the line XV-XV in FIG. 14 showing the multilayer ceramic capacitor according to Preferred Embodiment 4 of the present invention.
Figure 16:
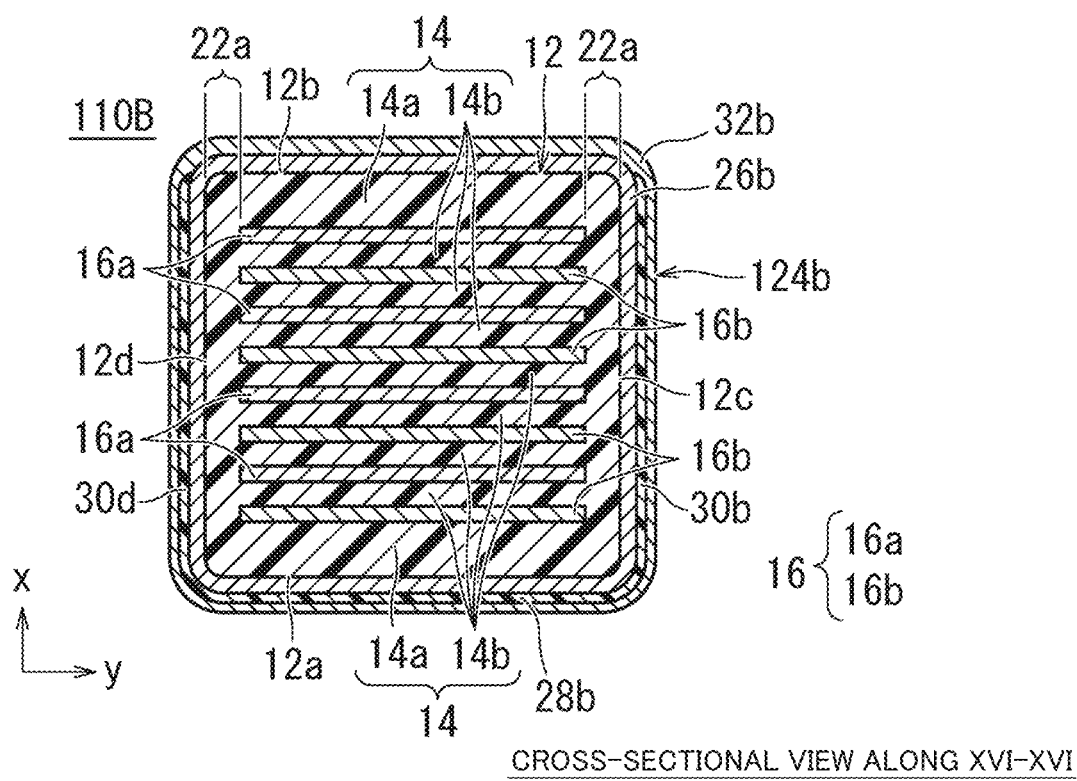
FIG. 16 is a cross-sectional view along the line XVI-XVI in FIG. 14 showing the multilayer ceramic capacitor according to Preferred Embodiment 4 of the present invention.

A multilayer ceramic capacitor according to Preferred Embodiment 4 of the present invention will be described. FIG. 14 is a cross-sectional view showing an exemplary multilayer ceramic capacitor according to Preferred Embodiment 4 of the present invention. FIG. 15 is a cross-sectional view along the line XV-XV in FIG. 14 showing the multilayer ceramic capacitor according to Preferred Embodiment 4 of the present invention and FIG. 16 is a cross-sectional view along the line XVI-XVI in FIG. 14 showing the multilayer ceramic capacitor according to Preferred Embodiment 4 of the present invention. A multilayer ceramic capacitor 110B according to the present preferred embodiment is similar in construction to multilayer ceramic capacitor 110A described with reference to FIG. 9 except for side-surface-side resin layer 30 in the external electrode, that is, side-surface-side resin layer 30 not only being on the side of first side surface 12c but also on the side of second side surface 12d. Therefore, elements the same as or similar to those in multilayer ceramic capacitor 110A shown in FIG. 9 are denoted by the same reference characteristics and description thereof will not be provided.

Multilayer ceramic capacitor 110B includes main-surface-side resin layer 28 and side-surface-side resin layer 30.

Main-surface-side resin layer 28 includes first main-surface-side resin layer 28a and second main-surface-side resin layer 28b.

First main-surface-side resin layer 28a covers the entire or substantially the entire end of first underlying electrode layer 26a located on first main surface 12a.

Second main-surface-side resin layer 28b covers the entire or substantially the entire end of second underlying electrode layer 26b located on first main surface 12a.

Side-surface-side resin layer 30 includes first side-surface-side resin layer 30a, second side-surface-side resin layer 30b, a third side-surface-side resin layer 30c, and a fourth side-surface-side resin layer 30d.

First side-surface-side resin layer 30a covers the entire or substantially the entire end of first underlying electrode layer 26a located on first side surface 12c continuously from one end of first main-surface-side resin layer 28a.

Second side-surface-side resin layer 30b covers the entire or substantially the entire end of second underlying electrode layer 26b located on first side surface 12c continuously from one end of second main-surface-side resin layer 28b.

Third side-surface-side resin layer 30c covers the entire or substantially the entire end of first underlying electrode layer 26a located on second side surface 12d continuously from the other end of first main-surface-side resin layer 28a.

Fourth side-surface-side resin layer 30d covers the entire or substantially the entire end of second underlying electrode layer 26b located on second side surface 12d continuously from the other end of second main-surface-side resin layer 28b.

Multilayer ceramic capacitor 110B shown in FIG. 14 achieves advantageous effects the same as or similar to those achieved by multilayer ceramic capacitor 110 shown in FIG. 9 and achieves an advantageous effect described below.

Specifically, by providing side-surface-side resin layer 30 also on the side of second side surface 12d, a length in length direction z of plated layer 32 provided on first side surface 12c and second side surface 12d can be longer. Thus, in reflow mounting of multilayer ceramic capacitor 110B on a mount substrate, solder can be provided over a wide area of external electrode 124 and thus multilayer ceramic capacitor 110B can be mounted on the mount substrate in a more stable manner.

Figure 17:
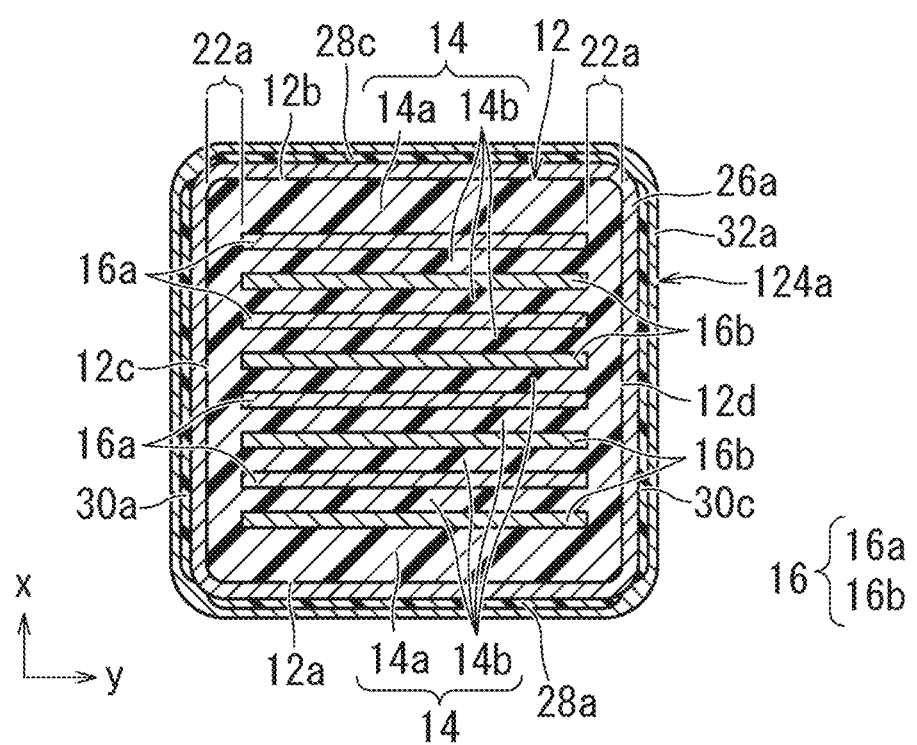
FIG. 17 is a cross-sectional view showing a multilayer ceramic capacitor according to Preferred Embodiment 5 of the present invention.

A multilayer ceramic capacitor according to Preferred Embodiment 5 of the present invention will further be described. FIG. 17 is a cross-sectional view showing the multilayer ceramic capacitor according to Preferred Embodiment 5 of the present invention. The multilayer ceramic capacitor according to the present preferred embodiment is similar in construction to multilayer ceramic capacitor 110A described with reference to FIG. 9, except for main-surface-side resin layer 28 and side-surface-side resin layer 30 in the external electrode, that is, main-surface-side resin layer 28 not only being on the side of first main surface 12a but also on the side of second main surface 12b and side-surface-side resin layer 30 not only being on the side of first side surface 12c but also on the side of second side surface 12d. Therefore, elements the same as or similar to those in multilayer ceramic capacitor 110A shown in FIG. 9 are denoted by the same reference characteristics and description thereof will not be provided.

The multilayer ceramic capacitor shown in FIG. 17 includes main-surface-side resin layer 28 and side-surface-side resin layer 30. As shown in FIG. 17, on the side of first external electrode 124a, first main-surface-side resin layer 28a of main-surface-side resin layer 28 is provided on the side of first main surface 12a and a third main-surface-side resin layer 28c of main-surface-side resin layer 28 is provided on the side of second main surface 12b. First side-surface-side resin layer 30a of side-surface-side resin layer 30 is provided on the side of first side surface 12c and third side-surface-side resin layer 30c of side-surface-side resin layer 30 is provided on the side of second side surface 12d. In this case, first main-surface-side resin layer 28a, first side-surface-side resin layer 30a, third main-surface-side resin layer 28c, and third side-surface-side resin layer 30c are provided independently of one another and are not continuously provided. Since the construction is also similar on the side of the second external electrode, description thereof will not be provided.

The multilayer ceramic capacitor shown in FIG. 17 achieves advantageous effects similar to those achieved by multilayer ceramic capacitor 110B shown in FIGS. 14 to 16 and achieves an advantageous effect described below.

Specifically, main-surface-side resin layer 28 is provided not only on the side of first main surface 12a but also on the side of second main surface 12b and side-surface-side resin layer 30 is provided also on the side of first side surface 12c and the side of second side surface 12d. Therefore, the multilayer ceramic capacitor can be mounted on a mount substrate with any surface of first main surface 12a and second main surface 12b and first side surface 12c and second side surface 12d defining and functioning as the mount surface.

A multilayer ceramic capacitor (a three-terminal multilayer ceramic capacitor) according to a preferred embodiment of the present invention will be described.

Figure 18:
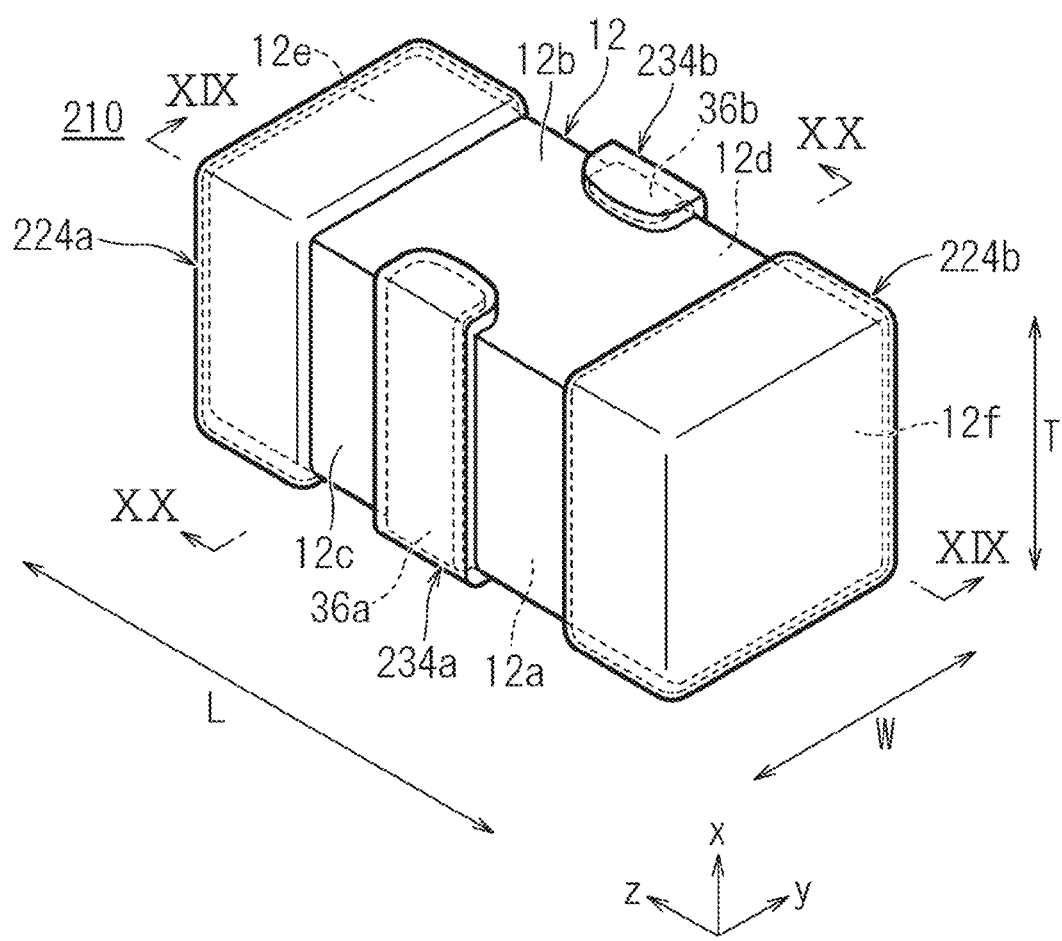
FIG. 18 is a perspective view of a multilayer ceramic capacitor according to Preferred Embodiment 6 of the present invention.
Figure 19:
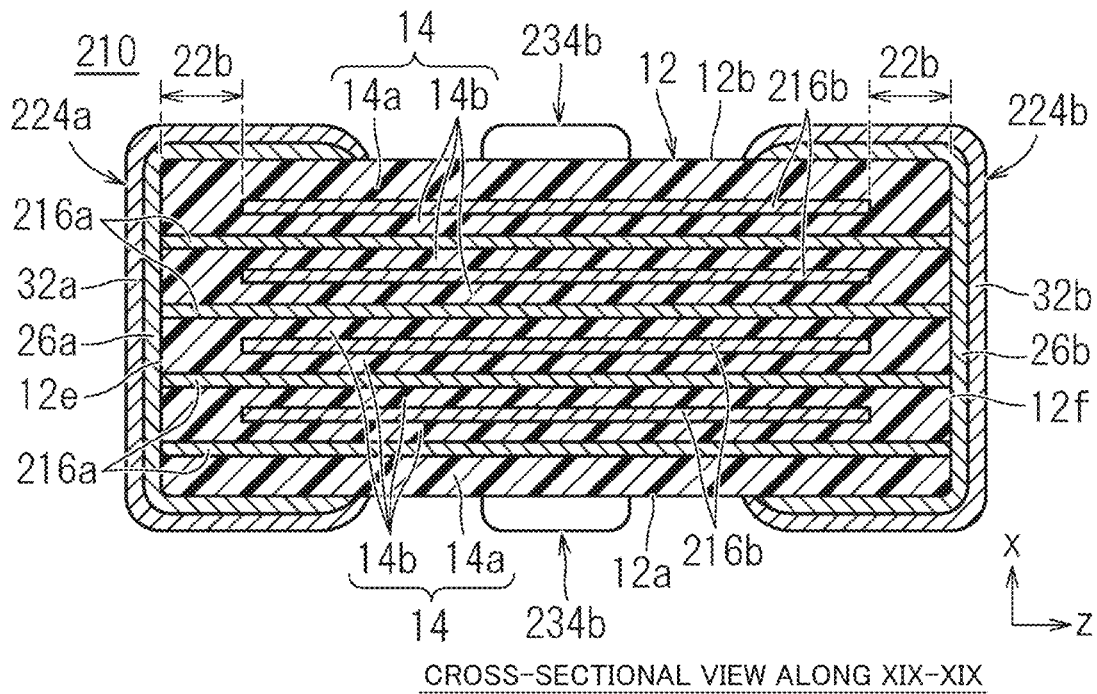
FIG. 19 is a cross-sectional view along the line XIX-XIX in FIG. 18.
Figure 20:
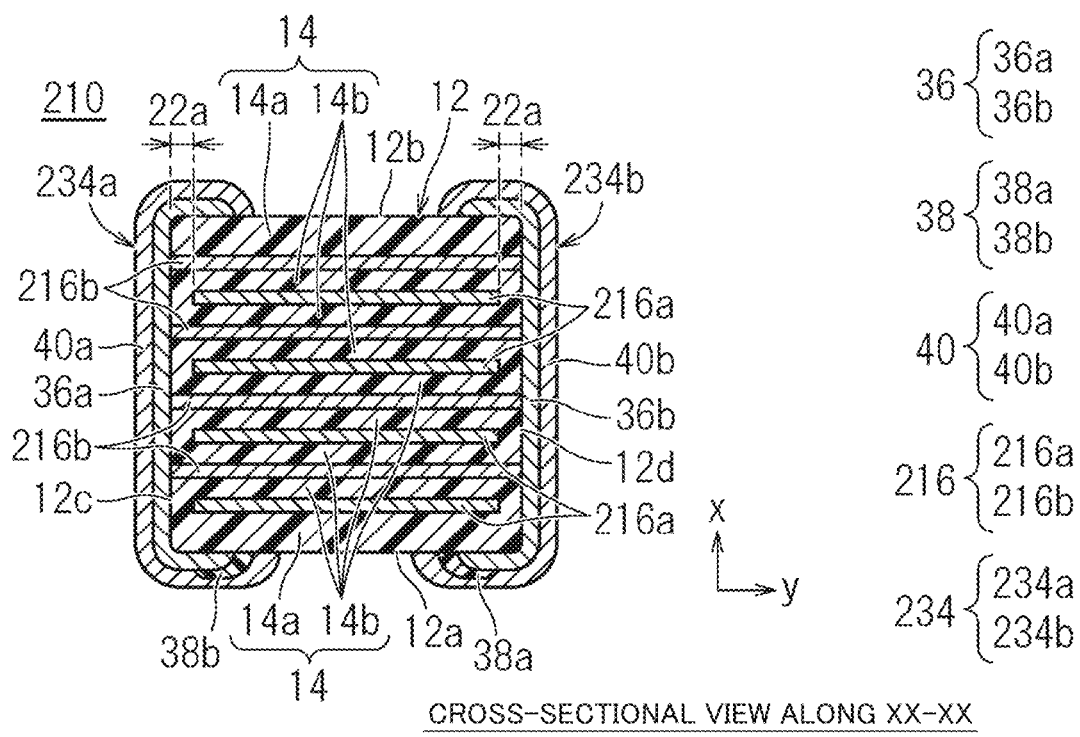
FIG. 20 is a cross-sectional view along the line XX-XX in FIG. 18.
Figure 21A:
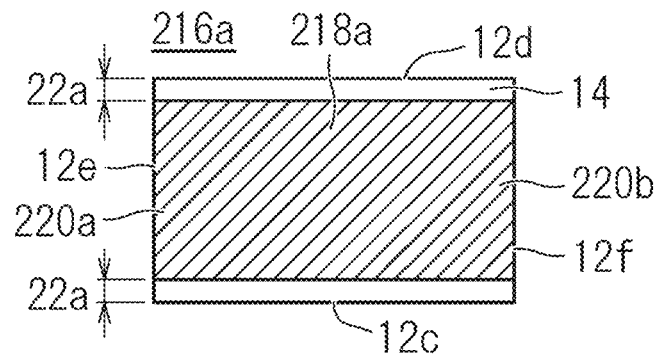
FIG. 21A is a diagram showing a first internal electrode layer included in the multilayer ceramic capacitor in FIG. 18

A multilayer ceramic capacitor according to Preferred Embodiment 6 of the present invention will initially be described. FIG. 18 is a perspective view of the multilayer ceramic capacitor according to Preferred Embodiment 6 of the present invention. FIG. 19 is a cross-sectional view along the line XIX-XIX in FIG. 18 and FIG. 20 is a cross-sectional view along the line XX-XX in FIG. 18. FIG. 21A is a diagram showing a first internal electrode layer included in the multilayer ceramic capacitor in FIG. 18 and FIG. 21B a diagram showing a second internal electrode layer. FIG. 22 is a plan view showing the side of the first main surface of the multilayer ceramic capacitor according to Preferred Embodiment 6 of the present invention.

As shown in FIGS. 18 to 20, a multilayer ceramic capacitor 210 includes multilayer body 12, for example, having a parallelepiped or substantially parallelepiped shape.

Multilayer body 12 includes a plurality of layered dielectric layers 14 and a plurality of internal electrode layers 216. Multilayer body 12 includes first main surface 12a and second main surface 12b opposed to each other in height direction x, first side surface 12c and second side surface 12d opposed to each other in width direction y orthogonal or substantially orthogonal to height direction x, and first end surface 12e and second end surface 12f opposed to each other in length direction z orthogonal or substantially orthogonal to height direction x and width direction y. Multilayer body 12 includes a corner and a ridgeline that are rounded. The corner refers to a portion where three adjacent surfaces of the multilayer body meet one another and the ridgeline refers to a portion where two adjacent surfaces of the multilayer body meet each other. Projections and recesses or the like may be provided in a portion or the entirety of first main surface 12a and second main surface 12b, first side surface 12c and second side surface 12d, and first end surface 12e and second end surface 12f.

Multilayer body 12 includes outer layer portion 14a including a plurality of dielectric layers 14 and inner layer portion 14b including a single dielectric layer 14 or a plurality of dielectric layers 14 and a plurality of internal electrode layers 216 provided thereon. Outer layer portion 14a is located on each of the side of first main surface 12a and on the side of second main surface 12b of multilayer body 12, and is defined by dielectric layer 14 located between first main surface 12a and internal electrode layer 216 closest to first main surface 12a and from dielectric layer 14 located between second main surface 12b and internal electrode layer 216 closest to second main surface 12b. A region between outer layer portions 14a is inner layer portion 14b.

Since a dielectric material for dielectric layer 14 is in common to that in multilayer ceramic capacitor 10 according to Preferred Embodiment 1, description thereof will not be provided.

As shown in FIGS. 19 and 20, multilayer body 12 includes a plurality of first internal electrode layers 216a and a plurality of second internal electrode layers 216b. The plurality of first internal electrode layers 216a and the plurality of second internal electrode layers 216b are embedded alternately along height direction x of multilayer body 12 at regular intervals with dielectric layer 14 therebetween.

As shown in FIG. 21A, first internal electrode layer 216a includes a first opposing electrode portion 218a opposed to second internal electrode layer 216b, a first drawn electrode portion 220a extending from first opposing electrode portion 218a to first end surface 12e of multilayer body 12, and a second drawn electrode portion 220b extending from first opposing electrode portion 218a to second end surface 12f of multilayer body 12. Specifically, first drawn electrode portion 220a is exposed at first end surface 12e of multilayer body 12 and second drawn electrode portion 220b is exposed at second end surface 12f of multilayer body 12. Therefore, first internal electrode layer 216a is not exposed at first side surface 12c and second side surface 12d of multilayer body 12. First drawn electrode portion 220a and second drawn electrode portion 220b of first internal electrode layer 216a are equal or substantially equal in size in width direction y to first opposing electrode portion 218a of first internal electrode layer 216a. First drawn electrode portion 220a and second drawn electrode portion 220b of first internal electrode layer 216a are preferably smaller in size in width direction y than first opposing electrode portion 218a of first internal electrode layer 216a. In this case, an area of contact between dielectric layers 14 relatively increases, and thus an occurrence of separation (delamination) between dielectric layers 14 can be reduced or prevented.

Figure 21B:
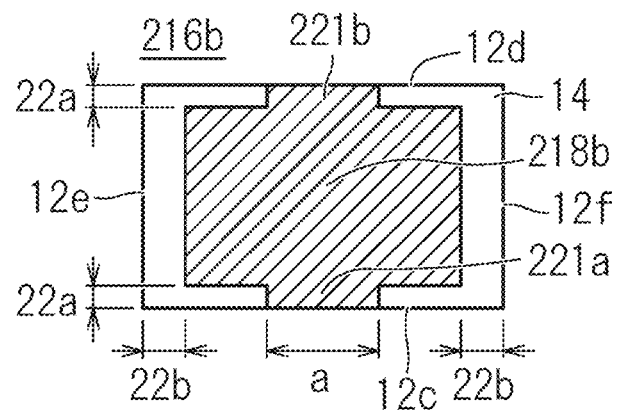
FIG. 21B is a diagram showing a second internal electrode layer.
Figure 22:
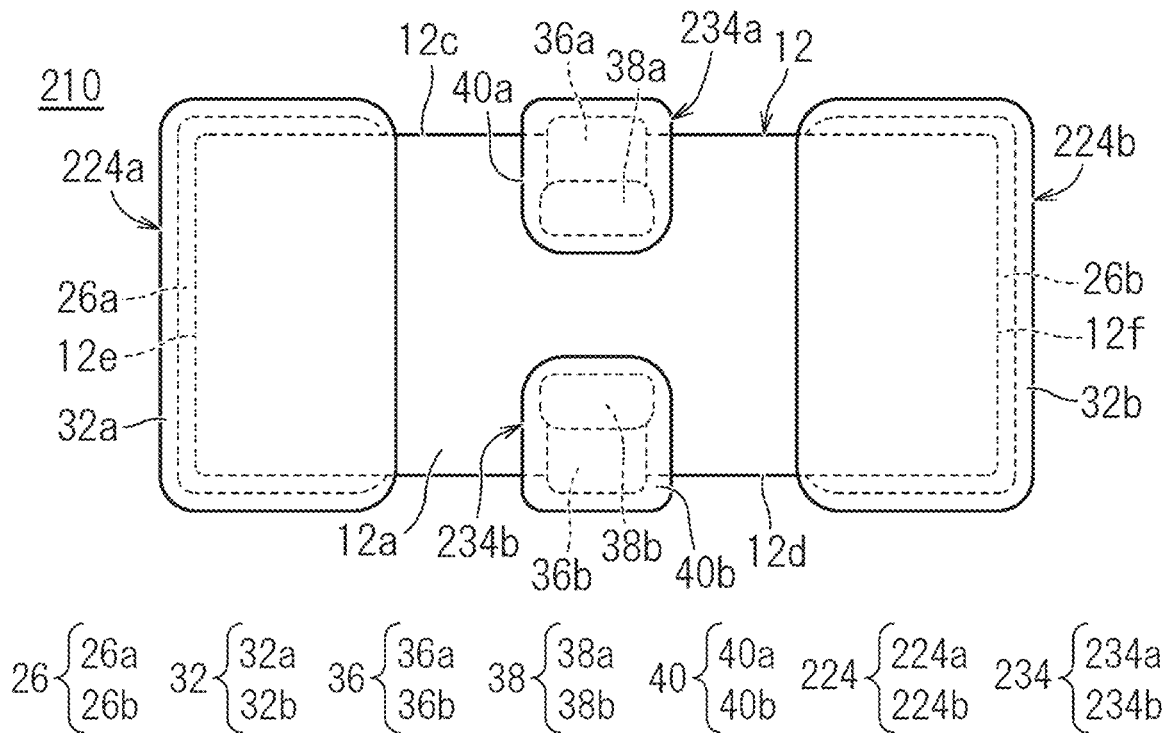
FIG. 22 is a plan view showing the side of the first main surface of the multilayer ceramic capacitor according to Preferred Embodiment 6 of the present invention.

As shown in FIG. 21B, second internal electrode layer 216b includes a second opposing electrode portion 218b having a cross or substantially cross shape opposed to first internal electrode layer 216a, a third drawn electrode portion 221a extending from second opposing electrode portion 218b to first side surface 12c of multilayer body 12, and a fourth drawn electrode portion 221b extending from second opposing electrode portion 216b to second side surface 12d of multilayer body 12. Specifically, third drawn electrode portion 221a is exposed at first side surface 12c of multilayer body 12 and fourth drawn electrode portion 221b is exposed at second side surface 12d of multilayer body 12. Therefore, second internal electrode layer 216b is not exposed at first end surface 12e and second end surface 12f of multilayer body 12. Third drawn electrode portion 221a and fourth drawn electrode portion 221b of second internal electrode layer 216b are preferably smaller in size in length direction z than second opposing electrode portion 218b of second internal electrode layer 216b. In this case, an area of contact between dielectric layers 14 relatively increases, and hence occurrence of separation (delamination) between dielectric layers 14 can be reduced or prevented.

Multilayer body 12 includes side portion (which is referred to as the "W gap" below) 22a of multilayer body 12 that is provided between one end in width direction y of first opposing electrode portion 218a of first internal electrode layer 216a and first side surface 12c and between the other end in width direction y of first opposing electrode portion 218a and second side surface 12d and side portion 22a of multilayer body 12 provided between one end in width direction y of second opposing electrode portion 218b of second internal electrode layer 216b and first side surface 12c and between the other end in width direction y of second opposing electrode portion 218b and second side surface 12d. Multilayer body 12 further includes end (which is referred to as the "L gap" below) 22b of multilayer body 12 that is provided between one end in length direction z of second internal electrode layer 216b and first end surface 12e and between the other end in length direction z of second internal electrode layer 216b and second end surface 12f.

A capacitance is provided since first opposing electrode portion 218a of first internal electrode layer 216a of multilayer body 12 is opposed to second opposing electrode portion 218b of second internal electrode layer 216b with dielectric layer 14 made of a dielectric ceramic material being interposed therebetween. Multilayer ceramic capacitor 210 thus defines and functions as a capacitor.

First internal electrode layer 216a and second internal electrode layer 216b are in parallel or substantially in parallel to first main surface 12a and second main surface 12b of multilayer body 12.

Since a material for first internal electrode layer 216a and second internal electrode layer 216b is in common to that for internal electrode layer 16 according to Preferred Embodiment 1, description thereof will not be provided.

An external electrode 224 is provided on the side of first end surface 12e and the side of second end surface 12f of multilayer body 12. External electrode 224 includes a first external electrode 224a and a second external electrode 224b.

First external electrode 224a is provided on first end surface 12e of multilayer body 12 and extends from first end surface 12e to cover a portion of each of first main surface 12a, second main surface 12b, first side surface 12c, and second side surface 12d. In this case, first external electrode 224a is electrically connected to first drawn electrode portion 220a of first internal electrode layer 216a exposed at first end surface 12e.

Second external electrode 224b is provided on second end surface 12f of multilayer body 12 and extends from second end surface 12f to cover a portion of each of first main surface 12a, second main surface 12b, first side surface 12c, and second side surface 12d. In this case, second external electrode 224b is electrically connected to second drawn electrode portion 220b of first internal electrode layer 216b exposed at second end surface 12f.

Furthermore, a third external electrode 234 is provided on first side surface 12c and second side surface 12d of multilayer body 12. Third external electrode 234 includes one third external electrode 234a and the other third external electrode 234b.

One third external electrode 234a is provided on first side surface 12c of multilayer body 12 extends from first side surface 12c to cover a portion of each of first main surface 12a and second main surface 12b. In this case, one third external electrode 234a is electrically connected to third drawn electrode portion 221a of second internal electrode layer 216b exposed at first side surface 12c.

The other third external electrode 234b is provided on second side surface 12d of multilayer body 12 and extends from second side surface 12d to cover a portion of each of first main surface 12a and second main surface 12b. In this case, the other third external electrode 234b is electrically connected to fourth drawn electrode portion 221b of second internal electrode layer 216b exposed at second side surface 12d.

First external electrode 224a and second external electrode 224b each include underlying electrode layer 26 and plated layer 32.

One third external electrode 234a and the other third external electrode 234b each include an underlying electrode layer 36, a main-surface-side resin layer 38, and a plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes a third underlying electrode layer 36a and a fourth underlying electrode layer 36b.

Third underlying electrode layer 36a is provided on first side surface 12c of multilayer body 12 and extends from first side surface 12c to cover a portion of each of first main surface 12a and second main surface 12b.

Fourth underlying electrode layer 36b is provided on second side surface 12d of multilayer body 12 and extends from second side surface 12d to cover a portion of each of first main surface 12a and second main surface 12b.

Since a material for underlying electrode layers 26 and 36 is in common to that for underlying electrode layer 26 of multilayer ceramic capacitor 10 according to Preferred Embodiment 1, description thereof will not be provided.

As shown in FIG. 22, main-surface-side resin layer 38 includes a first main-surface-side resin layer 38a and a second main-surface-side resin layer 38b.

First main-surface-side resin layer 38a covers an end of third underlying electrode layer 36a located on first main surface 12a.

Second main-surface-side resin layer 38b covers an end of fourth underlying electrode layer 36b located on first main surface 12a.

Since a material for main-surface-side resin layer 38 is in common to that for main-surface-side resin layer 28 of multilayer ceramic capacitor 10 according to Preferred Embodiment 1, description thereof will not be provided.

Plated layer 32 includes first plated layer 32a and second plated layer 32b.

First plated layer 32a covers first underlying electrode layer 26a. Specifically, first plated layer 32a is preferably provided on the surface of first underlying electrode layer 26a located on first end surface 12e and also extends to the surfaces of first underlying electrode layer 26a located on first main surface 12a and first underlying electrode layer 26a located on second main surface 12b, first side surface 12c, and second side surface 12d.

Second plated layer 32b covers second underlying electrode layer 26b. Specifically, second plated layer 32b is preferably provided on the surface of second underlying electrode layer 26b located on second end surface 12f and also extends to the surfaces of second underlying electrode layer 26b located on first main surface 12a and second underlying electrode layer 26b located on second main surface 12b, first side surface 12c, and second side surface 12d.

Plated layer 40 includes a third plated layer 40a and a fourth plated layer 40b.

Third plated layer 40a covers third underlying electrode layer 36a and first main-surface-side resin layer 38a. Specifically, third plated layer 40a is provided on the surface of third underlying electrode layer 36a located on first side surface 12c and also extends to the surfaces of third underlying electrode layer 36a and first main-surface-side resin layer 38a located on first main surface 12a and third underlying electrode layer 36a located on second main surface 12b.

Fourth plated layer 40b covers fourth underlying electrode layer 36b and second main-surface-side resin layer 38b. Specifically, fourth plated layer 40b is provided on the surface of fourth underlying electrode layer 36b located on second side surface 12d and also extends to the surfaces of fourth underlying electrode layer 36b and second main-surface-side resin layer 38b located on first main surface 12a and fourth underlying electrode layer 36b located on second main surface 12b.

Since a material for plated layers 32 and 40 is in common to that for plated layer 32 of multilayer ceramic capacitor 10 according to Preferred Embodiment 1, description thereof will not be provided.

In multilayer ceramic capacitor 210 shown in FIG. 18, first main-surface-side resin layer 38a covers the end of third underlying electrode layer 36a located on first main surface 12a and second main-surface-side resin layer 38b covers the end of fourth underlying electrode layer 36b located on first main surface 12a. Therefore, mechanical strength of multilayer ceramic capacitor 210 can be improved. Therefore, when a shock due to drop or bending stress in a mount substrate occurs, that stress can reliably be absorbed and thus generation of a crack in the multilayer body can be reduced or prevented.

Figure 23:
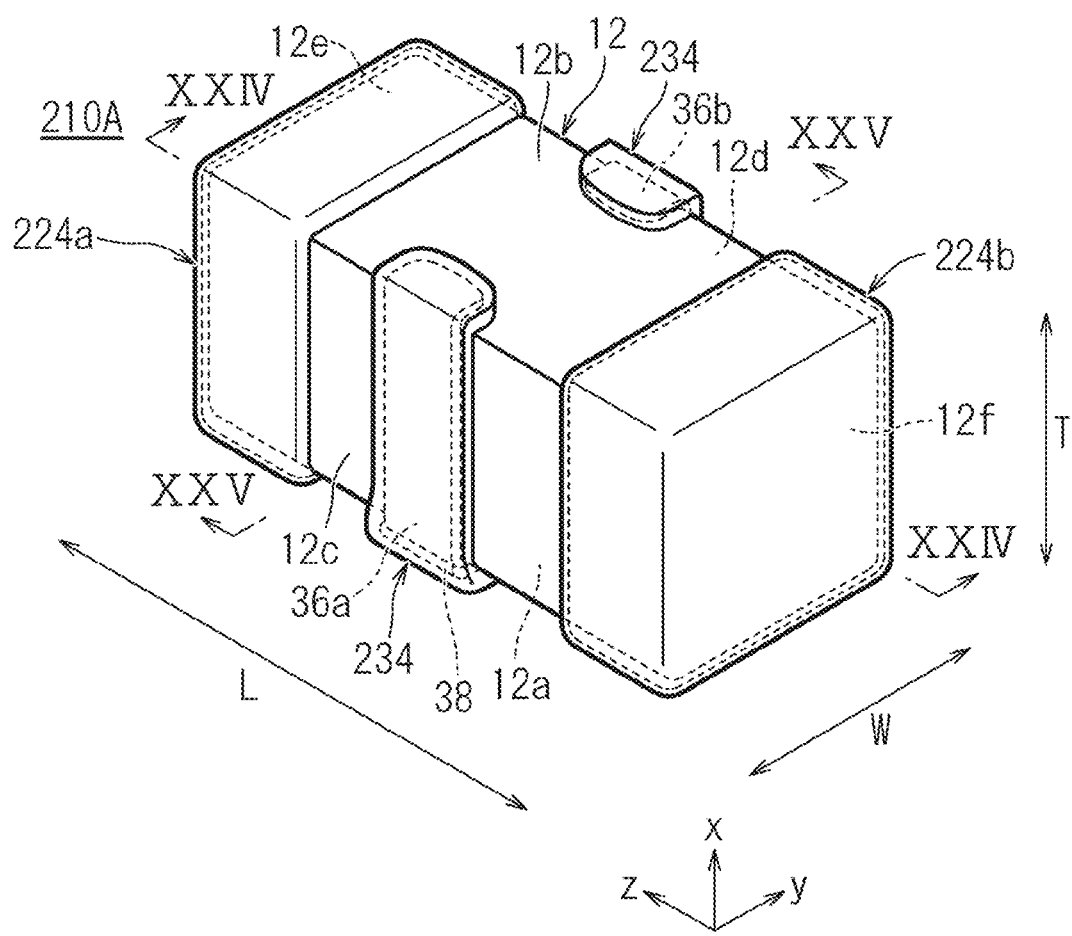
FIG. 23 is a perspective view of a multilayer ceramic capacitor according to Preferred Embodiment 7 of the present invention.
Figure 24:
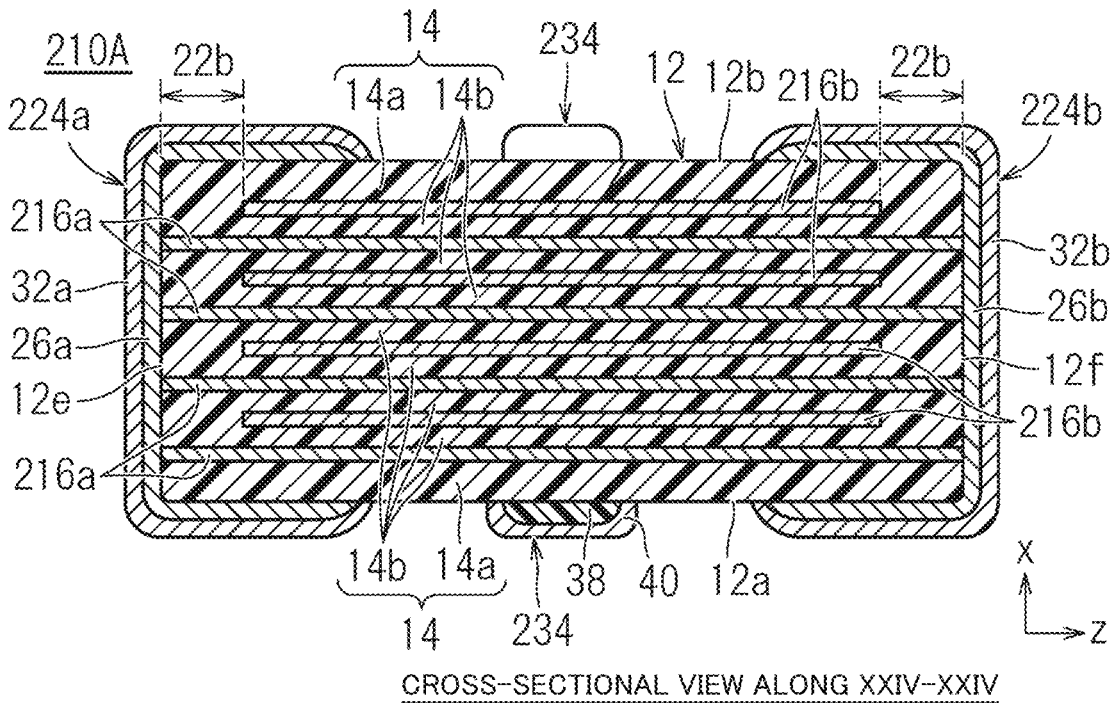
FIG. 24 is a cross-sectional view along the line XXIV-XXIV in FIG. 23.
Figure 25:
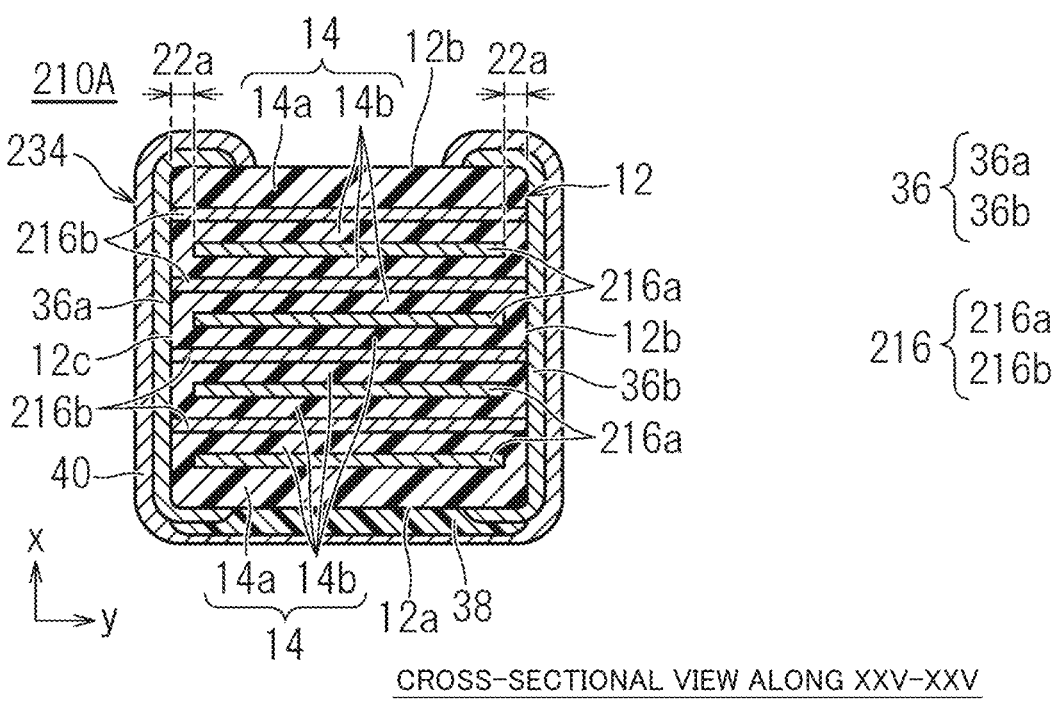
FIG. 25 is a cross-sectional view along the line XXV-XXV in FIG. 23.
Figure 26:
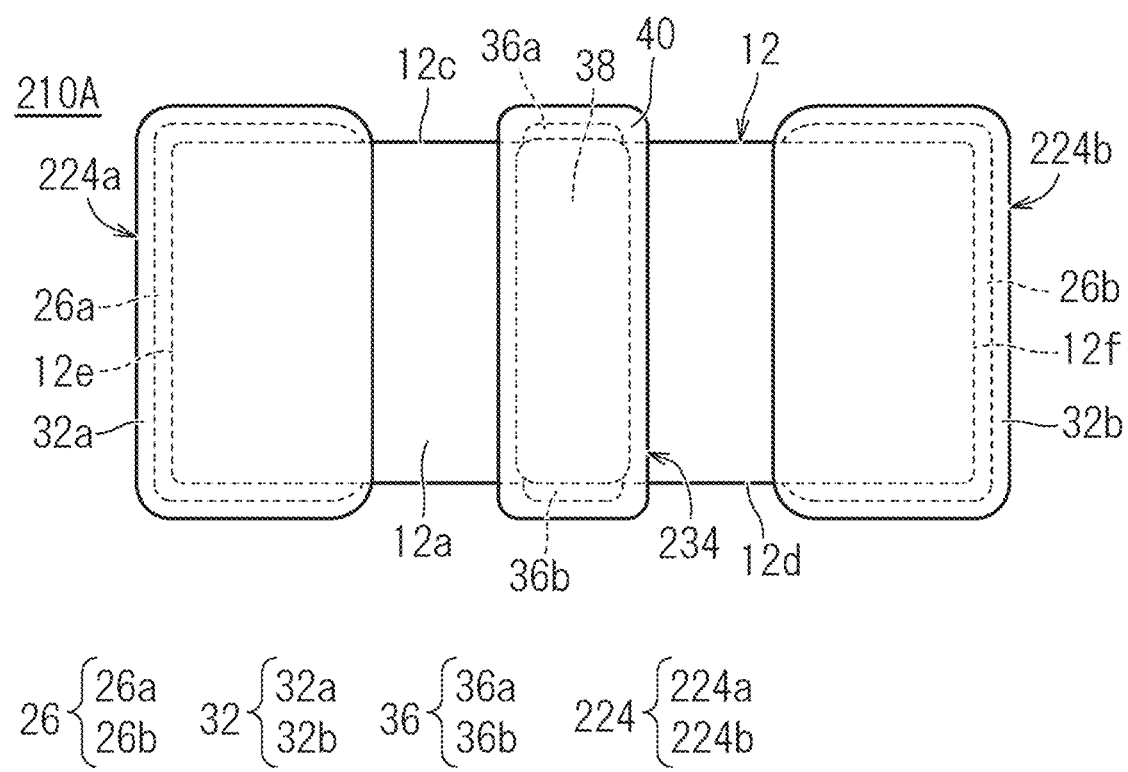
FIG. 26 is a plan view showing the side of the first main surface of the multilayer ceramic capacitor according to Preferred Embodiment 7 of the present invention.

A multilayer ceramic capacitor according to Preferred Embodiment 7 of the present invention will now be described. FIG. 23 is a perspective view of the multilayer ceramic capacitor according to Preferred Embodiment 7 of the present invention. FIG. 24 is a cross-sectional view along the line XXIV-XXIV in FIG. 23 and FIG. 25 is a cross-sectional view along the line XXV-XXV in FIG. 23. FIG. 26 is a plan view showing the side of the first main surface of the multilayer ceramic capacitor according to Preferred Embodiment 7 of the present invention. A multilayer ceramic capacitor 210A according to the present preferred embodiment is similar in construction to multilayer ceramic capacitor 210 described with reference to FIG. 18 except for a difference in the main-surface-side resin layer in the third external electrode. Therefore, elements the same as or similar to those in multilayer ceramic capacitor 210 shown in FIG. 18 are denoted by the same reference characteristics and description thereof will not partially be provided.

Multilayer ceramic capacitor 210A includes multilayer body 12.

External electrode 224 is provided on first end surface 12e and second end surface 12f of multilayer body 12. External electrode 224 includes first external electrode 224a and second external electrode 224b.

Furthermore, third external electrode 234 is provided on first main surface 12a, on first side surface 12c, and on second side surface 12d of multilayer body 12.

More specifically, third external electrode 234 is provided on first main surface 12a of multilayer body 12, extends from first main surface 12a to first side surface 12c, extends from first side surface 12c to cover first side surface 12c and second side surface 12d, and further covers a portion of second main surface 12b. In this case, third external electrode 234 is electrically connected to third drawn electrode portion 221a of second internal electrode layer 216b exposed at first side surface 12c and fourth drawn electrode portion 221b of second internal electrode layer 216b exposed at second side surface 12d.

First external electrode 224a and second external electrode 224b each include underlying electrode layer 26 and plated layer 32.

Third external electrode 234 includes underlying electrode layer 36, main-surface-side resin layer 38, and plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes third underlying electrode layer 36a and fourth underlying electrode layer 36b.

Third underlying electrode layer 36a is provided on first side surface 12c of multilayer body 12 and extends from first side surface 12c to cover a portion of each of first main surface 12a and second main surface 12b.

Fourth underlying electrode layer 36b is provided on the surface of second side surface 12d of multilayer body 12 and extends from second side surface 12d to cover a portion of each of first main surface 12a and second main surface 12b.

As shown in FIG. 26, main-surface-side resin layer 38 is provided across the end of third underlying electrode layer 36a and the end of fourth underlying electrode layer 36b located on first main surface 12a as being continuous only over first main surface 12a.

Plated layer 32 includes first plated layer 32a and second plated layer 32b.

First plated layer 32a covers first underlying electrode layer 26a.

Second plated layer 32b covers second underlying electrode layer 26b.

Plated layer 40 is covers third underlying electrode layer 36a, fourth underlying electrode layer 36b, and main-surface-side resin layer 38. Specifically, plated layer 40 is provided on the surface of main-surface-side resin layer 38 located on first main surface 12a, further extends to the surface of third underlying electrode layer 36a located on first side surface 12c from first main surface 12a, also extends to the surface of third underlying electrode layer 36a located on second main surface 12b, extends to the surface of fourth underlying electrode layer 36b located on second side surface 12d from first main surface 12a, and also extends to the surface of third underlying electrode layer 36a located on second main surface 12b.

Multilayer ceramic capacitor 210A shown in FIG. 23 achieves advantageous effects similar to those achieved by multilayer ceramic capacitor 210 shown in FIG. 18.

Figure 27:
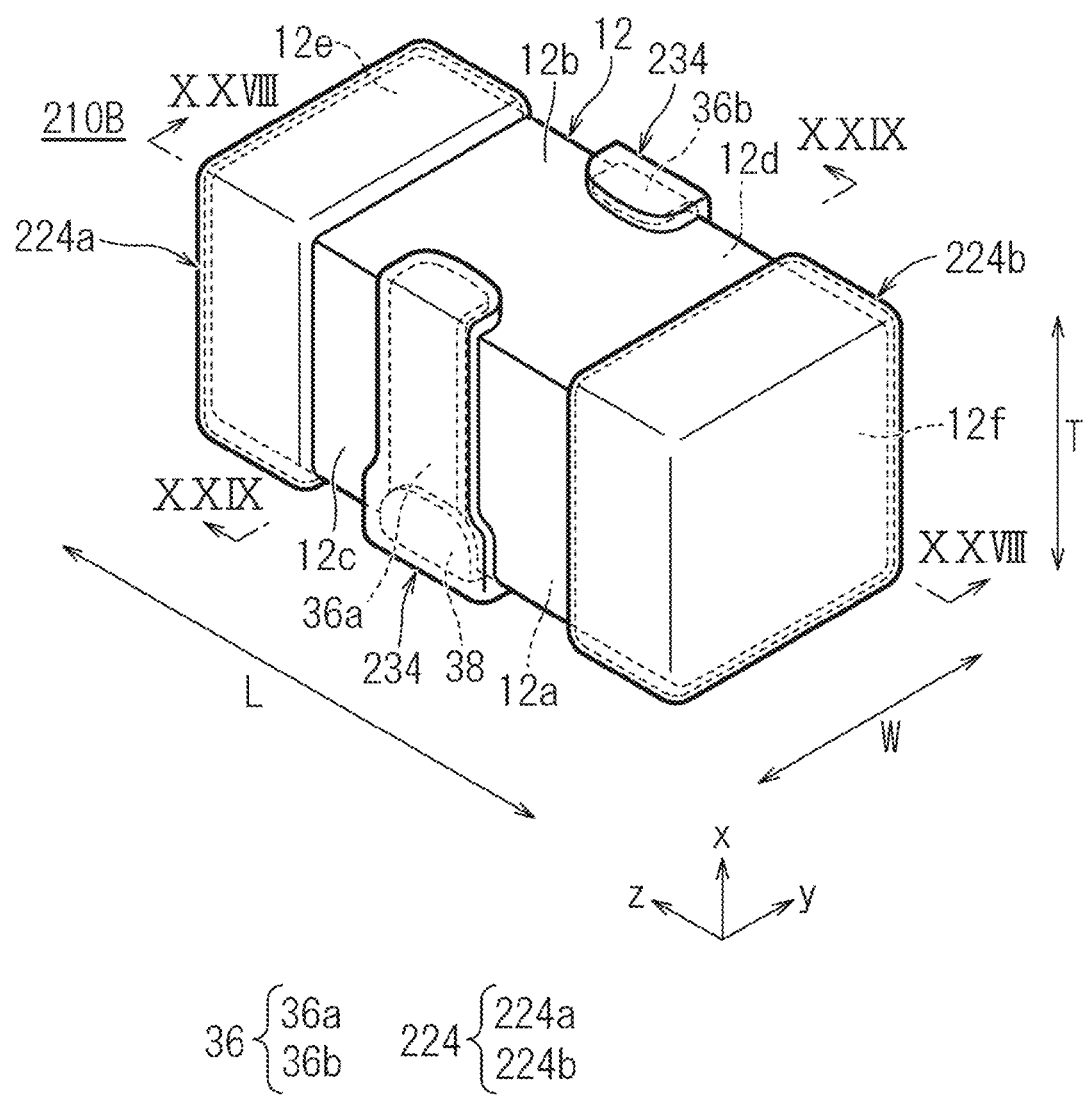
FIG. 27 is a perspective view of a multilayer ceramic capacitor according to Preferred Embodiment 8 of the present invention.
Figure 28:
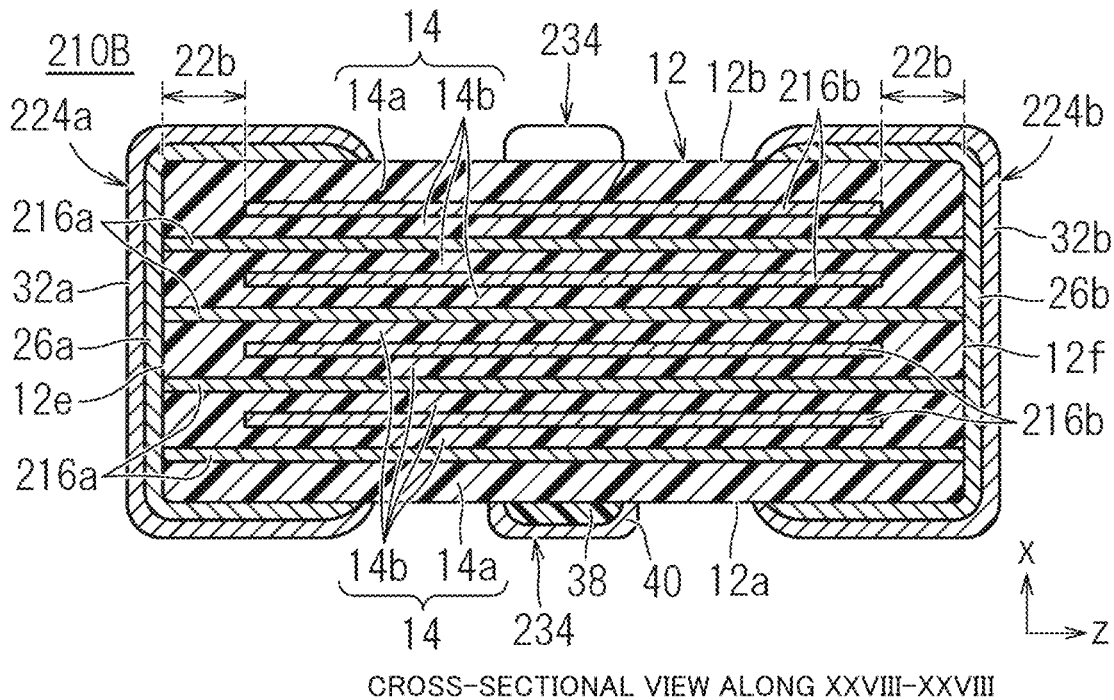
FIG. 28 is a cross-sectional view along the line XXVIII-XXVIII in FIG. 27.
Figure 29:
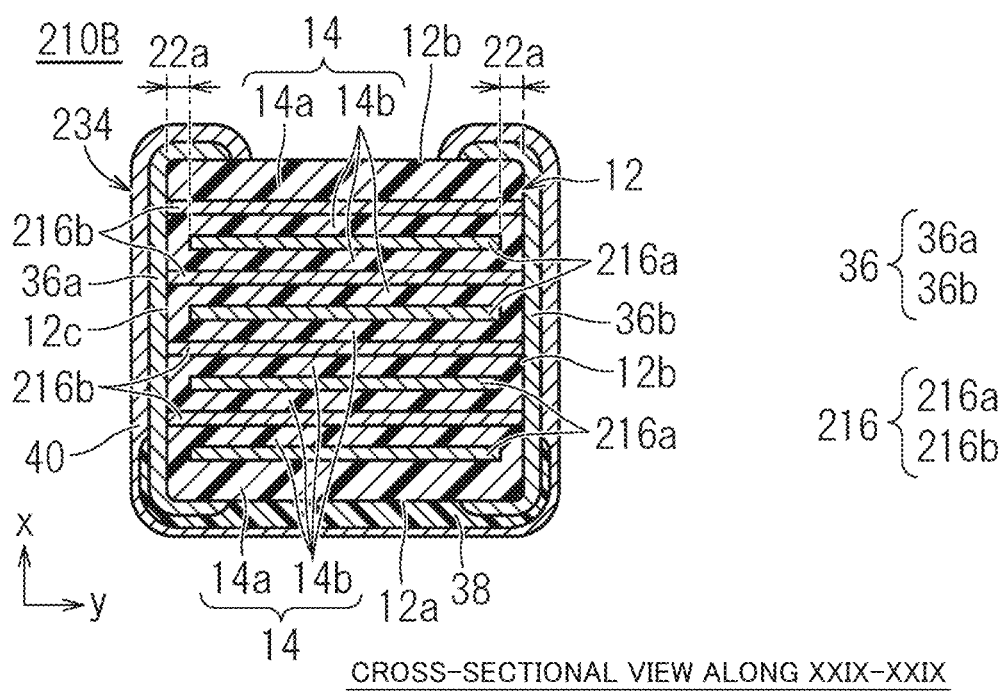
FIG. 29 is a cross-sectional view along the line XXIX-XXIX in FIG. 27.
Figure 30:
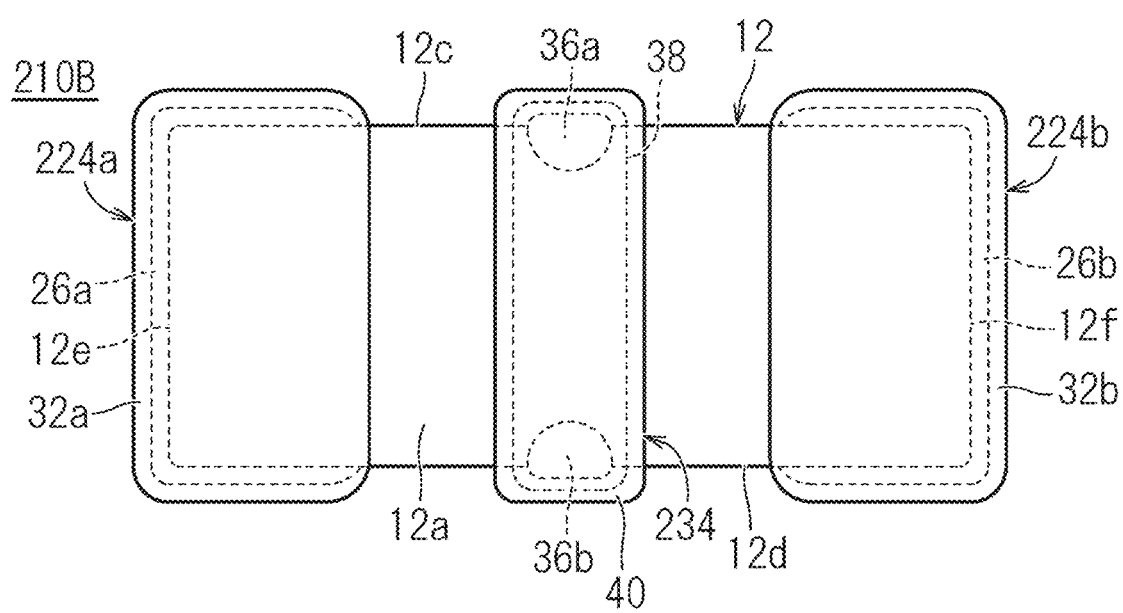
FIG. 30 is a plan view showing the side of the first main surface of the multilayer ceramic capacitor according to Preferred Embodiment 8 of the present invention.

A multilayer ceramic capacitor according to Preferred Embodiment 8 of the present invention will now be described. FIG. 27 is a perspective view of the multilayer ceramic capacitor according to Preferred Embodiment 8 of the present invention. FIG. 28 is a cross-sectional view of an appearance along the line XXVIII-XXVIII in FIG. 27 and FIG. 29 is a cross-sectional view along the line XXIX-XXIX in FIG. 27. FIG. 30 is a plan view showing the side of the first main surface of the multilayer ceramic capacitor according to Preferred Embodiment 8 of the present invention. A multilayer ceramic capacitor 210B according to the present preferred embodiment is similar in construction to multilayer ceramic capacitor 210 described with reference to FIG. 18 except for a difference in the main-surface-side resin layer in the third external electrode. Therefore, elements the same as or similar to those in multilayer ceramic capacitor 210 shown in FIG. 18 are denoted by the same reference characteristics and description thereof will not partially be provided.

Multilayer ceramic capacitor 210B includes multilayer body 12.

External electrode 224 is provided on first end surface 12e and second end surface 12f of multilayer body 12. External electrode 224 includes first external electrode 224a and second external electrode 224b.

Furthermore, third external electrode 234 is provided on first main surface 12a, on first side surface 12c, and on second side surface 12d of multilayer body 12.

More specifically, third external electrode 234 is provided on first main surface 12a of multilayer body 12, extends from first main surface 12a to first side surface 12c, extends from first main surface 12a to cover first side surface 12c and second side surface 12d, and further covers a portion of second main surface 12b. In this case, third external electrode 234 is electrically connected to third drawn electrode portion 221a of second internal electrode layer 216b exposed at first side surface 12c and fourth drawn electrode portion 221b of second internal electrode layer 216b exposed at second side surface 12d.

First external electrode 224a and second external electrode 224b each include underlying electrode layer 26 and plated layer 32.

Third external electrode 234 includes underlying electrode layer 36, main-surface-side resin layer 38, and plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes third underlying electrode layer 36a and fourth underlying electrode layer 36b.

Third underlying electrode layer 36a is provided on first side surface 12c of multilayer body 12 and extends from first side surface 12c to cover a portion of each of first main surface 12a and second main surface 12b.

Fourth underlying electrode layer 36b is provided on second side surface 12d of multilayer body 12 and extends from second side surface 12d to cover a portion of each of first main surface 12a and second main surface 12b.

As shown in FIG. 30, main-surface-side resin layer 38 is provided across the end of third underlying electrode layer 36a and the end of fourth underlying electrode layer 36b located on first main surface 12a continuous over first main surface 12a. Main-surface-side resin layer 38 covers respective portions of third underlying electrode layer 36a and fourth underlying electrode layer 36b located on first side surface 12c and second side surface 12d.

Plated layer 32 includes first plated layer 32a and second plated layer 32b.

First plated layer 32a covers first underlying electrode layer 26a.

Second plated layer 32b covers second underlying electrode layer 26b.

Plated layer 40 covers third underlying electrode layer 36a, fourth underlying electrode layer 36b, and main-surface-side resin layer 38. Specifically, plated layer 40 is provided on the surface of main-surface-side resin layer 38 located on first main surface 12a, extends to the surfaces of third underlying electrode layer 36a and main-surface-side resin layer 38 located on first side surface 12c from first main surface 12a, extends to the surface of third underlying electrode layer 36a located on second main surface 12b, extends to the surfaces of fourth underlying electrode layer 36b and main-surface-side resin layer 38 located on second side surface 12d from first main surface 12a, and extends to the surface of third underlying electrode layer 36a located on second main surface 12b.

Multilayer ceramic capacitor 210B shown in FIG. 27 achieves advantageous effects similar to those achieved by multilayer ceramic capacitor 210 shown in FIG. 18.

Figure 31:
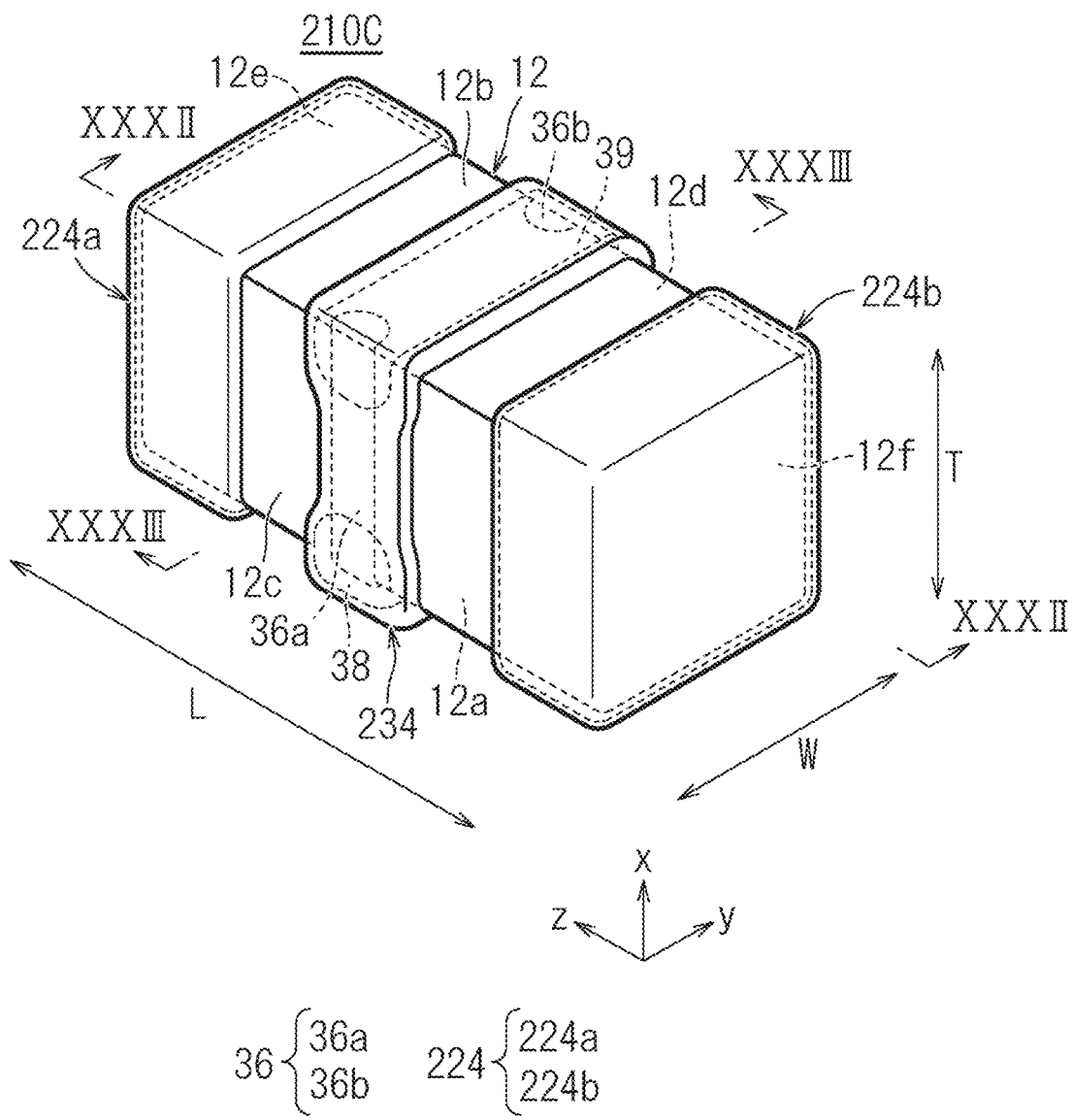
FIG. 31 is a perspective view of a multilayer ceramic capacitor according to Preferred Embodiment 9 of the present invention.
Figure 32:
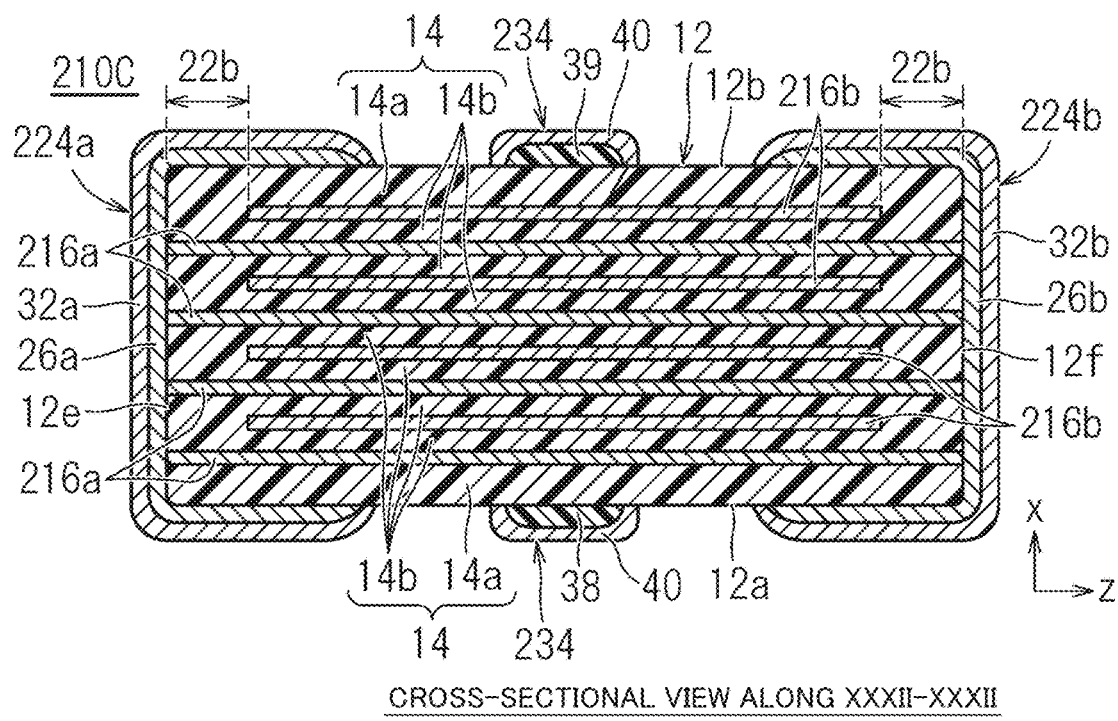
FIG. 32 is a cross-sectional view along the line XXXII-XXXII in FIG. 31.
Figure 33:
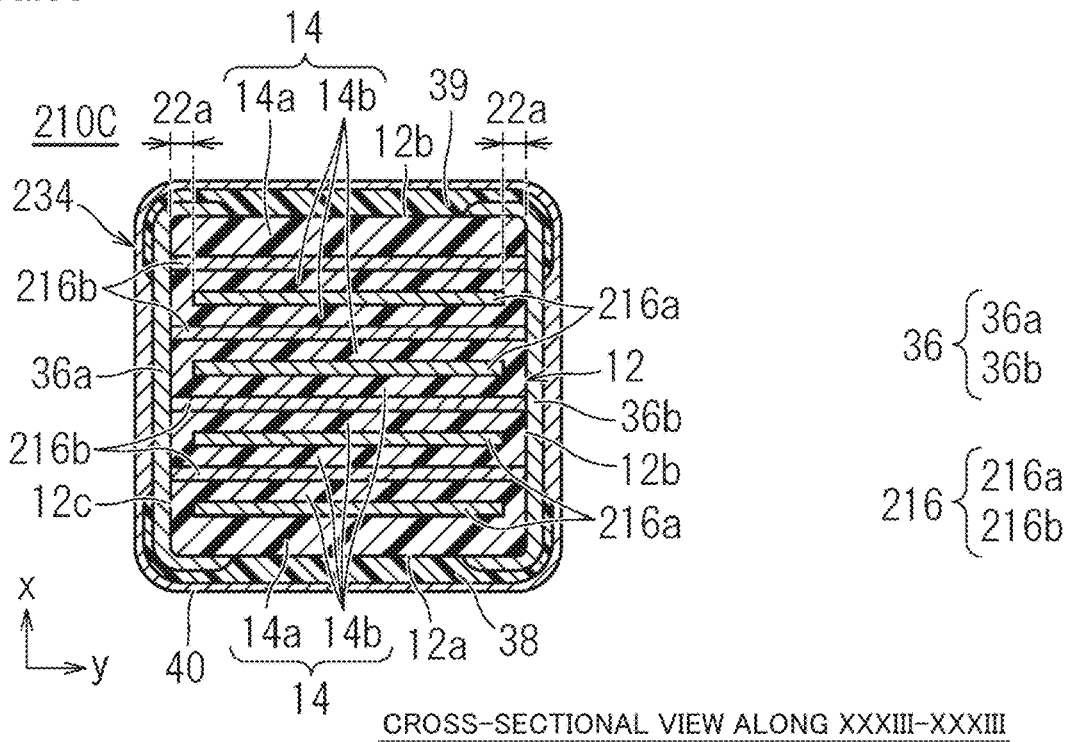
FIG. 33 is a cross-sectional view along the line XXXIII-XXXIII in FIG. 31.

A multilayer ceramic capacitor according to Preferred Embodiment 9 of the present invention will be described. FIG. 31 is a perspective view of the multilayer ceramic capacitor according to Preferred Embodiment 9 of the present invention. FIG. 32 is a cross-sectional view along the line XXXII-XXXII in FIG. 31 and FIG. 33 is a cross-sectional view along the line XXXIII-XXXIII in FIG. 31. A multilayer ceramic capacitor 210C according to the present preferred embodiment is similar in construction to multilayer ceramic capacitor 210 described with reference to FIG. 18 except for a difference in the main-surface-side resin layer in the third external electrode. Therefore, elements the same as or similar to those in multilayer ceramic capacitor 210 shown in FIG. 18 are denoted by the same reference characteristics and description thereof will not partially be provided.

Multilayer ceramic capacitor 210C includes multilayer body 12.

External electrode 224 is provided on first end surface 12e and second end surface 12f of multilayer body 12. External electrode 224 includes first external electrode 224a and second external electrode 224b.

Furthermore, third external electrode 234 is provided on first main surface 12a, on first side surface 12c, and on second side surface 12d of multilayer body 12.

More specifically, third external electrode 234 is provided on first main surface 12a of multilayer body 12, extends from first main surface 12a to first side surface 12c, extends from first main surface 12a to cover first side surface 12c and second side surface 12d, and covers second main surface 12b. In this case, third external electrode 234 is electrically connected to third drawn electrode portion 221a of second internal electrode layer 216b exposed at first side surface 12c and fourth drawn electrode portion 221b of second internal electrode layer 216b exposed at second side surface 12d.

First external electrode 224a and second external electrode 224b each include underlying electrode layer 26 and plated layer 32.

Third external electrode 234 includes underlying electrode layer 36, main-surface-side resin layer 38, and plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes third underlying electrode layer 36a and fourth underlying electrode layer 36b.

Third underlying electrode layer 36a is provided on first side surface 12c of multilayer body 12 and extends from first side surface 12c to cover a portion of each of first main surface 12a and second main surface 12b.

Fourth underlying electrode layer 36b is provided on second side surface 12d of multilayer body 12 and extends from second side surface 12d to cover a portion of each of first main surface 12a and second main surface 12b.

Main-surface-side resin layer 38 is provided across the end of third underlying electrode layer 36a and the end of fourth underlying electrode layer 36b located on first main surface 12a continuous over first main surface 12a. Main-surface-side resin layer 38 further covers respective portions of third underlying electrode layer 36a and fourth underlying electrode layer 36b located on first side surface 12c and second side surface 12d.

A main-surface-side resin layer 39 is provided across the end of third underlying electrode layer 36a and the end of fourth underlying electrode layer 36b located on second main surface 12b continuously over second main surface 12b. Main-surface-side resin layer 39 further covers respective portions of third underlying electrode layer 36a and fourth underlying electrode layer 36b located on first side surface 12c and second side surface 12d.

Plated layer 32 includes first plated layer 32a and second plated layer 32b.

First plated layer 32a covers first underlying electrode layer 26a.

Second plated layer 32b covers second underlying electrode layer 26b.

Plated layer 40 is covers third underlying electrode layer 36a, fourth underlying electrode layer 36b, main-surface-side resin layer 38, and main-surface-side resin layer 39. Specifically, plated layer 40 is provided on the surface of main-surface-side resin layer 38 located on first main surface 12a and on the surface of main-surface-side resin layer 39 located on the side of second main surface 12b. Furthermore, the plated layer is provided on the surfaces of third underlying electrode layer 36a located on first side surface 12c and main-surface-side resin layers 38 and 39 and provided on the surfaces of fourth underlying electrode layer 36b located on second side surface 12d and main-surface-side resin layers 38 and 39. Plated layer 40 is continuous over first main surface 12a, first side surface 12c, second main surface 12b, and second side surface 12d.

Multilayer ceramic capacitor 210C shown in FIG. 31 achieves advantageous effects similar to those achieved by multilayer ceramic capacitor 210 shown in FIG. 18 and achieves an effect below.

Specifically, not only main-surface-side resin layer 38 is provided on first main surface 12a but also main-surface-side resin layer 39 is provided on second main surface 12b. Therefore, the multilayer ceramic capacitor can be mounted on a mount substrate with any of first main surface 12a and second main surface 12b serving as a mount surface.

Figure 34:
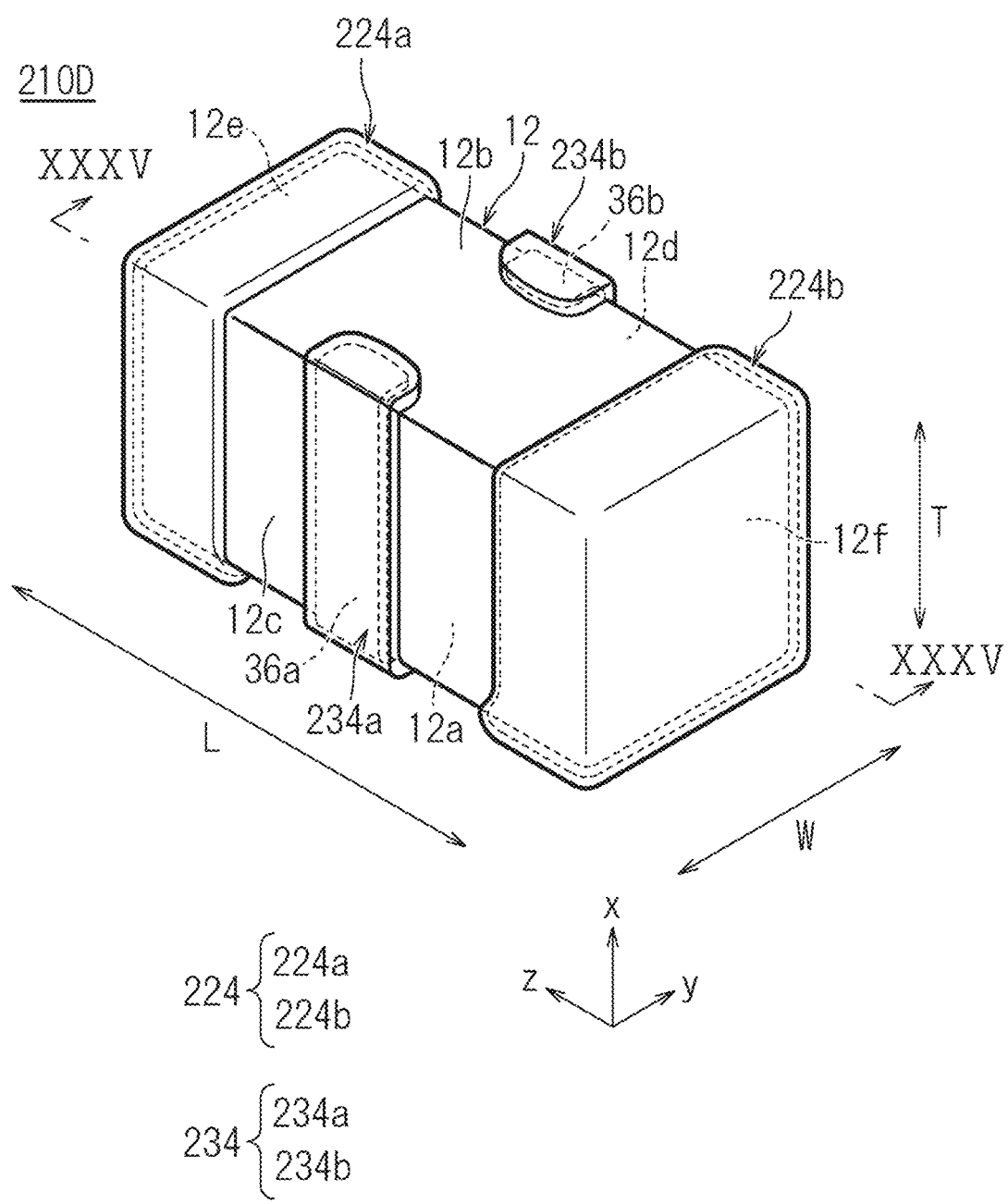
FIG. 34 is a perspective view of a multilayer ceramic capacitor according to Preferred Embodiment 10 of the present invention.
Figure 35:
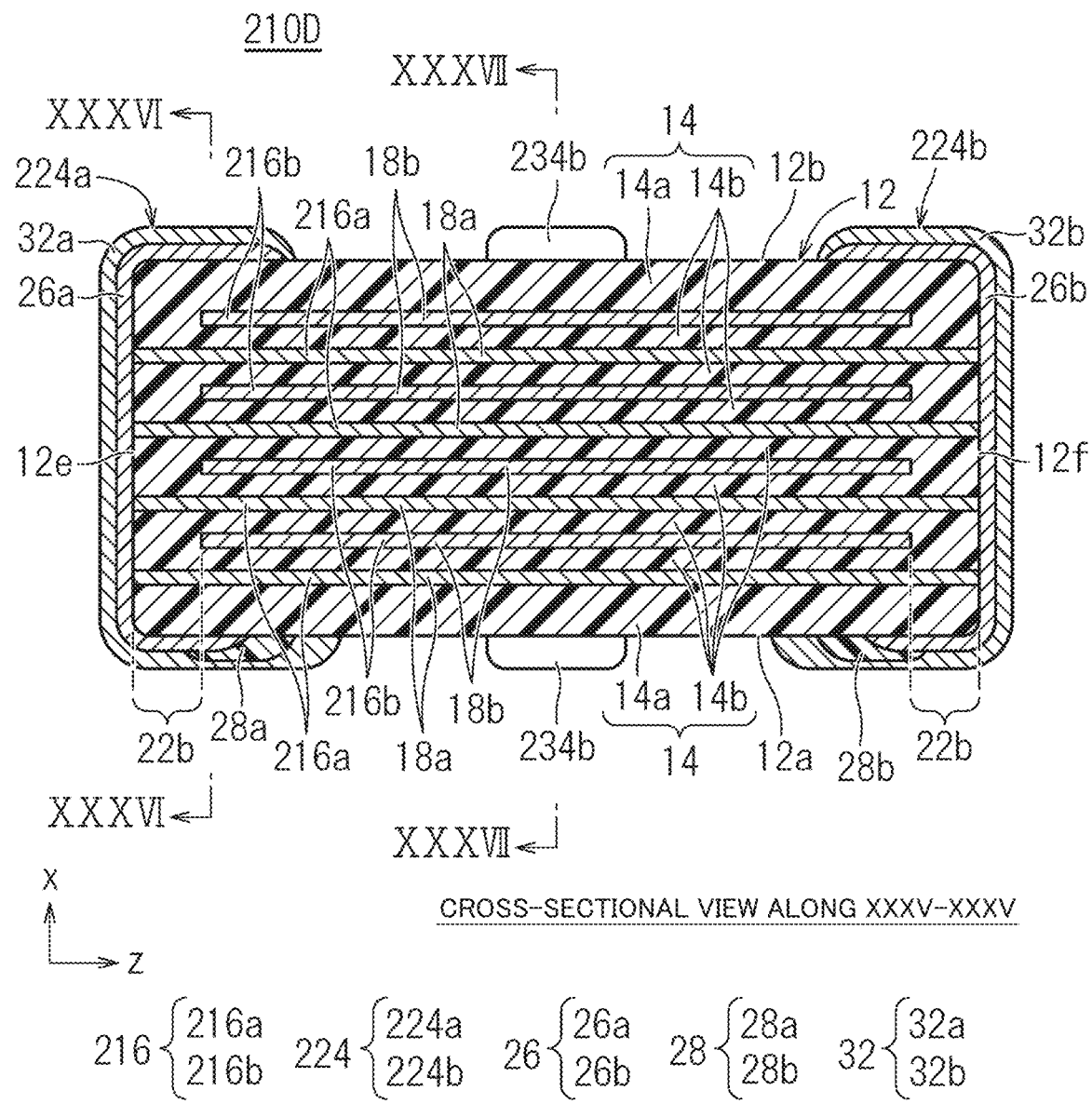
FIG. 35 is a cross-sectional view along the line XXXV-XXXV in FIG. 34.
Figure 36:
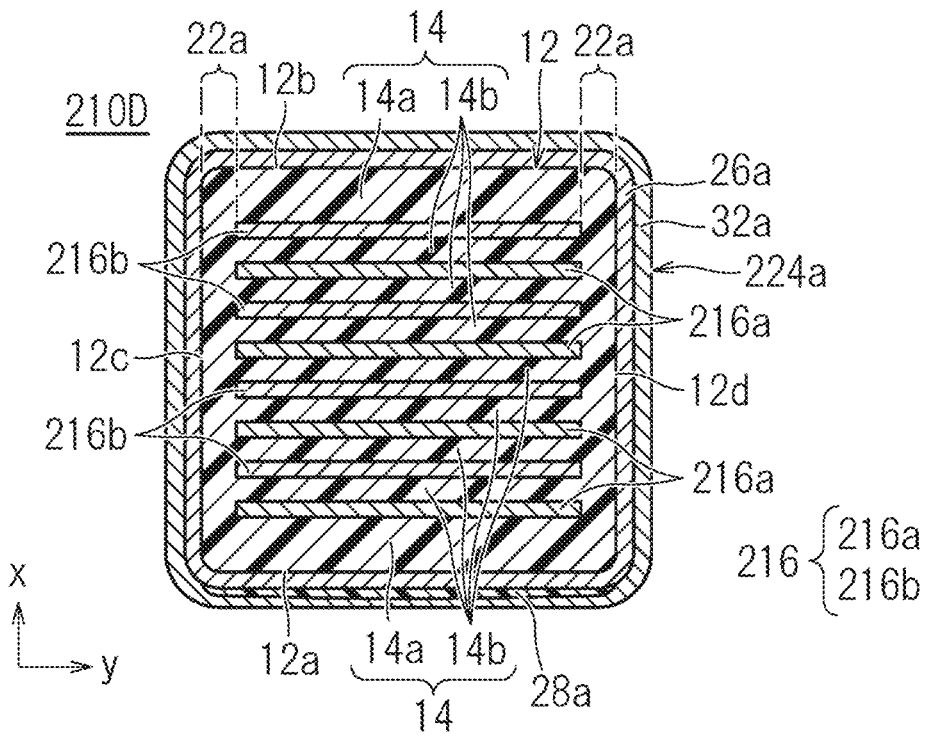
FIG. 36 is a cross-sectional view along the line XXXVI-XXXVI in FIG. 35.
Figure 37:
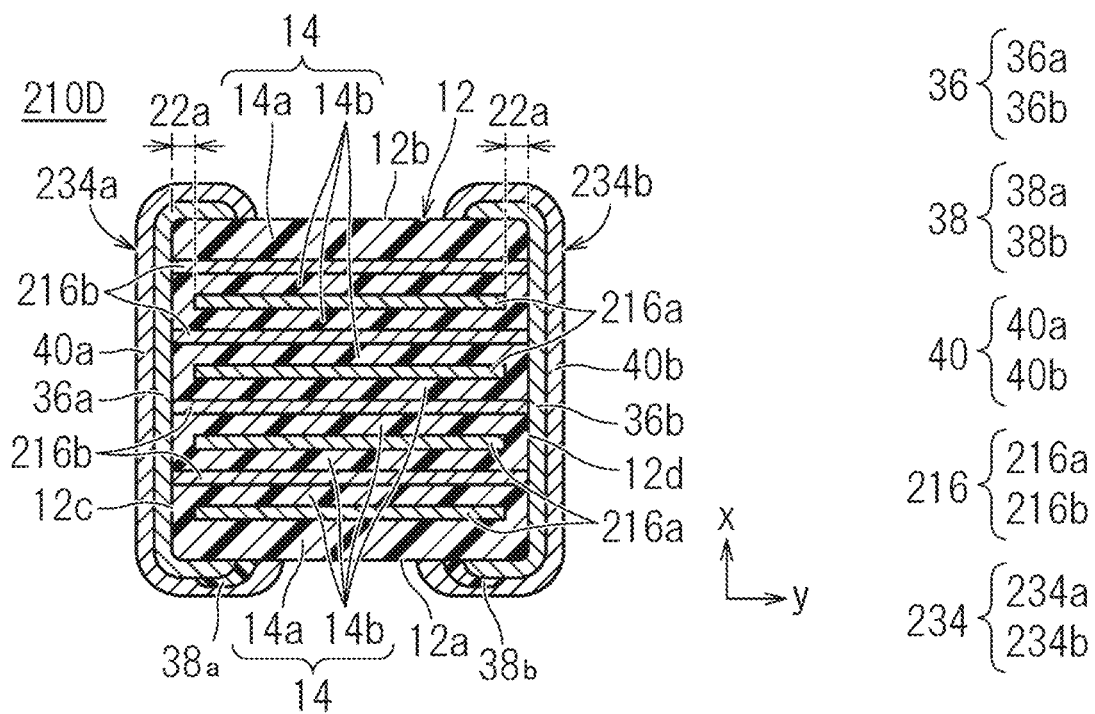
FIG. 37 is a cross-sectional view along the line XXXVII-XXXVII in FIG. 35.
Figure 38:
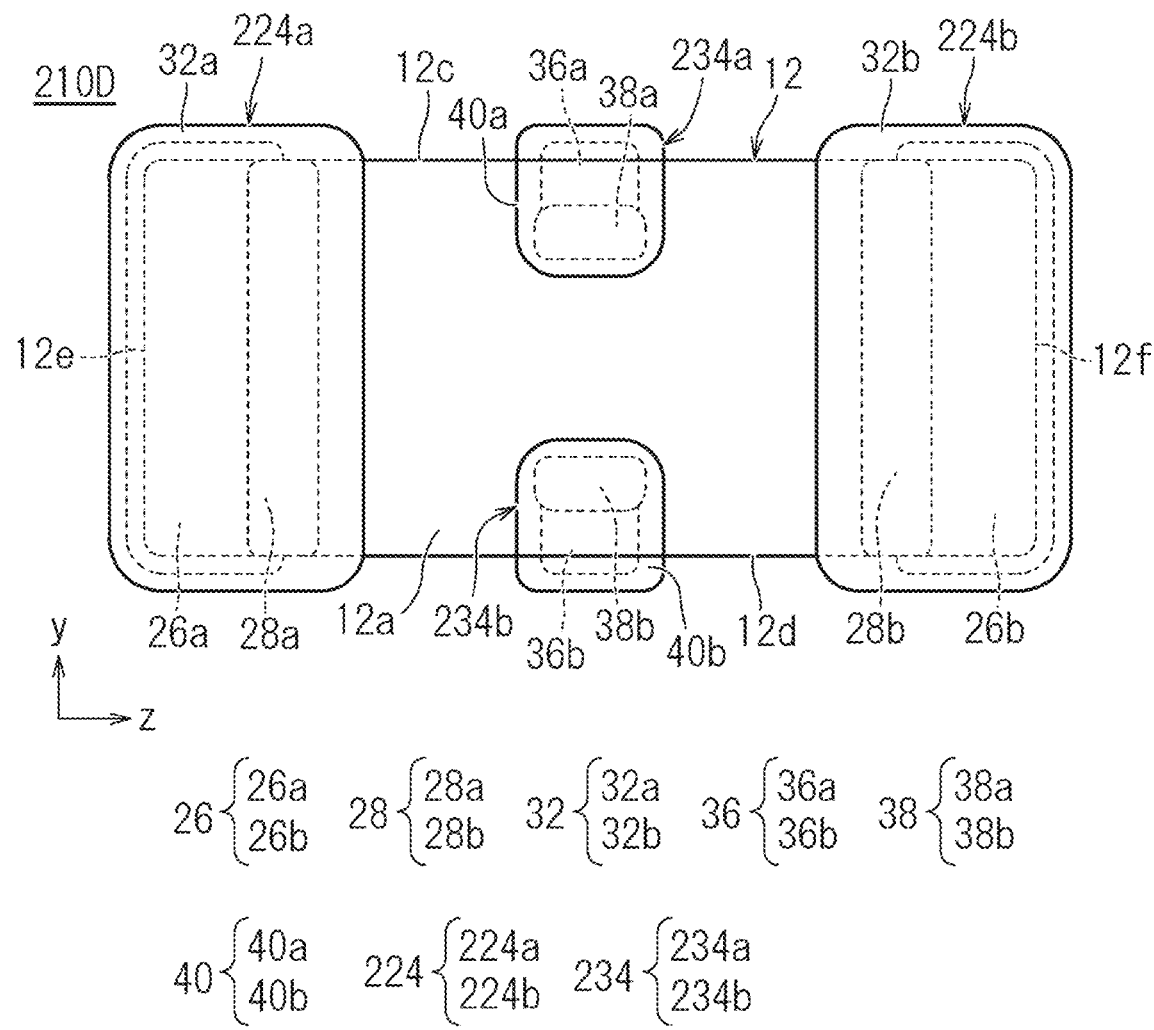
FIG. 38 is a plan view showing the side of the first main surface of the multilayer ceramic capacitor according to Preferred Embodiment 10 of the present invention.

A multilayer ceramic capacitor according to Preferred Embodiment 10 of the present invention will now be described. FIG. 34 is a perspective view of the multilayer ceramic capacitor according to Preferred Embodiment 10 of the present invention. FIG. 35 is a cross-sectional view along the line XXXV-XXXV in FIG. 34. FIG. 36 is a cross-sectional view along the line XXXVI-XXXVI in FIG. 35. FIG. 37 is a cross-sectional view along the line XXXVII-XXXVII in FIG. 35. FIG. 38 is a plan view showing the side of the first main surface of the multilayer ceramic capacitor according to Preferred Embodiment 10 of the present invention. A multilayer ceramic capacitor 210D according to the present preferred embodiment is similar in construction to multilayer ceramic capacitor 210 described with reference to FIG. 18 except for a difference not only in the main-surface-side resin layer in the third external electrode but also in the main-surface-side resin layer in the first and second external electrodes. Therefore, elements the same as or similar to those in multilayer ceramic capacitor 210 shown in FIG. 18 are denoted by the same reference characteristics and description thereof will not partially be provided.

Multilayer ceramic capacitor 210D includes multilayer body 12.

External electrode 224 is provided on first end surface 12e and second end surface 12f of multilayer body 12. External electrode 224 includes first external electrode 224a and second external electrode 224b.

Furthermore, third external electrode 234 is provided on first side surface 12c and second side surface 12d of multilayer body 12. Third external electrode 234 includes one third external electrode 234a and the other third external electrode 234b.

One third external electrode 234a is provided on first side surface 12c of multilayer body 12 and extends from first side surface 12c to cover a portion of each of first main surface 12a and second main surface 12b. In this case, one third external electrode 234a is electrically connected to third drawn electrode portion 221a of second internal electrode layer 216b exposed at first side surface 12c.

The other third external electrode 234b is provided on second side surface 12d of multilayer body 12 and extends from second side surface 12d to cover a portion of each of first main surface 12a and second main surface 12b. In this case, the other third external electrode 234b is electrically connected to fourth drawn electrode portion 221b of second internal electrode layer 216b exposed at second side surface 12d.

First external electrode 224a and second external electrode 224b each include underlying electrode layer 26, main-surface-side resin layer 28, and plated layer 32.

Third external electrode 234 includes underlying electrode layer 36, main-surface-side resin layer 38, and plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes third underlying electrode layer 36a and fourth underlying electrode layer 36b.

Third underlying electrode layer 36a is provided on first side surface 12c of multilayer body 12 and extends from first side surface 12c to cover a part of each of first main surface 12a and second main surface 12b.

Fourth underlying electrode layer 36b is provided on second side surface 12d of multilayer body 12 and extends from second side surface 12d to cover a portion of each of first main surface 12a and second main surface 12b.

As shown in FIG. 38, main-surface-side resin layer 28 includes first main-surface-side resin layer 28a and second main-surface-side resin layer 28b.

First main-surface-side resin layer 28a covers only the entire or substantially the entire end of first underlying electrode layer 26a located on first main surface 12a and does not cover the end of first underlying electrode layer 26a located on first side surface 12c and second side surface 12d.

Second main-surface-side resin layer 28b covers only the entire or substantially the entire end of second underlying electrode layer 26b located on first main surface 12a and does not cover the end of second underlying electrode layer 26b located on first side surface 12c and second side surface 12d.

Plated layer 32 includes first plated layer 32a and second plated layer 32b.

First plated layer 32a covers first underlying electrode layer 26a and first main-surface-side resin layer 28a. Specifically, first plated layer 32a is provided on the surface of first underlying electrode layer 26a located on first end surface 12e and extends to the surfaces of first underlying electrode layer 26a and first main-surface-side resin layer 28a located on first main surface 12a, first underlying electrode layer 26a located on second main surface 12b, and first underlying electrode layer 26a located on first side surface 12c and second side surface 12d.

Second plated layer 32b covers second underlying electrode layer 26b and second main-surface-side resin layer 28b. Specifically, second plated layer 32b is provided on the surface of second underlying electrode layer 26b located on second end surface 12f and extends to the surfaces of second underlying electrode layer 26b and second main-surface-side resin layer 28b located on first main surface 12a, second underlying electrode layer 26b located on second main surface 12b, and second underlying electrode layer 26b located on first side surface 12c and second side surface 12d.

Plated layer 40 includes third plated layer 40a and fourth plated layer 40b.

Third plated layer 40a covers third underlying electrode layer 36a and first main-surface-side resin layer 38a. Specifically, third plated layer 40a is provided on the surface of third underlying electrode layer 36a located on first side surface 12c and extends to the surfaces of third underlying electrode layer 36a and first main-surface-side resin layer 38a located on first main surface 12a and third underlying electrode layer 36a located on second main surface 12b.

Fourth plated layer 40b covers fourth underlying electrode layer 36b and second main-surface-side resin layer 38b. Specifically, fourth plated layer 40b is provided on the surface of fourth underlying electrode layer 36b located on second side surface 12d and extends to the surfaces of fourth underlying electrode layer 36b and second main-surface-side resin layer 38b located on first main surface 12a and fourth underlying electrode layer 36b located on second main surface 12b.

Multilayer ceramic capacitor 210D shown in FIG. 34 achieves advantageous effects similar to those achieved by multilayer ceramic capacitor 210 shown in FIG. 18 and achieves an advantageous effect described below.

Specifically, main-surface-side resin layer 28 includes first main-surface-side resin layer 28a and second main-surface-side resin layer 28b, first main-surface-side resin layer 28a covers the end of first underlying electrode layer 26a located on first main surface 12a, second main-surface-side resin layer 28b covers the end of second underlying electrode layer 26b located on first main surface 12a, main-surface-side resin layer 38a covers the end of third underlying electrode layer 36a located on first main surface 12a, and second main-surface-side resin layer 38b covers the end of fourth underlying electrode layer 36b located on first main surface 12a. Therefore, stress can be more reliably absorbed and thus generation of a crack in the multilayer body can be reduced or prevented.

Figure 39:
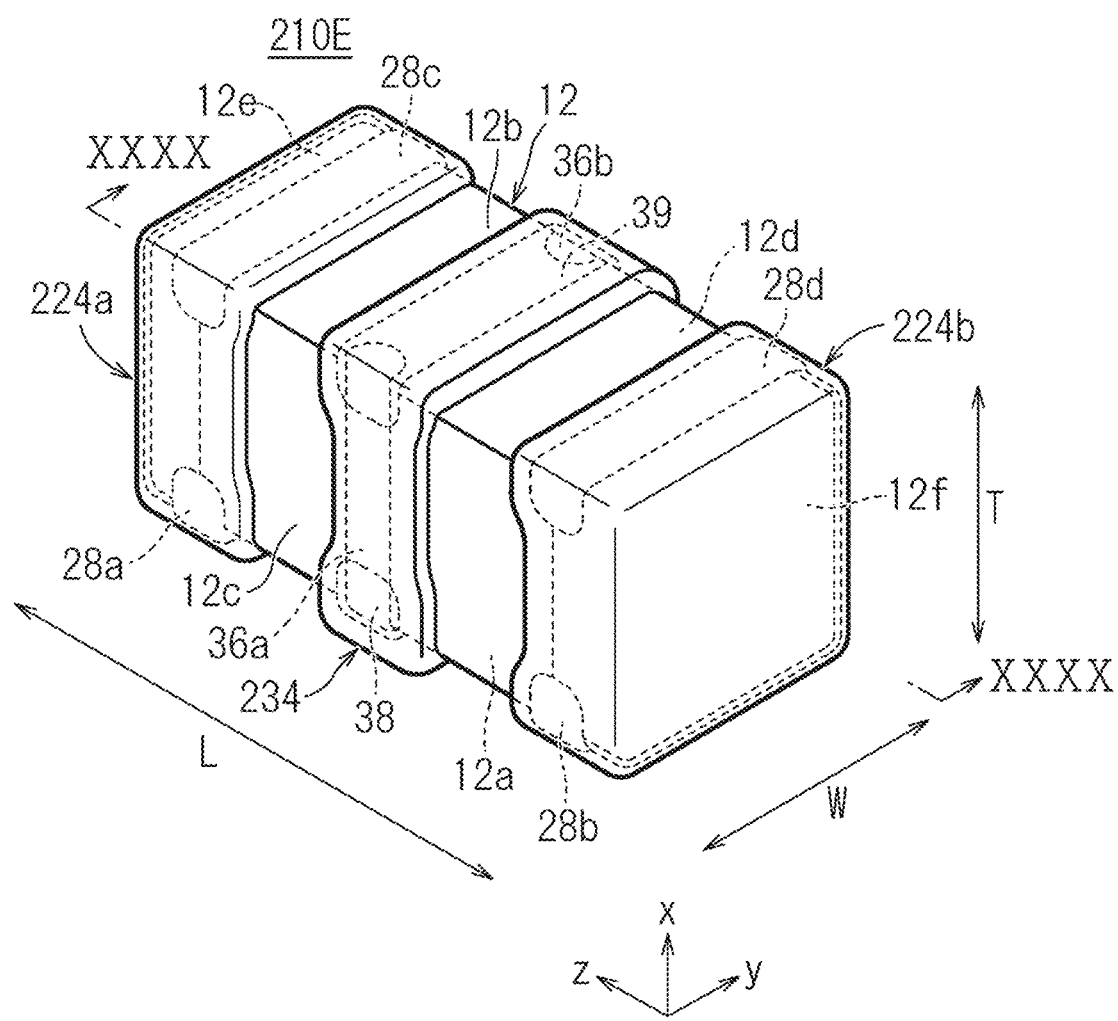
FIG. 39 is a perspective view of a multilayer ceramic capacitor according to Preferred Embodiment 11 of the present invention.
Figure 40:
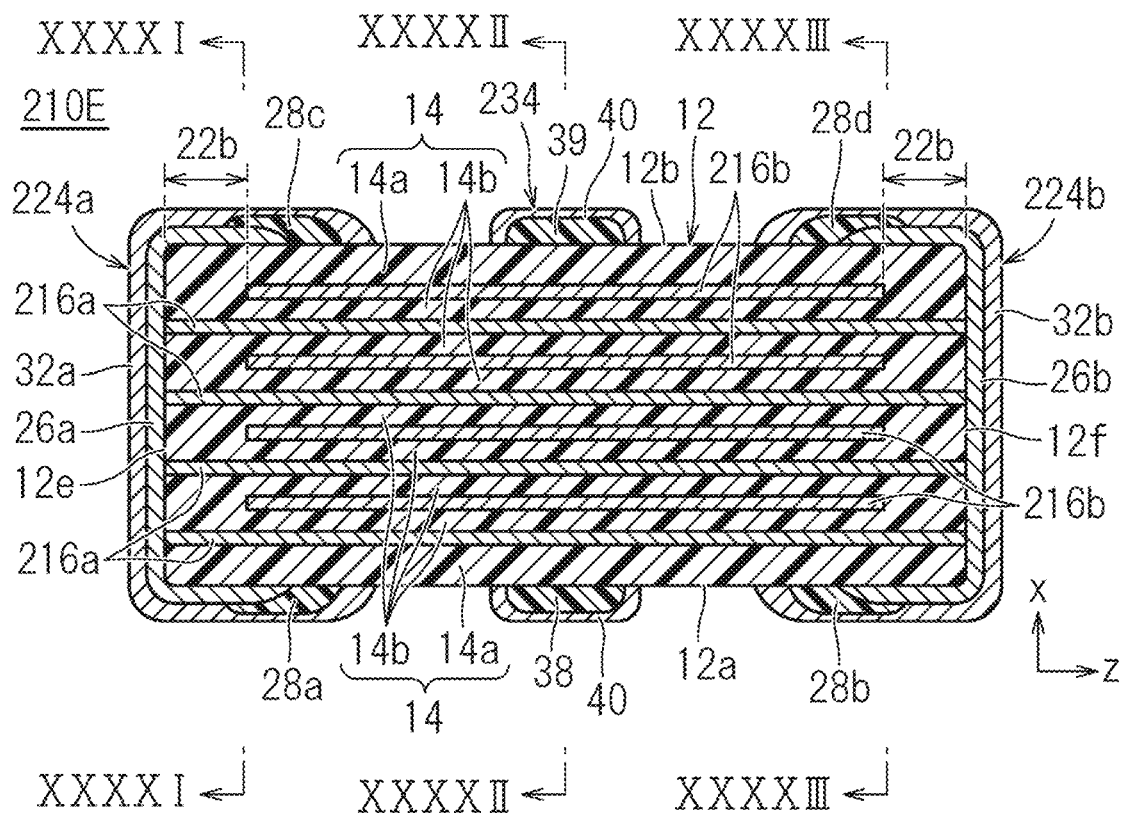
FIG. 40 is a cross-sectional view along the line XXXX-XXXX in FIG. 39.
Figure 41:
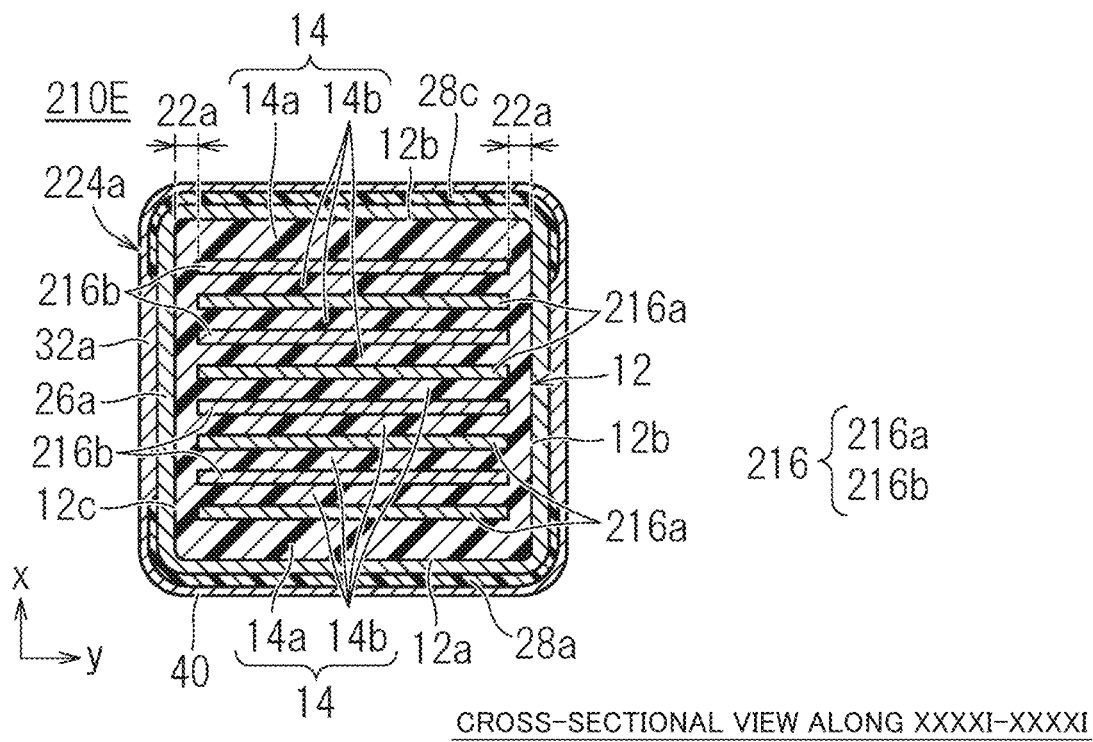
FIG. 41 is a cross-sectional view along the line XXXXI-XXXXI in FIG. 40.
Figure 42:
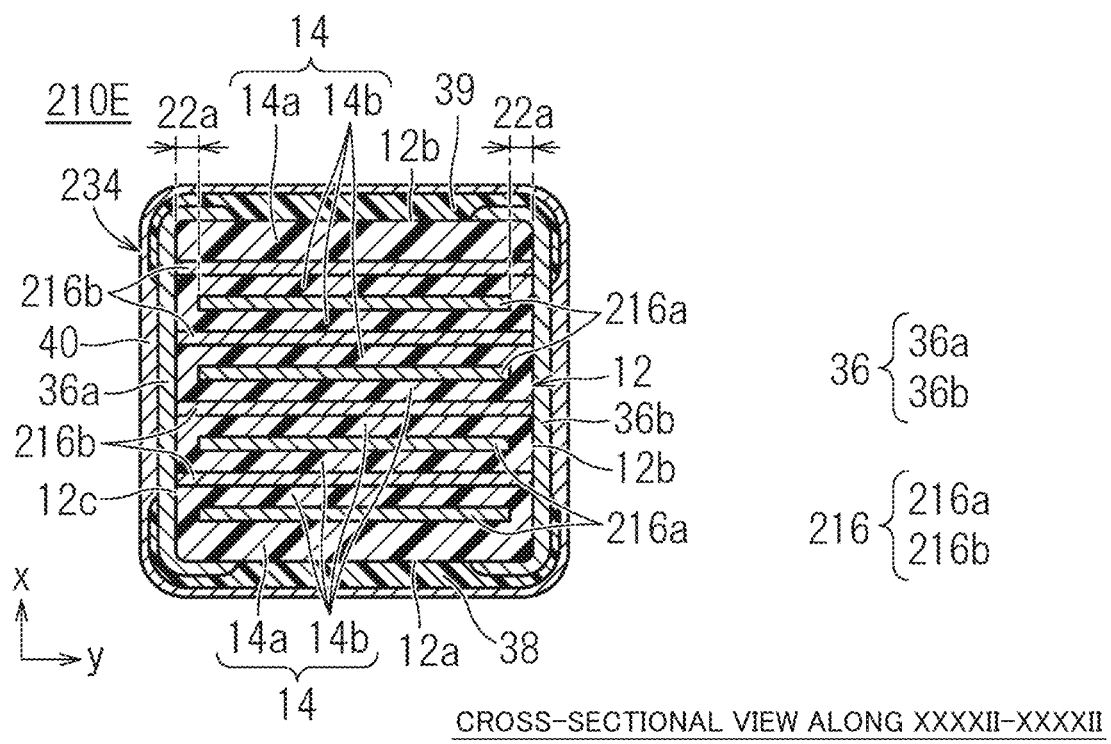
FIG. 42 is a cross-sectional view along the line XXXXII-XXXXII in FIG. 40.
Figure 43:
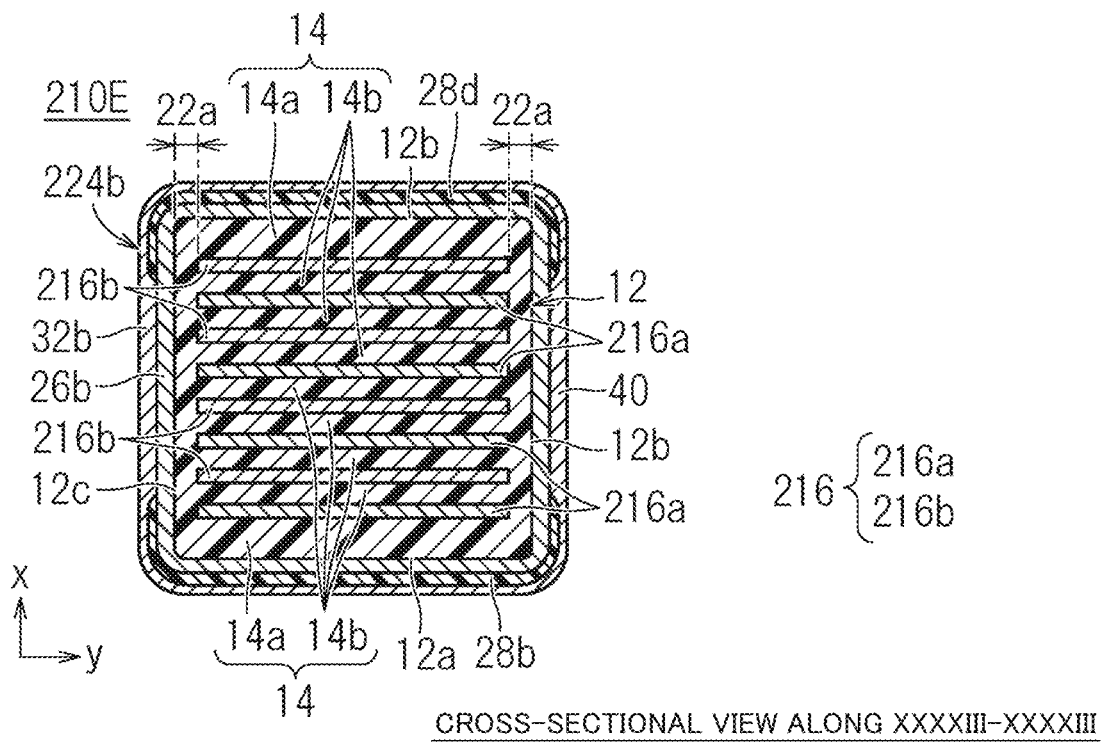
FIG. 43 is a cross-sectional view along the line XXXXIII-XXXXIII in FIG. 40.
Figure 44:
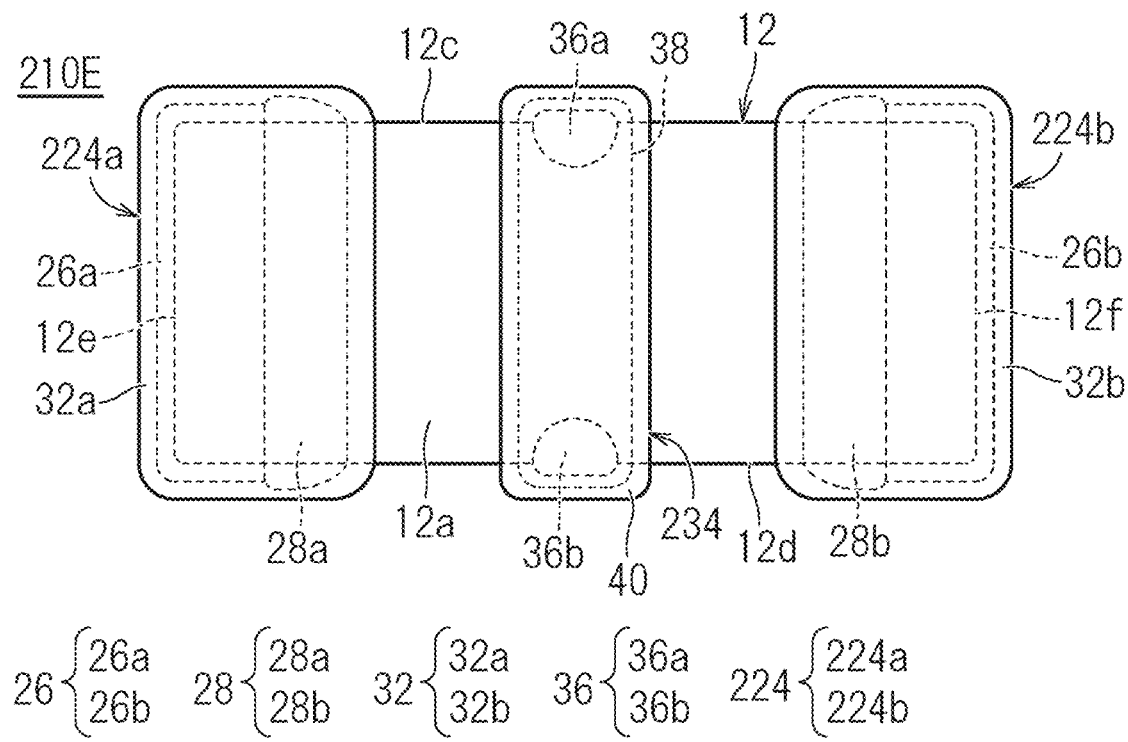
FIG. 44 is a plan view showing the side of the first main surface of the multilayer ceramic capacitor according to Preferred Embodiment 11 of the present invention.

A multilayer ceramic capacitor according to Preferred Embodiment 11 of the present invention will further be described. FIG. 39 is a perspective view of the multilayer ceramic capacitor according to Preferred Embodiment 11 of the present invention. FIG. 40 is a cross-sectional view along the line XXXX-XXXX in FIG. 39. FIG. 41 is a cross-sectional view along the line XXXXI-XXXXI in FIG. 40, FIG. 42 is a cross-sectional view along the line XXXXII-XXXXII in FIG. 40, and FIG. 43 is a cross-sectional view along the line XXXXIII-XXXXIII in FIG. 40. FIG. 44 is a plan view showing the side of the first main surface of the multilayer ceramic capacitor according to Preferred Embodiment 11 of the present invention. A multilayer ceramic capacitor 210E according to the present preferred embodiment is similar in construction to multilayer ceramic capacitor 210 described with reference to FIG. 18 except for a difference not only in the main-surface-side resin layer in the third external electrode but also in the main-surface-side resin layer in the external electrode. Therefore, elements the same as or similar to those in multilayer ceramic capacitor 210 shown in FIG. 18 are denoted by the same reference characteristics and description thereof will not partially be provided.

Multilayer ceramic capacitor 210E includes multilayer body 12.

External electrode 224 is provided on first end surface 12e and second end surface 12f of multilayer body 12. External electrode 224 includes first external electrode 224a and second external electrode 224b.

Furthermore, third external electrode 234 is provided on first main surface 12a, on first side surface 12c, and on of second side surface 12d of multilayer body 12.

More specifically, third external electrode 234 is provided on first main surface 12a of multilayer body 12, extends from first main surface 12a to first side surface 12c, extends from first main surface 12a to cover first side surface 12c and second side surface 12d, and further covers second main surface 12b. In this case, third external electrode 234 is electrically connected to third drawn electrode portion 221a of second internal electrode layer 216b exposed at first side surface 12c and fourth drawn electrode portion 221b of second internal electrode layer 216b exposed at second side surface 12d.

First external electrode 224a and second external electrode 224b each include underlying electrode layer 26, main-surface-side resin layer 28, and plated layer 32.

Third external electrode 234 includes underlying electrode layer 36, main-surface-side resin layer 38, and plated layer 40.

Underlying electrode layer 26 includes first underlying electrode layer 26a and second underlying electrode layer 26b.

First underlying electrode layer 26a is provided on first end surface 12e of multilayer body 12 and extends from first end surface 12e to cover a portion of each of first main surface 12a, second main surface 12b, first side surface 12c, and second side surface 12d.

Second underlying electrode layer 26b is provided on second end surface 12f of multilayer body 12 and extends from second end surface 12f to cover a portion of each of first main surface 12a, second main surface 12b, first side surface 12c, and second side surface 12d.

Underlying electrode layer 36 includes third underlying electrode layer 36a and fourth underlying electrode layer 36b.

Third underlying electrode layer 36a is provided on first side surface 12c of multilayer body 12 and extends from first side surface 12c to cover a portion of each of first main surface 12a and second main surface 12b.

Fourth underlying electrode layer 36b is provided on second side surface 12d of multilayer body 12 and extends from second side surface 12d to cover a portion of each of first main surface 12a and second main surface 12b.

As shown in FIG. 39, main-surface-side resin layer 28 includes first main-surface-side resin layer 28a, second main-surface-side resin layer 28b, third main-surface-side resin layer 28c, and a fourth main-surface-side resin layer 28d.

First main-surface-side resin layer 28a covers the end of first underlying electrode layer 26a located on first main surface 12a and covers a portion of the end of first underlying electrode layer 26a located on each of first side surface 12c and second side surface 12d continuously from the side of first main surface 12a.

Second main-surface-side resin layer 28b covers the end of second underlying electrode layer 26b located on first main surface 12a and covers a portion of the end of second underlying electrode layer 26b located on each of first side surface 12c and second side surface 12d continuously from the side of first main surface 12a.

Third main-surface-side resin layer 28c covers the end of first underlying electrode layer 26a located on second main surface 12b and covers a portion of the end of first underlying electrode layer 26a located on each of first side surface 12c and second side surface 12d continuously from the side of second main surface 12b.

Fourth main-surface-side resin layer 28d covers the end of second underlying electrode layer 26b located on second main surface 12b and covers a portion of the end of second underlying electrode layer 26b located on each of first side surface 12c and second side surface 12d continuously from the side of second main surface 12b.

As shown in FIG. 39, main-surface-side resin layer 38 is provided across the end of underlying electrode layer 36a and the end of underlying electrode layer 36b located on first main surface 12a continuously over first main surface 12a. Main-surface-side resin layer 38 further covers respective portions of third underlying electrode layer 36a and fourth underlying electrode layer 36b located on first side surface 12c and second side surface 12d.

As shown in FIG. 39, main-surface-side resin layer 39 is provided across the end of underlying electrode layer 36a and the end of underlying electrode layer 36b located on second main surface 12b continuous over second main surface 12b. Main-surface-side resin layer 39 further covers respective portions of third underlying electrode layer 36a and fourth underlying electrode layer 36b located on first side surface 12c and second side surface 12d.

Plated layer 32 includes first plated layer 32a and second plated layer 32b.

First plated layer 32a covers first underlying electrode layer 26a, first main-surface-side resin layer 28a, and third main-surface-side resin layer 28c. Specifically, first plated layer 32a is provided on the surface of first underlying electrode layer 26a located on first end surface 12e and extends the surfaces of first underlying electrode layer 26a and first main-surface-side resin layer 28a located on first main surface 12a, first underlying electrode layer 26a and third main-surface-side resin layer 28c located on second main surface 12b, and first underlying electrode layer 26a located on first side surface 12c and second side surface 12d.

Second plated layer 32b covers second underlying electrode layer 26b, second main-surface-side resin layer 28b, and fourth main-surface-side resin layer 28d. Specifically, second plated layer 32b is provided on the surface of second underlying electrode layer 26b located on second end surface 12f and extends to the surfaces of second underlying electrode layer 26b and second main-surface-side resin layer 28b located on first main surface 12a, second underlying electrode layer 26b and fourth main-surface-side resin layer 28d located on second main surface 12b, and second underlying electrode layer 26b located on first side surface 12c and second side surface 12d.

Plated layer 40 covers third underlying electrode layer 36a, fourth underlying electrode layer 36b, main-surface-side resin layer 38, and main-surface-side resin layer 39. Specifically, plated layer 40 is provided on the surface of main-surface-side resin layer 38 located on first main surface 12a and on the surface of main-surface-side resin layer 39 located on the side of second main surface 12b. Furthermore, the plated layer is provided on the surfaces of third underlying electrode layer 36a located on first side surface 12c and main-surface-side resin layers 38 and 39 and provided on the surfaces of fourth underlying electrode layer 36b located on second side surface 12d and main-surface-side resin layers 38 and 39. Plated layer 40 is continuous over first main surface 12a, first side surface 12c, second main surface 12b, and second side surface 12d.

Multilayer ceramic capacitor 210E shown in FIG. 39 achieves advantageous effects similar to those achieved by multilayer ceramic capacitor 210 shown in FIG. 18 and achieves an advantageous effect described below.

Specifically, main-surface-side resin layer 28 includes first main-surface-side resin layer 28a, second main-surface-side resin layer 28b, third main-surface-side resin layer 28c, and fourth main-surface-side resin layer 28d, first main-surface-side resin layer 28a and third main-surface-side resin layer 28c cover the ends of first underlying electrode layer 26a located on first main surface 12a and second main surface 12b, second main-surface-side resin layer 28b and fourth main-surface-side resin layer 28d cover the ends of second underlying electrode layer 26b located on first main surface 12a and second main surface 12b, main-surface-side resin layer 38 is provided across the end of underlying electrode layer 36a and the end of underlying electrode layer 36b located on first main surface 12a continuously over first main surface 12a and covers respective portions of third underlying electrode layer 36a and fourth underlying electrode layer 36b located on first side surface 12c and second side surface 12d, and main-surface-side resin layer 39 is provided across the end of underlying electrode layer 36a and the end of underlying electrode layer 36b located on second main surface 12b continuous over second main surface 12b and covers respective portions of third underlying electrode layer 36a and fourth underlying electrode layer 36b located on first side surface 12c and second side surface 12*d*. Stress can be more reliably absorbed and thus generation of a crack in the multilayer body can be reduced or prevented.

Not only main-surface-side resin layer 38 is provided on first main surface 12*a* but also main-surface-side resin layer 39 is provided on second main surface 12*b*. Therefore, the multilayer ceramic capacitor can be mounted on a mount substrate with any of first main surface 12*a* and second main surface 12*b* serving as a mount surface.

2. Method of Manufacturing Multilayer Ceramic Capacitor

One preferred embodiment of a method of manufacturing the multilayer ceramic capacitor constructed as described above will now be described with reference to a non-limiting example of a method of manufacturing multilayer ceramic capacitor 10 shown in FIG. 1.

Initially, a ceramic green sheet, a conductive paste for an internal electrode to form internal electrode layer 16, and a conductive paste for an external electrode for forming underlying electrode layer 26 of external electrode 24 are prepared. Though the ceramic green sheet, the conductive paste for the internal electrode, and the conductive paste for the external electrode include an organic binder and a solvent, a known organic binder or a known organic solvent can be used.

For example, the conductive paste for the internal electrode is printed in a prescribed pattern on the ceramic green sheet so that the internal electrode pattern is formed on the ceramic green sheet. The conductive paste for the internal electrode can be printed by a known method such as screen printing or gravure printing, for example.

Then, a mother multilayer body is made by layering a prescribed number of ceramic green sheets for an outer layer on which the internal electrode pattern is not printed, successively layering thereon the ceramic green sheets on which the internal electrode pattern has been printed, and layering thereon a prescribed number of ceramic green sheets for the outer layer (layering step). The mother multilayer body may be compression-bonded in a direction of layering by, for example, isostatic pressing as necessary.

Thereafter, the mother multilayer body is cut in a prescribed shape having a prescribed dimension to obtain a raw multilayer body chip (cutting step). At this time, the multilayer body may have a corner or a ridge rounded by barrel polishing or the like, for example. In succession, the cut raw multilayer body chip is fired to produce a multilayer body (firing step). A temperature for firing the raw multilayer body chip is preferably, for example, not lower than about 900° C. and not higher than about 1300° C., although it is dependent on a ceramic material or a material for the conductive paste for the internal electrode.

Then, underlying electrode layer 26 is formed. Initially, the conductive paste for the external electrode is applied to opposing end surfaces of the fired multilayer body and baked to form first underlying electrode layer 26*a* of first external electrode 24*a* and second underlying electrode layer 26*b* of second external electrode 24*b* (underlying electrode layer forming step). A temperature for baking is preferably, for example, not lower than about 700° C. and not higher than about 900° C.

Then, multilayer body 12 on which underlying electrode layer 26 has been formed is aligned in the direction of layering of internal electrode layers 16 by magnetic force from a magnet, for example. By aligning a surface where a next resin is to be formed and the direction of layering of internal electrode layers 16, a surface where a resin is to be formed (a resin application surface) is readily identified by using magnetic force from the magnet in loading multilayer ceramic capacitor 10 into a carrier tape which will be described later. When first main surface 12*a* which is a mount surface does not face down, the multilayer body can be aligned by emitting air in the width direction orthogonal or substantially orthogonal to a direction of transportation of multilayer body 12 to turn the multilayer body. Turning of the multilayer body can be facilitated by setting a ratio of a dimension in width direction y to the dimension in height direction x of multilayer body 12 to preferably be at least about 0.9 and at most about 1.1, for example.

In succession, main-surface-side resin layer 28 is formed. Initially, first main-surface-side resin layer 28*a* is formed by applying a thermosetting resin to cover a portion of the end of first underlying electrode layer 26*a* located on first main surface 12*a*, and similarly, second main-surface-side resin layer 28*b* is formed by applying a thermosetting resin to cover second underlying electrode layer 26*b* to cover a portion of the end of second underlying electrode layer 26*b* located on first main surface 12*a* (resin layer forming step). The thermosetting resin is applied by screen printing, for example.

Then, plated layer 32 is formed. Initially, first plated layer 32*a* is formed to cover first underlying electrode layer 26*a* and first main-surface-side resin layer 28*a*, and similarly, second plated layer 32*b* is formed to cover second underlying electrode layer 26*b* and second main-surface-side resin layer 28*b* (plating step). Plated layer 32 can be formed by electrolytic plating or electroless plating, for example. A thickness of plated layer 32 can be adjusted by controlling a current value or a time period for plating. Specifically, a process is preferably performed by adjusting a plating current value X a time period for plating with respect to an area of formation of plating.

Multilayer ceramic capacitor 10 is manufactured as described above.

Figure 45:
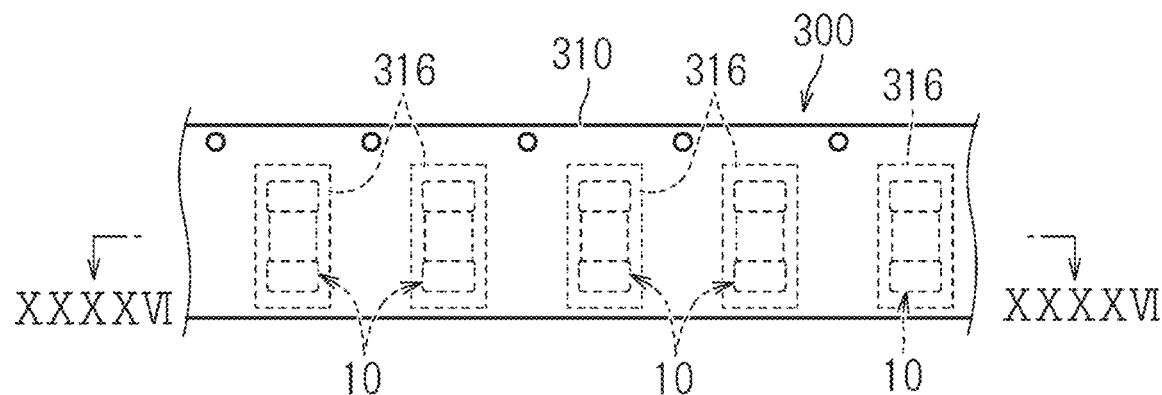
FIG. 45 is a plan view of a series of electronic components according to a preferred embodiment of the present invention.

In succession, manufactured multilayer ceramic capacitor 10 is accommodated in a carrier tape so that a series of electronic components 300 is manufactured (step of accommodation in a carrier tape). Description will be provided below. FIG. 45 is a plan view of a series of electronic components according to a preferred embodiment of the present invention and FIG. 46 is a cross-sectional view along the line XXXXVI-XXXXVI in FIG. 45.

Figure 46:
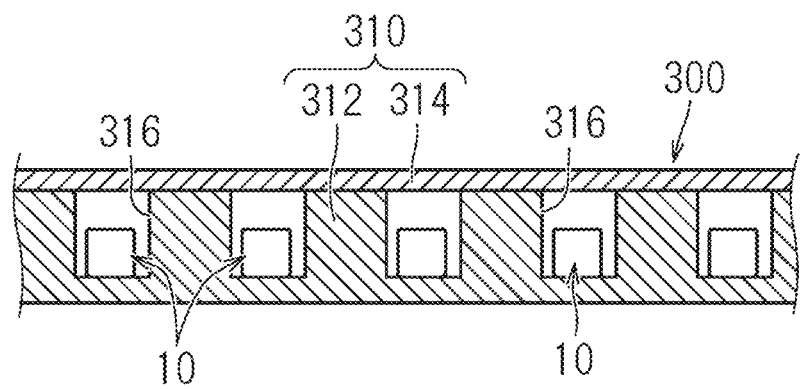
FIG. 46 is a cross-sectional view along the line XXXXVI-XXXXVI in FIG. 45.

A series of electronic components 300 shown in FIGS. 45 and 46 is prepared by taping a plurality of multilayer ceramic capacitors 10. A series of electronic components 300 includes an elongated tape 310. As shown in FIG. 46, tape 310 includes an elongated carrier tape 312 and an elongated cover tape 314. Carrier tape 312 includes a plurality of cavities 316 provided at an interval along a longitudinal direction. Cover tape 314 is provided to cover a plurality of cavities 316 over carrier tape 312. Multilayer ceramic capacitor 10 is accommodated in each of the plurality of cavities 316.

The plurality of multilayer ceramic capacitors 10 in such a series of electronic components 300 are aligned, for example, by using an apparatus (not shown) for transporting multilayer ceramic capacitor 10, and in succession, the plurality of multilayer ceramic capacitors 10 are accommodated in respective ones of the plurality of cavities 316 in carrier tape 312. Then, each cavity 316 where multilayer ceramic capacitor 10 is accommodated is closed by cover tape 314.

A series of electronic components 300 is thus manufactured.

When plated layer 32 on first main surface 12*a* where main-surface-side resin layer 28 is provided is longer by at least about 100 μm in length direction z than plated layer 32 on first side surface 12*c* and second side surface 12*d* in the plurality of multilayer ceramic capacitors 10, first main surface 12*a* defining and functioning as a mount surface can be identified. When plated layer 32 on first main surface 12*a* where main-surface-side resin layer 28 is provided is longer by at least about 200 μm in length direction z than plated layer 32 on first side surface 12*c* and second side surface 12*d* in the plurality of multilayer ceramic capacitors 10, first main surface 12*a* defining and functioning as a mount surface can be more readily identified. Therefore, the plurality of multilayer ceramic capacitors 10 can be mounted such that the direction of layering of internal electrode layers 16 is in parallel or substantially in parallel to the direction of normal to a mount substrate and can be disposed such that first main surface 12*a* where main-surface-side resin layer 28 is provided faces a bottom surface of cavity 316. Therefore, the plurality of multilayer ceramic capacitors 10 in the series of electronic components 300 are held at second main surface 12*b* as being attached by suction and mounted such that first main surface 12*a* faces the mount substrate.

3. Mount Structure of Multilayer Ceramic Capacitor

Figure 47:
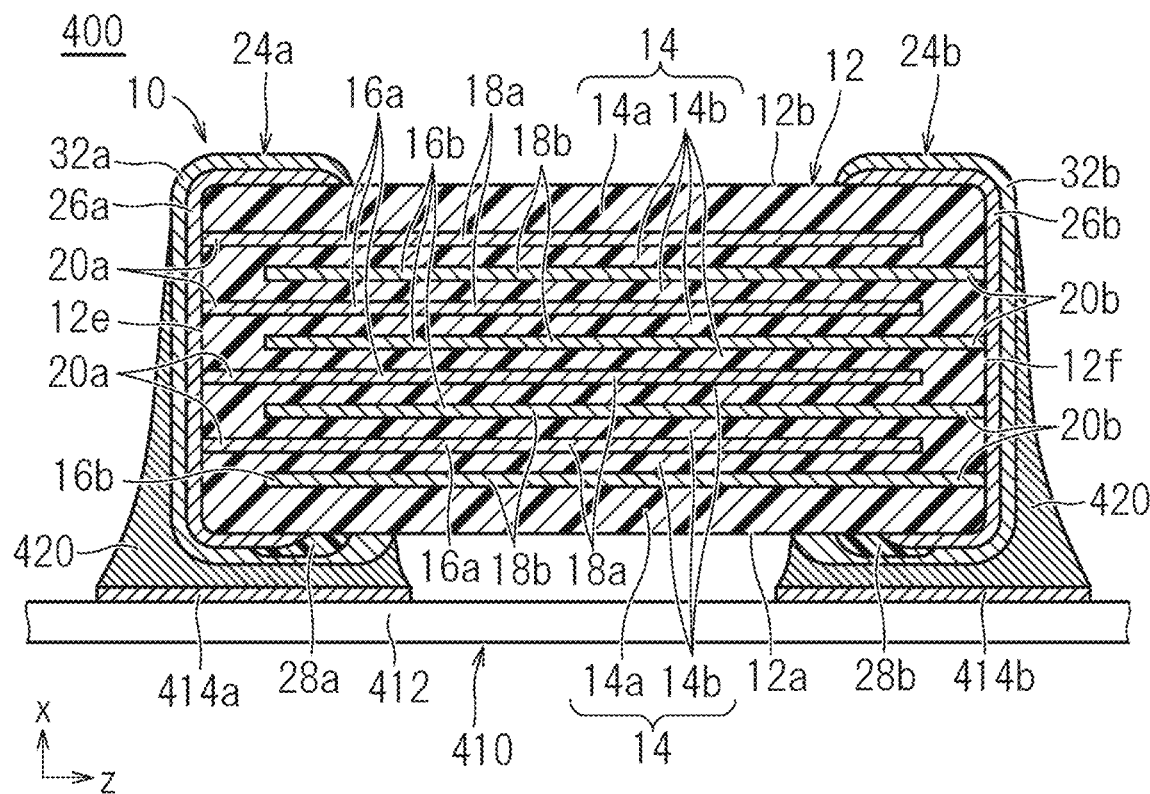
FIG. 47 is a cross-sectional view showing an exemplary mount structure of a multilayer ceramic capacitor according to a preferred embodiment of the present invention.

A mount structure of a multilayer ceramic capacitor according to a preferred embodiment of the present invention will now be described with reference to FIG. 47. Mounting of multilayer ceramic capacitor 10 shown in FIG. 1 on a substrate 410 will be described by way of example. FIG. 47 is a cross-sectional view showing an exemplary mount structure of a multilayer ceramic capacitor according to the present invention. Multilayer ceramic capacitor 10 shown in FIG. 47 has the same or substantially the same structure as multilayer ceramic capacitor 10 shown in FIGS. 1 to 3.

A mount structure 400 of the multilayer ceramic capacitor according to a preferred embodiment of the present invention includes multilayer ceramic capacitor 10 and substrate 410 on which multilayer ceramic capacitor 10 is to be mounted.

Substrate 410 is obtained by bonding a land electrode 414 onto a main surface of a core material 412 of substrate 410. Core material 412 may include a single layer or a plurality of layers. When the core material includes a plurality of layers, wiring may be such that land electrode 414 is provided on a surface of each core material 412 and the land electrode is electrically connected to a land electrode (not shown) in a different layer through a via (not shown).

Core material 412 is defined by, for example, a substrate made of a material obtained by impregnating a base material including a glass fabric (cloth) and a glass nonwoven fabric as being mixed with an epoxy resin or a polyimide resin or a ceramic substrate manufactured by baking a sheet including ceramics and glass as being mixed. Though a thickness of core material 412 is not particularly limited, the thickness is preferably not smaller than about 200 μm and not larger than about 800 μm, for example.

Land electrode 414 is bonded to one surface or opposing surfaces of core material 412 of substrate 410. External electrode 24 of multilayer ceramic capacitor 10 is mounted on land electrode 414 by solder. Land electrode 414 includes a first land electrode 414*a* and a second land electrode 414*b*.

Though a material for land electrode 414 is not particularly limited, the land electrode is preferably made of, for example, a metal such as Cu, Au, Pd, or Pt or an alloy thereof. Land electrode 414 preferably has a thickness not smaller than about 20 μm and not larger than about 200 μm, for example.

The multilayer ceramic capacitor can also be mounted, for example, by solder using a lead frame made of Cu or Al as wiring to bridge across different lead frames.

Multilayer ceramic capacitor 10 is disposed such that first external electrode 24*a* thereof is in contact with first land electrode 414*a* on substrate 410 and second external electrode 24*b* thereof is in contact with second land electrode 414*b* on substrate 410. First external electrode 24*a* and first land electrode 414*a* are joined to each other to be electrically connected to each other by solder 420. Similarly, second external electrode 24*b* and second land electrode 414*b* are joined to each other to be electrically connected to each other by solder 420. Therefore, first main surface 12*a* where main-surface-side resin layer 28 of multilayer ceramic capacitor 10 is provided is opposed to a surface of substrate 410.

Solder 420 is connected by lead-free solder. A composition of lead-free solder is preferably adjusted, for example, within a range of a content of Sn from at least about 96.3% to at most about 99.0%, a content of Ag from at least about 0% to at most about 3%, and a content of Cu from at least about 0.5% to about 0.7%, and solder is more preferably composed of about 96.5% of Sn, about 3% of Ag, and about 0.5% of Cu, for example.

In a high-temperature environment such as about 175° C. or about 200° C., a component of an Ni layer and an Sn layer is preferably included as a compound.

4. Experiment Example

An experiment for evaluating multilayer ceramic capacitor 10 obtained by the method described above was conducted. In the experiment, a bending test, an ESR measurement test, and checking for occurrence of solder burst were conducted.

(1) Bending Test

The bending test was conducted by observing generation of a crack in a multilayer body with a length of the e end-to-end dimension in the main-surface-side resin layer that covered a portion of the end of the underlying electrode layer located on the first main surface being varied.

The e end-to-end dimension represents a length of the main-surface-side resin layer in length direction z from the end of the underlying electrode layer located on the first main surface.

On the side of the first external electrode, in connection with the length of the e end-to-end dimension, a length in length direction z from the end of the first underlying electrode layer located on the first main surface to the end on the side of the second end surface, of the first main-surface-side resin layer located on the surface of the multilayer body was expressed as a positive value, and a length in length direction z to the end on the side of the second end surface, of the first main-surface-side resin layer located on the surface of the first underlying electrode layer was expressed as a negative value.

Similarly, on the side of the second external electrode, in connection with the length of the e end-to-end dimension, a length in length direction z from the end of the second underlying electrode layer located on the first main surface to the end on the side of the first end surface, of the second main-surface-side resin layer located on the surface of the multilayer body was expressed as a positive value, and a length in length direction z to the end on the side of the first end surface, of the second main-surface-side resin layer located on the surface of the second underlying electrode layer was expressed as a negative value.

Therefore, a positive value of the e end-to-end dimension means that the main-surface-side resin layer covers the multilayer body whereas a negative value of the e end-to-end dimension means that the main-surface-side resin layer does not cover the multilayer body.

A sample of the multilayer ceramic capacitor similar in structure to multilayer ceramic capacitor 10 according to Preferred Embodiment 1 in conformity with specifications as shown below was manufactured as the multilayer ceramic capacitor to be used in the bending test.
  Size (value as designed) of multilayer ceramic capacitor: 0603 size, 1608 size, and 3216 size
  Material for dielectric layer: $BaTiO_3$
  Material for internal electrode: Ni
  Structure of external electrode Underlying electrode layer
  Material for underlying electrode layer: conductive metal (Cu)
  Main-surface-side resin layer
  Resin: epoxy-based
  Where main-surface-side resin layer is formed: formed to cover the end of the underlying electrode layer located on the first main surface and formed to cover a portion of respective ends of the underlying electrode layer located on the first and second side surfaces continuously from the side of the first main surface
  Plated layer: two-layered structure of Ni plated layer and Sn plated layer In the bending test, the sample of the multilayer ceramic capacitor was mounted with solder on a substrate (glass epoxy substrate) in conformity with JIS having a thickness of about 0.8 mm. Mechanical stress was applied by bending the substrate with a pressing jig from a substrate surface on which no component had been mounted. At this time, a time period for holding was set to about five seconds and an amount of bending was set to about 5 mm. After the substrate was bent, the sample of the multilayer ceramic capacitor was removed from the substrate, polishing was performed in a direction perpendicular or substantially perpendicular to the substrate surface, and generation of a crack was checked for by observation. The number of samples for each size was set to sixteen.

Figure 48:
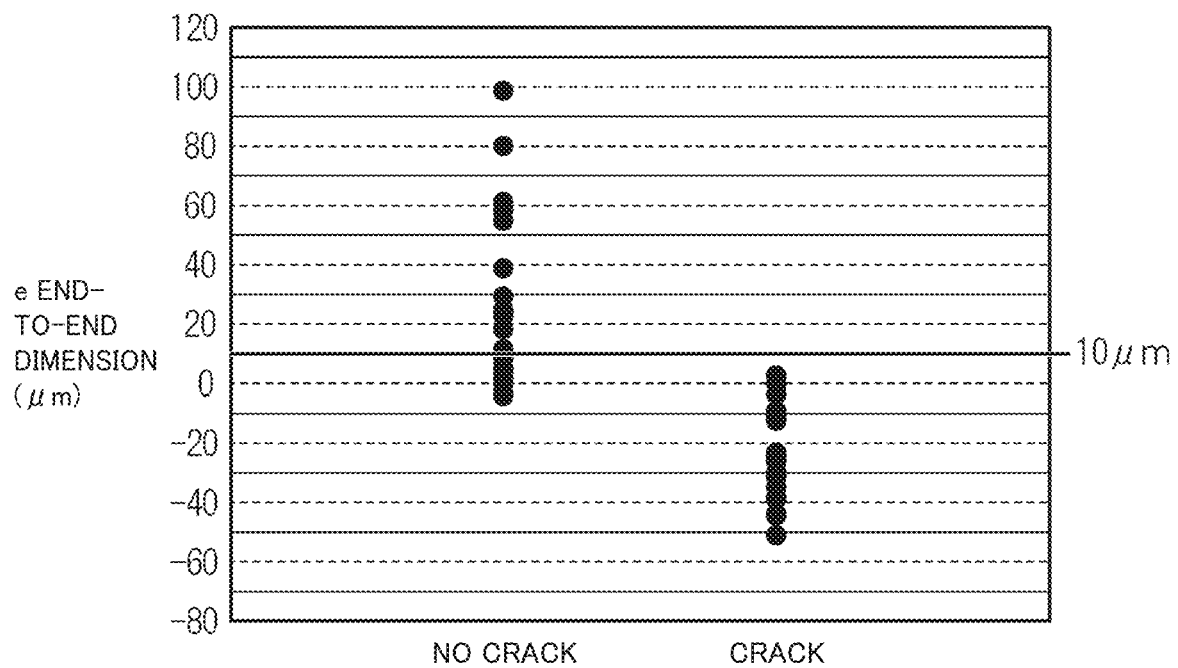
FIG. 48 is a diagram showing a relationship between magnitude of an end-to-end dimension and generation of a crack in a bending test.

Table 1 shows a result of measurement of the e end-to-end dimension in each sample of the multilayer ceramic capacitor and a result of checking for generation of a crack in the bending test above. FIG. 48 is a diagram showing a relationship between magnitude of the e end-to-end dimension and generation of a crack in the bending test.

TABLE 1

| | 0603 Size | | | | 1608 Size | | | | 3216 Size | | | |
| | e End-to-End Dimension (μm) | | | | e End-to-End Dimension (μm) | | | | e End-to-End Dimension (μm) | | | |
| Sample No. | First External Electrode Side | Second External Electrode Side | Presence of Crack Yes | Presence of Crack No | First External Electrode Side | Second External Electrode Side | Presence of Crack Yes | Presence of Crack No | First External Electrode Side | Second External Electrode Side | Presence of Crack Yes | Presence of Crack No |
|---|---|---|---|---|---|---|---|---|---|---|---|---|
| 1 | 0 | 14 | | ○ | 22 | 34 | | ○ | −35 | 4 | ○ | |
| 2 | 0 | 3 | | ○ | 58 | −26 | ○ | | 62 | 5 | | ○ |
| 3 | 3 | −11 | ○ | | −38 | 94 | ○ | | 13 | 8 | | ○ |
| 4 | −3 | 16 | | ○ | 44 | 24 | | ○ | 24 | −43 | ○ | |
| 5 | 0 | 1 | | ○ | 83 | 58 | | ○ | 95 | −9 | ○ | |
| 6 | 0 | 2 | ○ | | −12 | 33 | ○ | | 28 | 4 | | ○ |
| 7 | 11 | 2 | ○ | | 61 | 71 | | ○ | 110 | 98 | | ○ |
| 8 | −4 | 4 | | ○ | 56 | −26 | ○ | | 83 | 54 | | ○ |
| 9 | 0 | 7 | | ○ | 81 | 23 | | ○ | −44 | 113 | ○ | |
| 10 | 0 | −10 | ○ | | −51 | −5 | ○ | | 49 | 9 | | ○ |
| 11 | 2 | 0 | | ○ | 104 | 18 | | ○ | 45 | 11 | | ○ |
| 12 | 4 | 1 | | ○ | 65 | 38 | | ○ | 8 | −31 | ○ | |
| 13 | 0 | 16 | ○ | | 45 | 29 | | ○ | −24 | 57 | ○ | |
| 14 | 0 | 18 | | ○ | −10 | 58 | ○ | | 80 | 91 | | ○ |
| 15 | 7 | −3 | ○ | | 34 | −8 | ○ | | 88 | −38 | ○ | |
| 16 | 15 | 3 | | ○ | −29 | −7 | ○ | | −29 | −23 | ○ | |

As shown in Table 1, in the case of the 0603 size, with attention being paid to a smaller value of values of the e end-to-end dimension of the samples, samples Nos. 1, 2, 5, 9, 11, 12, 14, and 16 except for samples Nos. 4 and 8 each had a positive value of the e end-to-end dimension and thus no crack was generated therein.

Similarly also in the case of the 1608 size, with attention being paid to a smaller value of values of the e end-to-end dimension of the samples, samples Nos. 1, 4, 5, 7, 9, and 11 to 13 each had a positive value of the e end-to-end dimension and hence no crack was generated therein.

Furthermore, similarly in the case of the 3216 size, with attention being paid to a smaller value of values of the e end-to-end dimension of the samples, samples Nos. 2, 3, 6 to 8, 10, 11, and 14 each had a positive value of the e end-to-end dimension and thus no crack was generated therein.

It was confirmed that generation of a crack in the multilayer ceramic capacitor could be reduced or prevented by covering the end of the underlying electrode layer with the main-surface-side resin layer on any one of the first external electrode and the second external electrode.

As shown in FIG. 48, it was confirmed that, when the value of the e end-to-end dimension of any one of the first external electrode and the second external electrode was equal to or larger than about 10 μm, the multilayer ceramic capacitor free from a crack could be more reliably obtained regardless of the size of the multilayer ceramic capacitor.

As shown in Table 1, in the case of the 0603 size, with attention being paid to the smaller value of values of the e end-to-end dimension of the samples, samples Nos. 3, 10, and 15 except for samples Nos. 6, 7, and 13 each had a negative e end-to-end dimension value and thus a crack was generated therein.

Similarly also in the case of the 1608 size, with attention being paid to the smaller value of values of the e end-to-end dimension of the samples, samples Nos. 2, 3, 6, 8, 10, and 14 to 16 each had a negative e end-to-end dimension value and thus a crack was generated therein.

Furthermore, similarly also in the case of the 3216 size, with attention being paid to the smaller value of values of the e end-to-end dimension of the samples, samples Nos. 1, 4, 5, 9, 12, 13, 15, and 16 each had a negative e end-to-end dimension value and thus a crack was generated therein.

It was confirmed that a crack was likely in the multilayer ceramic capacitor when the main-surface-side resin layer in one of the first external electrode and the second external electrode does not cover the end of the underlying electrode layer.

(2) ESR Measurement Test

In the ESR measurement test, the structure of the multilayer ceramic capacitor according to an Example adopted as the sample was the same or substantially the same as the structure used in the bending test. The 1005 size was used as the size of the multilayer ceramic capacitor in the present ESR measurement test.

As a comparative multilayer ceramic capacitor, a sample according to a Conventional Example having such a structure that the resin layer covered opposing end surfaces, a portion of opposing main surfaces, and a portion of opposing side surfaces of the multilayer body in the structure of the external electrode and a sample according to Reference Example 1 including only the underlying electrode layer and the plated layer and not including the resin layer were prepared. The comparative multilayer ceramic capacitor was the same or substantially the same in specifications to the multilayer ceramic capacitor according to Example, except for the structure described above.

In the ESR measurement test, the ESR was calculated by measuring an impedance with an impedance analyzer. A frequency was set to about 1 MHz, and the number of samples for each of Example, Conventional Example, and Reference Example 1 was set to ten.

Figure 49:
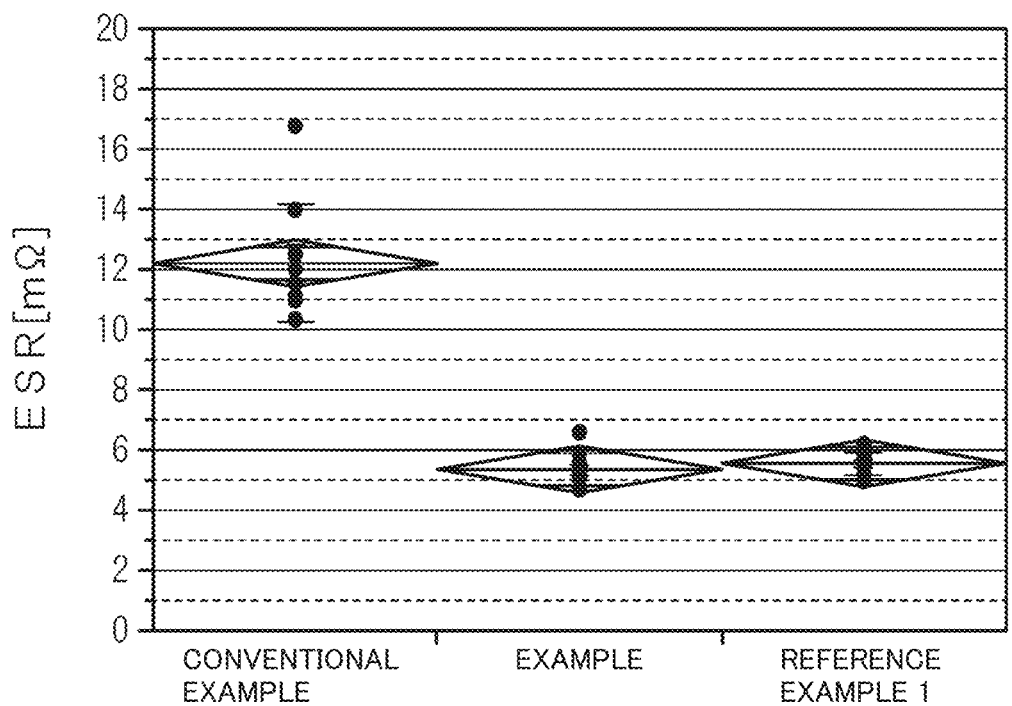
FIG. 49 is a diagram showing a result of measurement of an ESR of each sample in a Conventional Example, an Example, and a Reference Example in an ESR measurement test.

Table 2 shows a result of measurement of the ESR for each sample of the multilayer ceramic capacitor. FIG. 49 is a diagram showing a result of measurement of the ESR of each sample in Conventional Example, Example, and Reference Example 1 in the ESR measurement test.

TABLE 2

| Sample No. | ESR (mΩ) | | |
| --- | --- | --- | --- |
| | Conventional Example | Example | Reference Example 1 |
| 1 | 10.3 | 5.3 | 5.2 |
| 2 | 14.0 | 5.9 | 5.5 |
| 3 | 12.5 | 5.6 | 5.6 |
| 4 | 11.5 | 5.4 | 6.2 |
| 5 | 11.0 | 5.1 | 6.0 |
| 6 | 11.1 | 4.7 | 5.5 |
| 7 | 12.0 | 4.7 | 5.7 |
| 8 | 12.5 | 5.1 | 5.8 |
| 9 | 16.8 | 6.6 | 5.0 |

TABLE 2-continued

| Sample No. | ESR (mΩ) | | |
| --- | --- | --- | --- |
| | Conventional Example | Example | Reference Example 1 |
| 10 | 10.3 | 5.3 | 5.2 |
| Average Value | 12.2 | 5.4 | 5.6 |
| Maximum Value | 16.8 | 6.6 | 6.2 |
| Minimum Value | 10.3 | 4.7 | 5.0 |
| Standard Deviation | 2.0 | 0.6 | 0.4 |

As shown in Table 2 and FIG. 49, the ESR of the sample of the multilayer ceramic capacitor according to Example had an average value of about 5.4 mΩ and a standard deviation of about 0.6. The ESR of the sample of the multilayer ceramic capacitor according to Conventional Example had an average value of about 12.2 mΩ, and a standard deviation of about 2.0. Therefore, it was confirmed that the sample of the multilayer ceramic capacitor having the structure according to preferred embodiments of the present invention had less variation of the value of the ESR and lower ESR than the sample of the multilayer ceramic capacitor according to Conventional Example.

As shown in Table 2 and FIG. 49, the ESR of the sample of the multilayer ceramic capacitor according to Reference Example 1 had an average value of about 5.6 mΩ, and a standard deviation of about 0.4. Therefore, it was confirmed that the sample of the multilayer ceramic capacitor according to Example having the structure according to preferred embodiments of the present invention was comparable in ESR to the sample of the multilayer ceramic capacitor according to Reference Example 1.

(3) Check for Occurrence of Solder Burst

In checking for occurrence of solder burst, the multilayer ceramic capacitor according to Example used as the sample was similar in structure to multilayer ceramic capacitor 110 according to Preferred Embodiment 2 and the same or substantially the same in specifications to the multilayer ceramic capacitor adopted in the bending test, except that the main-surface-side resin layer was provided only over the entire end of the underlying electrode layer located on the first main surface. The 1005 size was used as the size of the multilayer ceramic capacitor used to check for occurrence of solder burst.

As a comparative multilayer ceramic capacitor, a sample according to Conventional Example having such a structure that the resin layer covered opposing end surfaces, a portion of opposing main surfaces, and a portion of opposing side surfaces of the multilayer body in the structure of the external electrode and a sample according to Reference Example 2 having such a structure that the resin layer was provided over the entire end of the underlying electrode layer located on the first main surface, the second main surface, the first side surface, and the second side surface and no resin layer was provided on the end surface were prepared. The comparative multilayer ceramic capacitor was the same or substantially the same in specifications to the multilayer ceramic capacitor according to Example, except for the structure described above.

Occurrence of solder burst was checked by mounting an evaluation sample on a substrate in a reflow furnace at an actually measured peak temperature of about 280±10° C., then observing an appearance of the multilayer ceramic capacitor, and counting the number of multilayer ceramic capacitors in which solder burst out of the external electrode.

The number of samples according to Conventional Example was set to one hundred and the number of samples according to each of Example and Reference Example 2 was set to one thousand.

Table 3 shows a result of checking for occurrence of solder burst in each sample of the multilayer ceramic capacitor above.

TABLE 3

| | The Number of Samples | Ratio of Occurrence of Solder Burst |
|---|---|---|
| Conventional Example | 100 | 33.0% |
| Reference Example 2 | 1000 | 0.3% |
| Example | 1000 | 0.2% |

As shown in Table 3, in the multilayer ceramic capacitor of the sample according to Conventional Example, solder burst occurred in thirty three multilayer ceramic capacitors of one hundred multilayer ceramic capacitors and a ratio of occurrence of solder burst was 33.0%. In the multilayer ceramic capacitor of the sample according to Reference Example 2, solder burst occurred in three multilayer ceramic capacitors of one thousand multilayer ceramic capacitors and a ratio of occurrence of solder burst was 0.3%. In the multilayer ceramic capacitor of the sample according to Example having the structure according to the present invention, solder burst occurred in two multilayer ceramic capacitors of one thousand multilayer ceramic capacitors and a ratio of occurrence of solder burst was 0.2%.

From the foregoing, it was concluded that solder burst was reduced or prevented in the multilayer ceramic capacitor of the sample according to Example, because no resin layer was provided over the end of the underlying electrode layer on the opposing end surfaces and the side surfaces of the multilayer body. Therefore, it was confirmed that the multilayer ceramic capacitor with the structure according to preferred embodiments of the present invention could reduce or prevent occurrence of solder burst more significantly than the multilayer ceramic capacitor with the conventional structure. It was confirmed that occurrence of solder burst could be reduced or prevented also as compared with Reference Example 2.

Preferred embodiments of the present invention is not limited to the preferred embodiments described above and may be modified variously within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
a multilayer body including a plurality of layered dielectric layers and a plurality of layered internal electrode layers, the multilayer body including a first main surface and a second main surface opposed to each other in a height direction, a first side surface and a second side surface opposed to each other in a width direction orthogonal or substantially orthogonal to the height direction, and a first end surface and a second end surface opposed to each other in a length direction orthogonal or substantially orthogonal to the height direction and the width direction; and
a pair of external electrodes connected to the plurality of internal electrode layers and provided on the first and second end surfaces, a portion of the first and second main surfaces, and a portion of the first and second side surfaces; wherein
each of the pair of external electrodes includes:
an underlying electrode layer;
a resin layer; and
a plated layer covering the underlying electrode layer and the resin layer;
a portion of an end of the underlying electrode layer includes a region covered with the resin layer and a region not covered with the resin layer;
the resin layer does not cover the underlying electrode layer on the first end surface and the second end surface.

2. The multilayer ceramic capacitor according to claim 1, wherein the resin layer covers at least a portion of an end of the underlying electrode layer located on the first main surface.

3. The multilayer ceramic capacitor according to claim 1, wherein the resin layer entirely or substantially entirely covers an end of the underlying electrode layer located on at least one of the first main surface and the second main surface.

4. The multilayer ceramic capacitor according to claim 1, further comprising a region not covered with the resin layer in a central portion in the height direction, at an end of the underlying electrode layer located on the first side surface and the second side surface.

5. The multilayer ceramic capacitor according to claim 4, wherein the resin layer covers a portion of the end of the underlying electrode layer located on the first side surface and the second side surface and is continuous from a resin layer that covers an end of the underlying electrode layer located on the main surface.

6. The multilayer ceramic capacitor according to claim 2, wherein the resin layer entirely or substantially entirely covers an end of the underlying electrode layer located on the first main surface and the second main surface.

7. The multilayer ceramic capacitor according to claim 2, wherein the resin layer is not provided on at least one of the first main surface and the second main surface and is not provided on either of the first side surface and the second side surface.

8. The multilayer ceramic capacitor according to claim 2, wherein a minimum value of a length in a length direction of a region where the resin layer covers the underlying electrode layer on the first main surface is equal to or larger than about 10 μm.

9. The multilayer ceramic capacitor according to claim 2, wherein a minimum value of a length in a length direction of a region where the resin layer covers a surface of the multilayer body on the first main surface is equal to or larger than about 10 μm.

10. The multilayer ceramic capacitor according to claim 1, wherein the resin layer includes a thermosetting resin and a metal component.

11. The multilayer ceramic capacitor according to claim 1, wherein the resin layer does not include a metal component.

12. A mount structure of a multilayer ceramic capacitor comprising:
the multilayer ceramic capacitor according to claim 2; and
a substrate on which a surface the multilayer ceramic capacitor is mounted; wherein the first main surface of the multilayer ceramic capacitor where the resin layer is located is opposed to the substrate.

13. A series of electronic components comprising:
the multilayer ceramic capacitor according to claim 2; and
a carrier tape including a plurality of cavities in which the multilayer ceramic capacitor is accommodated; wherein
the first main surface of the multilayer ceramic capacitor where the resin layer is located is disposed to face a bottom surface of the plurality of cavities.

14. The mount structure of a multilayer ceramic capacitor according to claim 12, further comprising a region not covered with the resin layer in a central portion in the height direction, at an end of the underlying electrode layer located on the first side surface and the second side surface.

15. The mount structure of a multilayer ceramic capacitor according to claim 14, wherein the resin layer covers a portion of the end of the underlying electrode layer located on the first side surface and the second side surface and is continuous from a resin layer that covers an end of the underlying electrode layer located on the main surface.

16. The mount structure of a multilayer ceramic capacitor according to claim 12, wherein the resin layer entirely or substantially entirely covers an end of the underlying electrode layer located on the first main surface and the second main surface.

17. The mount structure of a multilayer ceramic capacitor according to claim 12, wherein the resin layer is not provided on at least one of the first main surface and the second main surface and is not provided on either of the first side surface and the second side surface.

18. The mount structure of a multilayer ceramic capacitor according to claim 12, wherein a minimum value of a length in a length direction of a region where the resin layer covers the underlying electrode layer on the first main surface is equal to or larger than about 10 µm.

19. The mount structure of a multilayer ceramic capacitor according to claim 12, wherein a minimum value of a length in a length direction of a region where the resin layer covers a surface of the multilayer body on the first main surface is equal to or larger than about 10 µm.

20. The mount structure of a multilayer ceramic capacitor according to claim 12, wherein the resin layer includes a thermosetting resin and a metal component.

* * * * *